(12) United States Patent
Oba et al.

(10) Patent No.: US 6,422,088 B1
(45) Date of Patent: Jul. 23, 2002

(54) SENSOR FAILURE OR ABNORMALITY DETECTING SYSTEM INCORPORATED IN A PHYSICAL OR DYNAMIC QUANTITY DETECTING APPARATUS

(75) Inventors: Nobukazu Oba, Chiryu; Yoshifumi Murakami, Toukai; Yukihiko Tanizawa, Kariya; Hiroaki Tanaka, Kariya; Seiichiro Ishio, Kariya; Inao Toyoda; Yasutoshi Suzuki, both of Okazaki, all of (JP)

(73) Assignee: Denso Corporation, Kariya (JP)

( * ) Notice: Subject to any disclaimer, the term of this patent is extended or adjusted under 35 U.S.C. 154(b) by 126 days.

(21) Appl. No.: 09/666,085

(22) Filed: Sep. 21, 2000

(30) Foreign Application Priority Data

| Sep. 24, 1999 | (JP) | 11-270444 |
| Oct. 13, 1999 | (JP) | 11-291241 |
| Dec. 24, 1999 | (JP) | 11-366458 |
| Jan. 21, 2000 | (JP) | 2000-017818 |
| Jan. 21, 2000 | (JP) | 2000-017819 |
| Apr. 27, 2000 | (JP) | 2000-128255 |
| Jul. 28, 2000 | (JP) | 2000-228998 |
| Jul. 28, 2000 | (JP) | 2000-229000 |
| Jul. 28, 2000 | (JP) | 2000-229007 |
| Jul. 28, 2000 | (JP) | 2000-229236 |
| Jul. 31, 2000 | (JP) | 2000-231649 |

(51) Int. Cl.$^7$ .............. G01L 9/00; G01L 9/16
(52) U.S. Cl. ........................................ 73/754
(58) Field of Search .............. 73/720, 721, 726, 73/727, 754, 756; 257/414, 415, 416–420

(56) References Cited

U.S. PATENT DOCUMENTS

| 3,737,684 A | 6/1973 | Kuno et al. |
| 4,053,874 A | 10/1977 | Glaser |
| 4,446,527 A | 5/1984 | Runyan |
| 4,726,233 A | 2/1988 | Eckard et al. |
| 4,735,082 A | 4/1988 | Kolloff |
| 5,419,182 A | 5/1995 | Koshimizu |
| 5,948,992 A | 9/1999 | Yamamoto |
| 6,040,779 A | 3/2000 | Pfaff et al. |

FOREIGN PATENT DOCUMENTS

| DE | 3207833 | 9/1983 |
| DE | 3425147 | 2/1986 |
| DE | 3508610 | 9/1986 |
| DE | 3817336 | 12/1988 |
| DE | 19728381 | 1/1999 |
| DE | 19806753 | 9/1999 |
| EP | 0 592 205 | 4/1994 |
| JP | 61-155931 | 7/1986 |
| JP | 3-42539 | 2/1991 |
| JP | 6-102121 | 4/1994 |
| JP | 6-64085 | 8/1994 |
| JP | 8-247881 | 9/1996 |
| JP | 10-506718 | 6/1998 |
| WO | WO96/22515 | 7/1996 |
| WO | WO 97/05464 | 2/1997 |

*Primary Examiner*—William Oen
(74) *Attorney, Agent, or Firm*—Law Offices of David G. Posz

(57) ABSTRACT

A reference voltage generating circuit is constituted by resistors RE and RF each having a resistance not influenced by an application of pressure. The reference voltage generating circuit is connected between one and the other ends of a bridge circuit. A failure judgement of the bridge circuit is performed based on a comparison of a voltage difference $V_{BC}$ between two midpoints B and C of the bridge circuit and voltage differences $V_{CE}$ and $V_{BE}$ between a reference voltage level of the reference voltage generating circuit and the voltage levels of two midpoints B and C.

64 Claims, 51 Drawing Sheets

A—A

E−E

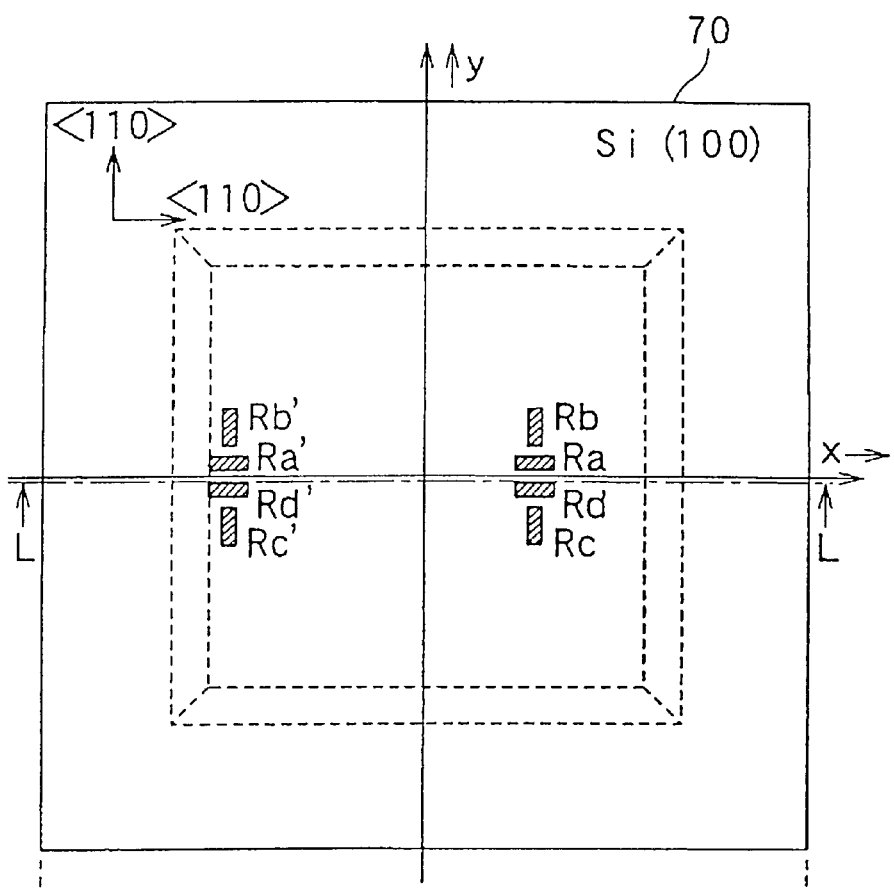
FIG. 25A
FIG. 25B
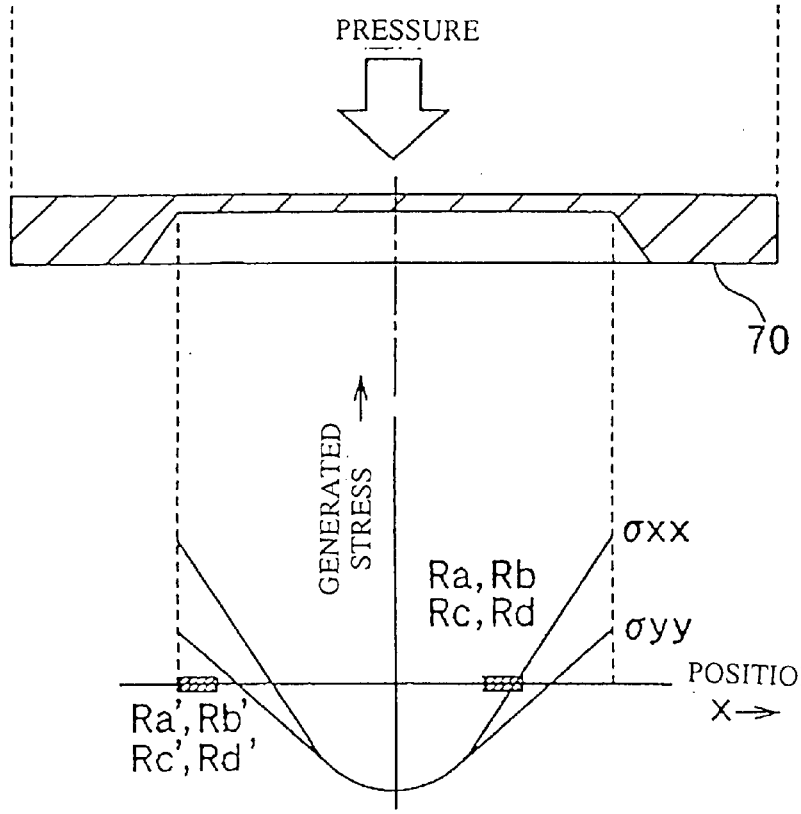
FIG. 25C

Vo=Vi−Vbe

Vo=Vi−(Vbe1+Vbe2)

Vo=Vi+Vbe

Vo=Vi+(Vbe1+Vbe2)

M—M

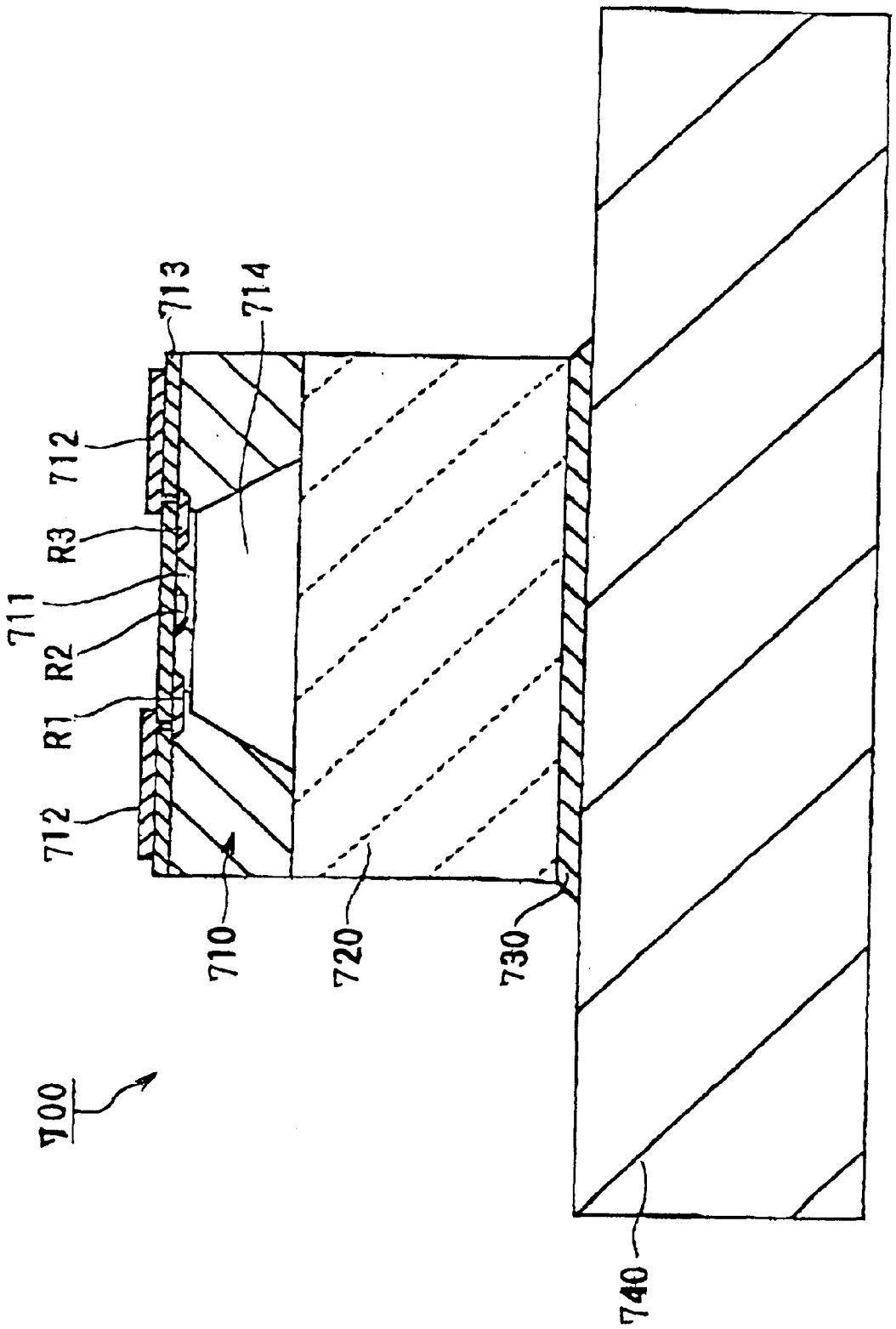

SENSOR FAILURE OR ABNORMALITY DETECTING SYSTEM INCORPORATED IN A PHYSICAL OR DYNAMIC QUANTITY DETECTING APPARATUS

BACKGROUND OF THE INVENTION

The present invention relates to a physical or dynamic quantity detecting apparatus and a sensor failure or abnormality detecting system incorporated in this apparatus.

A conventional pressure sensor comprises a semiconductor substrate with a thin diaphragm portion. Two pressure detecting elements (i. e., gauge resistors) are formed in a central region of this diaphragm portion, and another two pressure detecting elements are formed in a peripheral portion of this diaphragm portion. These four pressure detecting elements are arranged to form a Wheatstone's bridge circuit. When a pressure is applied on the diaphragm portion, the resistance of each pressure detecting element varies due to a piezoresistance effect. A significant difference (i.e., an output voltage) appears between a midpoint of the pressure detecting elements in the central region and a midpoint of the pressure detecting elements in the peripheral region. The pressure sensor amplifies and adjusts this output voltage appropriately to produce an electric signal representing the pressure applied on the diaphragm portion.

As described above, the pressure sensor amplifies and adjusts a voltage difference produced from the bridge circuit. However, the bridge circuit produces an erroneous voltage difference when spoiled or wounded. In such a case, the pressure sensor produces an erroneous electric signal.

The PCT application WO97/05464 discloses a pressure sensor having a failure detecting capability. According to this prior art, the pressure sensor detects an abnormal distribution of the stress in the diaphragm portion. To this end, the diaphragm portion is separated into two regions at the center. A bridge circuit is formed in each region. A sensor failure is detectable based on a deviation in the output voltage of respective bridge circuits. However, this pressure sensor is not desirable in that the area of pressure sensing portion is doubled due to separation of the diaphragm portion along the center line. Thus, downsizing of the pressure sensor is difficult.

Another conventional pressure sensor includes a sensor chip adhered on a pedestal by an anode bonding so as to form a reference pressure chamber. The pressure detection is performed based on a pressure difference between an external pressure and the reference pressure. In general, adhering of the sensor chip onto the pedestal is performed in a vacuum to avoid oxidation of aluminum wiring formed on the sensor chip. Thus, the reference pressure chamber is maintained in a vacuum condition (i.e., 0 atm absolute).

When this pressure sensor is subjected to an extremely high pressure (for example, in the detection of a hydraulic braking pressure), it is necessary to match the voltage range of a sensor output with the measuring pressure varying in a wide zone. Thus, the sensitivity of the pressure sensor must be suppressed to a low level.

This makes it difficult to detect a sensor failure by solely monitoring the sensor output.

Furthermore, when the sensor chip peeled off the pedestal, the reference pressure chamber communicates with an external atmosphere. Thus, the reference pressure becomes equal to the external pressure. However, when the same pressure is detected as two series of signals like the above-described failure detecting method, a similar situation possibly appear when these signals are compared mutually. Hence, it is impossible to accurately detect the sensor failure.

SUMMARY OF THE MVENTION

In view of the above-described problems, the present invention has an object to provide a pressure sensor which is surely capable of detecting a sensor failure when the resistance value in a bridge circuit has varied due to trouble or damage.

Furthermore, the present invention has another object to provide a pressure sensor which is preferable in downsizing of the pressure sensor.

Moreover, the present invention has another object to provide a pressure sensor which is capable of detecting a sensor failure caused by a defective airtightness of the reference pressure chamber formed by adhering a sensor chip on a pedestal.

To accomplish the above and other related objects, the present invention provides a first pressure sensor comprising a semiconductor substrate having a diaphragm portion, a pressure detecting bridge circuit comprising gauge resistors having resistance values varying in response to a pressure applied on the diaphragm portion of the semiconductor substrate, and a reference voltage generating circuit connected between one end and the other end of the pressure detecting bridge circuit for generating a reference voltage, the reference voltage generating circuit comprising non-sensitive resistors having resistance values not varying in response to the pressure applied on the diaphragm portion. A failure judgement of the pressure detecting bridge circuit is performed based on a voltage difference between two midpoints of the pressure detecting bridge circuit as well as a voltage difference between a voltage level of either of two midpoints of the pressure detecting bridge circuit and the reference voltage level of the reference voltage generating circuit.

With this arrangement, it becomes possible to surely detect a sensor failure when the resistance value of the bridge circuit is changed due to the failure.

Furthermore, it is preferable that the gauge resistors constituting the pressure detecting bridge circuit are constituted by separate gauge resistors, and a failure judgement of the pressure detecting bridge circuit is performed based on a voltage difference between two midpoints of the pressure detecting bridge circuit as well as a voltage difference between a pair of intermediate terminals selected from intermediate terminals of the separate gauge resisters, the selected pair of intermediate terminals having the same voltage level in a condition where no pressure is applied on the diaphragm portion.

With this arrangement, it becomes possible to surely detect a sensor failure when the resistance value of the bridge circuit is changed due to the failure.

Furthermore, it is preferable that a failure judgement of the pressure detecting bridge circuit is performed based on voltage differences between one and the other terminals of the bridge circuit and first and second intermediate terminals of the bridge circuit.

With this arrangement, it becomes possible to surely detect a sensor failure when the resistance value of the bridge circuit is changed due to the failure.

Furthermore, it is desirable that an amplification circuit is provided to amplify each voltage difference, and the failure judgement of the pressure detecting bridge circuit is performed based on an output signal of the amplification circuit.

Furthermore, the present invention provides a second pressure sensor comprising a semiconductor substrate having a diaphragm portion, a pressure detecting bridge circuit for outputting an electric signal representing a pressure applied on the diaphragm portion of the semiconductor substrate, the pressure detecting bridge circuit comprising two gauge resistors provided in a first direction and two other gauge resistors provided in a second direction normal to the first direction. A failure detecting circuit, provided at a predetermined region of the diaphragm portion where the pressure detecting bridge circuit is not formed, outputs an electric signal in response to the pressure applied on the diaphragm portion. The failure detecting circuit has a sensitivity different from that of the pressure detecting bridge circuit. A failure judging means is provided for performing a failure judgement of the pressure detecting bridge circuit based on the output signals of the pressure detecting bridge circuit and the failure detecting circuit.

In this manner, by using the output signals of the pressure detecting bridge circuit and the failure detecting circuit which have mutually different sensitivities, it becomes possible to surely detect a sensor failure when an output of the pressure detecting bridge circuit is changed due to the failure.

According to a conventional pressure sensor, the gauge resistors constituting the pressure detecting bridge circuit are disposed on the diaphragm portion along two perpendicular directions with two resistors on each direction. The remaining portion is a unused region. However, according to the above second pressure sensor of the present invention, the failure detecting circuit is provided in this unused region of the diaphragm portion. Thus, it becomes possible to provide a pressure sensor having the capability of detecting a sensor failure with a sensing portion whose size is substantially identical with that of the conventional pressure sensor. Thus, the pressure sensor can be downsized.

Furthermore, it is preferable that a memory means is provided for storing a relationship between output characteristics of the pressure detecting bridge circuit and output characteristics of the failure detecting circuit, wherein the failure judging means performs the failure judgement of the pressure detecting bridge circuit by checking at an arbitrary pressure point whether or not the output characteristics of the pressure detecting bridge circuit and the output characteristics of the failure detecting circuit satisfy the relationship stored in the memory means.

For example, the failure detecting circuit comprises at least one gauge resistor. And, the gauge resistor constitutes a failure detecting bridge circuit.

It is further preferable that the pressure detecting bridge circuit and the failure detecting circuit are constituted by diffused resistors. The pressure detecting bridge circuit can be constituted by diffused resistors and the failure detecting circuit are constituted by thin-film resistors. Furthermore, the failure detecting circuit can be constituted by a capacitive sensor.

Furthermore, the failure judging means can be provided on the semiconductor substrate on which the pressure detecting bridge circuit and the failure detecting circuit are provided.

Furthermore, the present invention provides a third pressure sensor comprising a sensor chip constituted by a semiconductor substrate with a diaphragm portion, a pedestal on which the sensor chip is adhered, and a reference pressure chamber formed between the sensor chip and the pedestal. A pressure detecting bridge circuit consisting of gauge resistors is formed on the diaphragm portion to output an electric signal representing a pressure applied on the diaphragm portion. A failure detecting bridge circuit consisting of gauge resistors is formed on a specific region of the diaphragm portion different from the pressure detecting bridge circuit. The failure detecting bridge circuit outputs an electric signal responsive to the pressure applied on the diaphragm portion. And, a sensitivity of the failure detecting bridge circuit is higher than a sensitivity of the pressure detecting bridge circuit.

In this manner, by providing a high-sensitive failure detecting bridge circuit independent of the low-sensitive pressure detecting bridge, it becomes possible to detect a sensor failure caused by a defective airtightness of the reference pressure chamber formed by adhering the sensor chip on the pedestal.

According to preferred embodiments of the present invention, the gauge resistors constituting the failure detecting bridge circuit are disposed in the vicinity of the center of the diaphragm portion and in the vicinity of a peripheral end of the diaphragm portion. The gauge resistors constituting the failure detecting bridge circuit can be disposed at a specific position of the diaphragm portion where a tensile stress is maximized and a specific position of the diaphragm portion where a compressive stress is maximized.

With this arrangement, it becomes possible to increase the sensitivity of the failure detecting bridge circuit.

According to the preferred embodiments of the present invention, the gauge resistors constituting the pressure detecting bridge circuit are disposed in the vicinity of a midpoint between the center and the peripheral end of the diaphragm portion. The gauge resistors constituting the pressure detecting bridge circuit can be disposed at a specific position of the diaphragm portion where a tensile stress is minimized and a specific position of the diaphragm portion where a compressive stress is minimized.

With this arrangement, it becomes possible to decrease the sensitivity of the pressure detecting bridge circuit.

According to the preferred embodiments of the present invention, the semiconductor substrate has a (100) surface, and the gauge resistors constituting the failure detecting bridge circuit comprise a first gauge resistor extending in a first direction and a second gauge resistor extending in a second direction normal to the first direction.

In this manner, by differentiating the longitudinal direction of the first gauge resistor from the longitudinal direction of the second gauge resistor, it becomes possible to differentiate the resistance changes of respective gauge resistors in response to a surface stress. Accordingly, even when the first gauge resistor is located adjacent to the second gauge resistor, it becomes possible to obtain electric signals responsive to the applied pressure from the first and second gauge resistors.

According to the preferred embodiments of the present invention, the failure detecting bridge circuit is constituted by a full-bridge circuit consisting of four gauge resistors. Constituting the failure detecting bridge circuit by a full-bridge circuit is effective to increase the sensitivity compared with the half-bridge circuit.

Furthermore, the present invention provides a fourth pressure sensor comprising a diaphragm portion, a reference pressure chamber isolated by the diaphragm portion, an output circuit for outputting an electric signal representing a pressure applied on the diaphragm portion by using pressure detecting elements formed on the diaphragm portion or in a peripheral region of the diaphragm portion, and judging means for detecting an abnormal situation that a reference pressure in the reference pressure chamber becomes equal to an outside pressure of the diaphragm portion.

In this manner, by detecting the abnormal situation that the pressures of both sides of the diaphragm portion becomes identical, it becomes possible to detect a sensor failure caused by a defective airtightness of the reference pressure chamber formed by adhering the sensor chip on the pedestal.

Furthermore, it is preferable that a pressure detecting circuit is provided for outputting an electric signal representing a pressure applied on the diaphragm portion by using pressure detecting elements formed on the diaphragm portion or in a peripheral region of the diaphragm portion, and a failure detecting circuit is provided for outputting an electric signal representing the pressure applied on the diaphragm portion, the failure detecting circuit having a higher sensitivity than that of the pressure detecting circuit.

In this manner, by providing a combination of a high-sensitive failure detecting circuit and a low-sensitive pressure detecting circuit, it becomes possible to detect a sensor failure caused by a defective airtightness of the reference pressure chamber formed by adhering the sensor chip on the pedestal.

In this case, it is preferable that the pressure detecting elements are gauge resistors, and the gauge resistors are disposed in such a manner that a resistance change of gauge resistors constituting the failure detecting circuit responsive to a change of the pressure applied on the diaphragm portion becomes larger than a resistance change of the pressure detecting circuit.

Furthermore, the present invention provides a failure detecting method for a pressure sensor comprising a diaphragm portion and a reference pressure chamber isolated by the diaphragm portion, the failure detecting method comprising a step of obtaining an electric output signal representing a pressure applied on the diaphragm portion by using pressure detecting elements formed on the diaphragm portion or in a peripheral region of the diaphragm portion, and a step of presuming an abnormal situation when the electric output signal indicates that a reference pressure in the reference pressure chamber becomes equal to an outside pressure of the diaphragm portion.

In this manner, by presuming an abnormal situation when the electric output signal indicates that the pressures of both sides of the diaphragm portion become identical, it becomes possible to detect a sensor failure caused by a defective airtightness of the reference pressure chamber formed by adhering the sensor chip on the pedestal.

Furthermore, the present invention has an object to provide a sensor abnormality detecting circuit which is compact in size, quick in response, and excellent in accuracy, and preferably used for a sensor having a pair of output terminals generating output voltages varying in mutually opposed positive and negative directions in response to a sensed physical quantity by the same voltage amount with respect to a predetermined equilibrium voltage.

Furthermore, the present invention has an object to provide a physical quantity detecting apparatus using the above sensor abnormality detecting circuit.

Moreover, the present invention provides a first sensor abnormality detecting circuit for a sensor having a first output terminal generating a first output voltage and a second output terminal generating a second output voltage. The first output voltage and the second output voltage vary in mutually opposed positive and negative directions in response to a sensed physical quantity by the same voltage amount with respect to a predetermined equilibrium voltage. The sensor abnormality detecting circuit comprises a reference voltage generating circuit for generating a reference voltage substantially identical with the equilibrium voltage. An operational amplifier has one input terminal receiving the reference voltage generated from the reference voltage generating circuit. A first resistor has one end receiving the first output voltage of the sensor and the other end connected to the other input terminal of the operational amplifier. A second resistor has one end receiving the second output voltage of the sensor vand the other end connected to the other input terminal of the operational amplifier. The second resistor has the same resistance value as that of the first resistor. A third resistor is connected between an output terminal of the operational amplifier and the other input terminal of the operational amplifier. And, a judging circuit for generating an abnormal signal notifying an occurrence of sensor abnormality when an output voltage of the operational amplifier is outside a predetermined normal voltage range.

In the above first sensor abnormality detecting circuit, it is now assumed that V1 represents the first output voltage, V2 represents the second output voltage, and VE represents the reference voltage. The first resistor and the second resistor have a resistance R, and the third resistor has a resistance X·R. The output voltage V$_{OUT}$ of the operational amplifier is defmed by the following formula 2-1.

$$V_{OUT}=-X\{(V1-VE)+(V2-VE)\}+VE \quad (2\text{-}1)$$

More specifically, a first value is obtained by subtracting the reference voltage VE from one output voltage V1 of the sensor. A second value is obtained by subtracting the reference voltage VE from the other output voltage V2 of the sensor. The first value and the second value are added. The operational amplifier produces the output voltage V$_{OUT}$ which is proportional to the sum of the first value and the second value.

Among the output voltages V1 and V2 of the sensor, it is assumed that the first output voltage V1 changes in the positive direction in response to an increase of the sensed physical quantity while the second output voltage V2 changes in the negative direction in response to the increase of the sensed physical quantity. Furthermore, ΔV1' represents an absolute difference (|V1−VE|) between the first output voltage V1 and the reference voltage VE, and αV2' represents an absolute difference (|V2−VE|) between the second output voltage V2 and the reference voltage VE. The above formula 2-1 is rewritten by the following formula 2-2.

$$V_{OUT}=-X(\Delta V1'-\Delta V2')+VE \quad (2\text{-}2)$$

Thus, the operational amplifier produces the output voltage V$_{OUT}$ which is proportional to the difference between ΔV1' and ΔV2'.

As the reference voltage VE generated from the reference voltage generating circuit is substantially equal to the equilibrium voltage V0 of the sensor, the output voltage V$_{OUT}$ of the operational amplifier is substantially equal to VE when the operation of sensor is normal as understood from the formulas 2-1 and 2-2.

When the operation of sensor is abnormal, the balance of output voltages V1 and V2 is lost. More specifically, the absolute difference ΔV1 between the first output voltage V1 and the equilibrium voltage V0 is not equal to the absolute difference ΔV2 between the second output voltage V2 and the equilibrium voltage V0. The output voltage V$_{OuT}$ of the operational amplifier is deviated to either a positive direction or a negative direction with respect to the reference voltage VE.

Hence, in the sensor abnormality detecting circuit, the judging circuit makes a judgement as to whether the output voltage VOUT of the operational amplifier is outside the predetermined normal voltage range. When the output voltage VOuT is outside the predetermined normal voltage range, the judging circuit outputs an abnormal signal notifying an occurrence of abnormality in the sensor.

With this arrangement, the abnormality of sensor is accurately detected based on the output voltages and obtained at the same time. Furthermore, the abnormality of sensor is so quickly detectable that the delay time is substantially eliminated. It is not necessary to provide a high-performance information processing apparatus, such as MPU. Thus, it becomes possible to provide a small-scale circuit arrangement for detecting the abnormality of sensor.

In the above sensor abnormality detecting circuit, it is desirable that a first buffer is provided for receiving the first output voltage of the sensor and applying the received first output voltage to the one end of the first resistor, and a second buffer is provided for receiving the second output voltage of the sensor and applying the received second output voltage to the one end of the second resistor. Namely, the first buffer is provided between the first output terminal of the sensor and the first resistor. The second buffer is provided between the second output terminal of the sensor and the second resistor.

With this arrangement, it becomes possible to prevent the current from flowing from the output terminals of the sensor into the circuit consisting of the operational amplifier and the first to third resistors. The abnormality of sensor can be accurately detected.

Furthermore, in addition to the first buffer and the second buffer, it is preferable that a third buffer is provided for receiving the reference voltage generated from the reference voltage generating circuit and supplying the received reference voltage to the one input terminal of the operational amplifier.

The first buffer, the second buffer, and the third buffer may output a voltage identical with the input voltage. However, it is also desirable that the first buffer, the second buffer, and the third buffer are level shift circuits each shifting an input voltage by a specific voltage Vsf to generate an output voltage. In this case, the shift voltage is either a positive or a negative value. Respective buffers can be level shift circuits having the same circuit arrangement.

More specifically, when the first to third buffers are constituted by the level shift circuits, the one end of the first resistor receives avoltage (=V1+Vsf) obtained by shifting the first output voltage V1 by the voltage Vsf The one end of the second resistor receives a voltage (=V2+Vsf) obtained by shifting the second output voltage V2 by the voltage Vsf. One end input terminal of the operational amplifier receives a voltage (=VE+Vsf) obtained by shifting the reference voltage VE by the voltage Vsf Thus, all of three input voltages are equally shifted by the same voltage Vsf. Therefore, the operational amplifier produces the output voltage VOUT which is proportional to a sum of a first value obtained by subtracting the reference voltage VE from the one output voltage V1 of the sensor and a second value obtained by subtracting the reference voltage VE from the other output voltage V2 of the sensor.

In general, the level shift circuit has a simple arrangement compared with the buffer outputting a voltage identical with an input voltage. Therefore, the circuit scale of the sensor abnormality detecting circuit can be reduced.

Furthermore, the present invention provides a second sensor abnormality detecting circuit for a sensor having a first output terminal generating a first output voltage and a second output terminal generating a second output voltage, the first output voltage and the second output voltage varying in mutually opposed positive and negative directions in response to a sensed physical quantity by the same voltage amount with respect to a predetermined equilibrium voltage V0.

The second sensor abnormality detecting circuit comprises a reference voltage generating circuit for generating a reference voltage substantially identical with the equilibrium voltage. An operational amplifier has one input terminal receiving the reference voltage generated from the reference voltage generating circuit. A first differential amplifier has a non-inverting input terminal receiving the first output voltage of the sensor and an inverting input terminal receiving the reference voltage generated from the reference voltage generating circuit. A second differential amplifier has a non-inverting input terminal receiving the second output voltage of the sensor and an inverting input terminal receiving the reference voltage generated from the reference voltage generating circuit. A first resistor has one end receiving an output voltage of the first differential amplifier and the other end connected to the other input terminal of the operational amplifier. A second resistor has one end receiving an output voltage of the second differential amplifier and the other end connected to the other input terminal of the operational amplifier. The second resistor has the same resistance as that of the first resistor. A third resistor is connected between an output terminal of the operational amplifier and the other input terminal of the operational amplifier. And, a judging circuit generates an abnormal signal notifying an occurrence of sensor abnormality when an output voltage of the operational amplifier is outside a predetermined normal voltage range.

In other words, the second sensor abnormality detecting circuit provides the first and second differential amplifiers instead of using the first and second buffers.

It is now assumed, in the second sensor abnormality detecting circuit, that Y represents an amplification factor (i.e., amplification degree) of the first and second differential amplifiers. An output voltage V1S of the first differential amplifier can be defined by the following formula 2-3, while an output voltage V2S of the second differential amplifier can be defined by the following formula 2-4.

$$V1S = Y \cdot (V1 - VE) + VE \quad (2\text{-}3)$$

$$V2S = Y \cdot (V2 - VE) + VE \quad (2\text{-}4)$$

Thus, the formula 2-1 expressing the output voltage VOUT of the operational amplifier can be replaced by the following formula 2-5.

$$V_{\text{OUT}} - X \cdot Y \{ (V1 - VE) + (V2 - VE) \} + VE \quad (2\text{-}5)$$

As understood from the formula 2-5, according to the second sensor abnormality detecting circuit, when the balance of sensor output voltages V1 and V2 are lost, the output voltage VOUT of the operational amplifier largely deviates in either a positive or a negative direction from the reference voltage VE.

Accordingly, it becomes possible to accurately detect the sensor abnormality. Although the operational amplifier is generally not free from an offset voltage, the operational amplifier can operate at a region where the influence of the offset voltage is sufficiently small. The sensor abnormality detecting accuracy can be improved.

The first and second differential amplifiers can perform the roles similar to those of the above-described first and second buffers. Thus, it becomes possible to prevent the current from flowing excessively from the sensor output terminals into the circuit portion consisting of the operational amplifier and. the first to third resistors.

Furthermore, in the above first and second sensor abnormality detecting circuits, it is preferable that the judging circuit generates the abnormal signal when the output voltage VouT of the operational amplifier is higher than a first criterial voltage (VE+α) which is higher than the reference voltage VE generated from the reference voltage generating circuit by a predetermined voltage α, and the judging circuit generates the abnormal signal when the output voltage VOUT of the operational amplifier is lower than a second criterial voltage (VE−β) which is lower than the reference voltage VE generated from the reference voltage generating circuit by a predetermined voltage β.

More specifically, a criterial voltage generating circuit is provided for generating the first criterial voltage higher than the reference voltage VE by the predetermined voltage α and for generating the second criterial voltage lower than the reference voltage VE by the predetermined voltage β. The first criterial voltage and the second criterial voltage thus produced from the criterial voltage generating circuit are supplied to the judging circuit. The judging circuit is arranged to generate the abnormal signal when the output voltage VOUT of the operational amplifier is higher than a higher criterial voltage (i.e., the first criterial voltage) as well as when the output voltage VOUT of the operational amplifier is lower than a lower criterial voltage (i.e., the second criterial voltage). Although it is preferable to equalize the predetermined voltage α with the predetermined voltage β, it is alternatively possible to differentiate the values of α and β.

In the case of the sensor abnormality detecting circuit comprising the first to third buffers, the term of "+VE" in the above-described formulas 2-1 and 2-2 is replaced by "+(VE+Vsf)" and the output voltage VOUT of the operational amplifier is regarded as a voltage varying with reference to the reference level of "VE+Vsf".

Accordingly, it is effective to arrange the sensor abnormality detecting circuit to further comprise a fourth buffer for shifting the first criterial voltage generated from the criterial voltage generating circuit by the specific voltage Vsf identical with that of the first to third buffers and supplying a shifted first criterial voltage to the judging circuit, and a fifth buffer for shifting the second criterial voltage generated from the criterial voltage generating circuit by the specific voltage Vsf and supplying a shifted second criterial voltage to the judging circuit, in addition to the above-described criterial voltage generating circuit for generating the first criterial voltage and the second criterial voltage. The judging circuit is arranged to generate the abnormal signal when the output voltage VOUT of the operational amplifier is higher than the voltage (i.e., first criterial voltage +Vsf) supplied from the fourth buffer as well as when the output voltage VOUT of the operational amplifier is lower than the voltage (i.e., second criterial voltage +Vsf) supplied from the fifth buffer.

According to this arrangement, not only the output voltage VOUT of the operational amplifier but also the normal voltage range used for the abnormality judgement are shifted by the specific voltage Vsf Thus, the abnormality judgement can be performed without re-setting the first and second criterial voltages.

Furthermore, in the above first and second abnormality judging circuits, it is desirable that the sensor comprises four gauge resistors connected in a loop pattern so as to provide four connecting terminals of the gauge resistors, each of the gage resistors having a resistance varying in response to a deformation, a power voltage is applied to two opposed connecting terminals of the gauge resistors, and the rest of the connecting terminals of the gauge resistors serve as the first and second output terminals.

According to this arrangement, by using a compact circuit arrangement, it becomes possible to promptly and accurately detect the abnormality of the pressure sensor having four gauge resistors. Furthermore, according to this kind of pressure sensor, a difference between each of the output voltage V1 and V2 and the equilibrium voltage V0 is small. In this respect, using the above second sensor abnormality detecting circuit is effective.

When the sensor of the present invention is a pressure sensor, it is desirable that the reference voltage generating circuit comprises at least two resistors for dividing the power voltage to generate the reference voltage.

For example, the reference voltage generating circuit can be constituted by two resistors dividing the power voltage. In this case, the connecting point of two resistors is determined so as to generate a desired reference voltage.

The number of the resistors dividing the power voltage can be increased to three or more. In other words, the number of the voltage-dividing resistors can be arbitrary selected as far as the reference voltage is produced at a connecting point of the resistors.

According to this arrangement, even when the actual equilibrium voltage of the sensor is changed in response to a variation or fluctuation of the power voltage, the reference voltage can follow such a change. Thus, the abnormality detection of the pressure sensor can be accurately performed irrespective of the variation or fluctuation of the power voltage.

Furthermore, the present invention provides a physical quantity detecting apparatus associated with a sensor having a first output terminal generating a first output voltage and a second output terminal generating a second output voltage, the first output voltage and the second output voltage varying in mutually opposed positive and negative directions in response to a sensed physical quantity by the same voltage amount with respect to a predetermined equilibrium voltage. This physical quantity detecting apparatus has a physical quantity output terminal for producing a sensing signal representing the sensed physical quantity based on the first output voltage of the sensor and the second output voltage of the sensor.

Especially, the physical quantity detecting apparatus of the present invention comprises the above first or second abnormality detecting circuit for detecting a sensor abnormality. And, an abnormal signal notifying an occurrence of sensor abnormality is produced from the physical quantity output terminal instead of outputting the sensing signal when the sensor abnormality detecting circuit produces a signal indicating sensor abnormality.

According to this physical quantity detecting apparatus, when the operation of the sensor is normal, the physical quantity output terminal outputs the sensing signal representing the sensed physical quantity. Meanwhile, when the operation of the sensor is abnormal, the physical quantity output terminal outputs the abnormal signal notifying an occurrence of sensor abnormality. Accordingly, an electronic control apparatus or other apparatus which processes the sensing signal received from the physical quantity detecting apparatus can immediately know the occurrence of sensor abnormality upon receiving the abnormality signal produced from the physical quantity output terminal. There is no necessity of providing a special signal line separately.

Furthermore, the present invention has an object to provide a physical quantity detecting sensor capable of accurately detecting abnormality of the sensor.

To accomplish this and other related objects, the present invention provides a physical quantity detecting sensor comprising four gauge resistors each having a resistance varying in response to a sensed physical quantity, so that the four gauge resistors forming a bridge circuit. In this physical quantity detecting sensor, the gauge resistors constituting the bridge circuit are separate gauge resistors. A sensor output is produced based on a voltage difference between two midpoints of the bridge circuit. An inspection output is produced based on a voltage difference between a pair of intermediate terminals selected from intermediate terminals of the separate gauge resistors. The selected pair of intermediate terminals has the same voltage level in a condition where no physical quantity is applied on the sensor. And, adjusting means is connected to the selected pair of intermediate terminals for adjusting an error component of the inspection output.

In this manner, the physical quantity detecting sensor of the present invention includes the adjusting means for adjusting the error component of the inspection output, so that the adjusting means is connected to the selected pair of intermediate terminals having the same voltage level in a condition where no physical quantity is applied on the sensor. Thus, it becomes possible to adjust the sensitivity and an offset amount of the sensor output as well as a temperature offset amount, thereby reducing the error component even if the inspection output has such an error component. Hence, the abnormality detection can be accurately performed.

In this case, it is preferable that an amplification circuit is connected to the selected pair of intermediate terminals, and the adjusting means adjusts an output of the amplification circuit.

Furthermore, it is preferable that the adjusting means is a voltage-follower circuit, and an output voltage level of the amplification circuit is raised by an output of the voltage-follower circuit so as to adjust the error component of the inspection output.

For example, the voltage-follower circuit has a non-inverting input terminal receiving a reference voltage. The reference voltage is supplied from a power voltage based on a voltage division by first and second resistors. And, a resistance value of at least one of the first and second resistors is adjustable by trimming.

Furthermore, the present invention has an object to provide a pressure sensor having a practical arrangement for accurately detecting a sensor failure when an output of a bridge circuit is changed due to the failure.

To accomplish this and other related objects, the present invention provides a fifth pressure sensor comprising a semiconductor substrate having first and second diaphragm portions, a pressure detecting circuit provided on the first diaphragm portion for outputting an electric signal responsive to a pressure applied on the first diaphragm portion, a failure detecting circuit provided on the second diaphragm portion for outputting an electric signal responsive to the pressure applied on the second diaphragm portion, the failure detecting circuit having a sensitivity higher than that of the pressure detecting circuit, and failure judging means for performing a failure judgement of the pressure detecting circuit based on output signals of the pressure detecting circuit and the failure detecting circuit.

In this manner, by using the output signals of the pressure detecting circuit and the failure detecting circuit, it becomes possible to accurately detect the sensor failure when an output of the pressure detecting circuit is changed due to the failure. Furthermore, using the failure detecting circuit having the sensitivity higher than that of the pressure detecting circuit makes it possible to promptly detect the failure or deterioration (breakage etc) of the diaphragm portion prior to the pressure detecting circuit. The sensor failure detection becomes highly accurate. The reliability of the sensor is improved, and safety against the failure can be ensured.

Furthermore, it is preferable that an area of the second diaphragm portion is larger than an area of the first diaphragm portion. With this arrangement, the failure detecting circuit can have a sensitivity higher than that of the pressure detecting circuit. Furthermore, it is preferable that a thickness of the second diaphragm portion is smaller than a thickness of the first diaphragm portion. With this arrangement, the failure detecting circuit can have a sensitivity higher than that of the pressure detecting circuit.

Furthermore, it is preferable that the pressure detecting circuit and the failure detecting circuit are bridge circuits each consisting of a plurality of gauge resistors. Furthermore, the gauge resistors can be formed by difflused resistors or by thin-film resistors.

Furthermore, the failure detecting circuit can be provided on the semiconductor substrate having the diaphragm portion.

Furthermore, the present invention has an object to provide a dynamic quantity detecting sensor capable of detecting abnormality of the sensor and also capable of outputting a sensor signal responsive to a sensed dynamic quantity during an inspection of the sensor.

Furthermore, the present invention has an object to provide a dynamic quantity detecting sensor capable of detecting abnormality without using a redundant circuit arrangement.

To accomplish the above and other related objects, the present invention provides a dynamic quantity detecting sensor comprising a sensing portion having sensitivity varying in response to an applied voltage or an applied current, a signal processing circuit for processing an output of the sensing portion to generate an output signal representing the output of the sensing portion, a first sample hold circuit for holding an output signal of the signal processing circuit, an operational processing circuit for processing an output signal of the sample hold circuit responsive to a first impressed voltage or a first impressed current applied to the sensing portion as well as an output of the signal processing circuit responsive to a second impressed voltage or a second impressed current applied to the sensing portion, and a judging circuit for performing an abnormality detection based on the processing result of the operational processing circuit.

With this arrangement, the impressed voltage or the impressed current is differentiated for the dynamic quantity detection and for the diagnosis. The first sample hold circuit holds an output of the signal processing circuit during the dynamic quantity detection. An output of the signal processing circuit during the diagnosis is obtained. Then, abnormality detection is performed by checking whether or not the relationship between the output of the first sample hold circuit and the output of the signal processing circuit during the diagnosis satisfies a predetermined relationship. Accordingly, the abnormality of the dynamic quantity detecting sensor can be detected without using a redundant circuit arrangement.

The first sample hold circuit holds an output of the signal processing circuit. Thus, the first sample hold circuit can output a pressure signal representing an applied pressure even when the sensor is in a diagnosis mode.

More specifically, it is preferable that the operational processing circuit performs calculation based on the following formula 5-1.

$$V2 = (a \times V1 - (a-1) \times VO) \tag{5-1}$$

where V1 represents the output signal of the sample hold circuit responsive to the first impressed voltage or the first impressed current applied to the sensing portion, V2 represents the output signal of the signal processing circuit responsive to the second impressed voltage or the second impressed current applied to the sensing portion, "a" represents the ratio of the second impressed voltage or the second impressed current to the first impressed voltage or the first impressed current, and VO represents an offset voltage of the output of the sensing portion.

According to a preferred embodiment of the present invention, it is preferable that the signal processing circuit generates the output signal of a predetermined range during a dynamic quantity detection, and the judging circuit converts the output signal of the signal processing circuit into a specific output signal when an abnormality is detected based on the output signals of the operational processing circuit, the specific output signal having a signal level different from the predetermined range of the output signal of the signal processing circuit generated during the dynamic quantity detection.

In this manner, by outputting the specific output signal having a signal level different from the predetermined range of the output signal generated during the dynamic quantity detection, it becomes possible to detect the abnormality of the sensor output.

Furthermore, it is preferable that the offset voltage is set to be outside the predetermined range of the output signal generated from the signal processing circuit during the dynamic quantity detection. According to this arrangement, the output voltages V1 and V2 are mutually discriminative in this range. Thus, the abnormality detection of the sensor can be accurately performed based on the above-described formula.

Furthermore, it is preferable that the dynamic quantity detecting sensor further comprises a second sample hold circuit for holding an output of the judging circuit. Using the second sample hold circuit for holding the output of the judging circuit makes it possible to notify an occurrence of sensor abnormality throughout the holding term of the output of the judging circuit.

Furthermore, it is preferable that the dynamic quantity detecting sensor further comprises a timing circuit for generating a timing signal so as to perform a switching operation between the first impressed voltage or the first impressed current and the second impressed voltage or the second impressed current based on the timing signal, and the first sample hold circuit and the second sample hold circuit can operate based on the timing signal.

More specifically, it is preferable that the timing signal generated from the timing circuit causes the first sample hold circuit to hold the output signal of the signal processing circuit, and then causes the switching operation between the first impressed voltage or the first impressed current and the second impressed voltage or the second impressed current, and finally causes the second sample hold circuit to hold the output signal of the judging circuit.

Furthermore, the present invention has an object to provide an effective layout of piezoelectric resistors for a pressure detecting apparatus comprising a pressure receiving diaphragm, a plurality of piezoelectric resistors formed on a surface of the diaphragm each having a resistance value varying in accordance with a distortion of the diaphragm, and a plurality of bridge circuits each constituted by the plurality of piezoelectric resistors, which is capable of performing the failure diagnosis.

To accomplish the above and other related objects, the present invention provides a pressure detecting apparatus comprising a diaphragm for receiving a pressure, a plurality of piezoelectric resistors formed on a surface of the diaphragm, each of the plurality of piezoelectric resistors having a resistance value varying in accordance with a distortion of the diaphragm, and a sensing circuit comprising a first bridge circuit and a second bridge circuit each constituted by the plurality of piezoelectric resistors. The first bridge circuit generates a first bridge output representing the distortion of the diaphragm caused when the pressure is applied on the diaphragm. The plurality of piezoelectric resistors of the second bridge circuit are connected in a predetermined relationship so as to generate a second bridge output which does not change in response to the distortion of the diaphragm.

According to the present invention, the first bridge circuit performs the pressure detection. Meanwhile, the second bridge circuit is not influenced by the pressure detection because its bridge output does not change in response to the distortion of the diaphragm. The second bridge circuit is not influenced by the dislocation caused in the arrangement of piezoelectric resistors.

The second bridge circuit is constituted by the piezoelectric resistors whose resistance values vary in accordance with a distortion of the diaphragm. The output of the second bridge circuit changes when the diaphragm is broken or when the resistance value of the piezoelectric resistor changes. Thus, the sensor failure can be detected by checking the change of bridge output of the second bridge circuit.

In this manner, the present invention provides a pressure detecting apparatus capable of performing a sensor failure diagnosis by providing the second bridge circuit. The freedom of layout of piezoelectric resistors in the second bridge circuit can be improved. Consequently, it becomes possible to provide an effective arrangement for the piezoelectric resistors.

Furthermore, it is preferable that the surface of the diaphragm is a (100) surface of a silicon semiconductor substrate, and the piezoelectric resistors are formed on the (100) surface in the first and second bridge circuits.

Using the (100) surface of the silicon semiconductor substrate as the surface of the diaphragm is preferable in that the piezoelectric resistors of the first and second bridge circuits can be easily disposed by utilizing two <110> crystal axes existing on the (100) surface.

Furthermore, it is preferable that the piezoelectric resistors constituting the first bridge circuit and the piezoelectric resistors constituting the second bridge circuit are disposed concentrically about the center of the diaphragm. This arrangement is advantageous in that wiring connection for each bridge circuit can be easily done.

Moreover, it is preferable that a pair of opposed piezoelectric resistors constituting part of the first bridge circuit cause a voltage change along a circumferential direction of a concentric circle having a center identical with the center of the diaphragm, while the other pair of opposed piezoelectric resistors constituting the rest of the first bridge circuit cause a voltage change along a radial direction of this concentric circle, and all of the piezoelectric resistors constituting the second bridge circuit cause a voltage change along a radial direction of a corresponding concentric circle.

Moreover, the present invention has an object to provide a pressure sensor capable of surely detecting a sensor failure without using a specific failure detecting bridge circuit or without using specific gauge resistors.

To accomplish the above and other related objects, the present invention provides a sixth pressure sensor having a pressure sensing circuit with a plurality of gauge resistors and a plurality of output terminals. The sixth pressure sensor comprises a memory means for storing a relationship of respective outputs of at least two output terminals arbitrarily selected from the plurality of output terminals, and a failure judging means for performing a failure judgement of the pressure sensing circuit by checking whether or not respective outputs of the selected output terminals measured at an arbitrary pressure point satisfy the relationship stored in the memory means.

With this arrangement, it becomes possible to monitor the variation of an output of each output terminal in the pressure sensing circuit and accurately obtain the relationship ofrespective terminal outputs, thereby realizing a highly reliable sensor failure judgement.

According to a preferred embodiment of the present invention, it is preferable that the pressure sensing circuit is a bridge circuit and the failure judgement of the pressure sensing circuit is performed based on voltage outputs of two midpoint terminals of the bridge circuit.

Furthermore, it is preferable that the failure judgement of the pressure sensing circuit is performed by checking whether or not the output of the second output terminal is within a predetermined range with respect to the output of the first output terminal, the predetermined range being determined based on the relationship stored in the memory means. This predetermined range can be arbitrarily set by considering a possible manufacturing error of the pressure sensor or the detecting accuracy.

Furthermore, the present invention has an object to provide a pressure sensor which is capable of detecting an abnormality in its output sensitivity.

To this end, the present invention provides a seventh pressure sensor comprises a diaphragm deformable in response to a pressure applied thereon, and a plurality of gauge resistors generating an electric signal representing the applied pressure based on a distortion of the diaphragm. The seventh pressure sensor includes at least six gauge resistors each having a resistance value varying in accordance with the applied pressure. The six gauge resistors consist of incremental gauge resistors each having a resistance value increasing in accordance with the applied pressure and the decremental gauge resistors each having a resistance value decreasing in accordance with the applied pressure. The electric signal representing the applied pressure is produced based on a voltage difference between two predetermined points of a plurality of connecting points of the six gauge resistors, and a sensor failure is detected based on a voltage difference between two another points of the connecting points.

According to this arrangement, among the six gauge resistors having a resistance value varying in response to an applied pressure, at least four gauge resistors are used for constituting a bridge circuit. The electric signal representing an applied pressure can be produced based on a voltage difference between the predetermined connecting points. Thus, the applied pressure can be detected.

Furthermore, providing at least six gauge resistors electrically connected to each other makes it possible to select two connecting points whose voltage levels do not vary in response to an applied pressure as far as all of the gauge registers are normal. The two selected connecting points are other than the two connecting points used for detecting the applied pressure.

If any failure occurs in a gauge resistor during the operation of the sensor, the voltage difference between two selected connecting points causes a variation and can be detected as a failure of the sensor. Accordingly, it becomes possible to provide a pressure sensor capable of detecting an abnormality in its output sensitivity.

Furthermore, the gauge resistors includes at least six resistors each having a resistance value varying in accordance with the applied pressure, It is preferable that the first gauge resistor is connected to the second gauge resistor at the first connecting point. The second gauge resistor is connected to the third gauge resistor at the second connecting point. The third gauge resistor is connected to the fourth gauge resistor at the third connecting point. The fourth gauge resistor is connected to the fifth gauge resistor at the fourth connecting point. The fifth gauge resistor is connected to the sixth gauge resistor at the fifth connecting point. And, the sixth gauge resistor is connected to the first gauge resistor at the sixth connecting point.

The first and fifth gauge resistors cause resistance changes in the same direction when the pressure is applied on the diaphragm, while the second and sixth gauge resistors cause resistance changes in the opposed direction when the pressure is applied on the diaphragm. The third gauge resistor and the fourth gauge resistor cause resistance changes in the same direction when the pressure is applied on the diaphragm.

Furthermore, the electric signal representing the applied pressure is produced based on the voltage difference between the first connecting point and the fifth connecting point caused when a voltage or current is supplied between the third connecting point and the sixth connecting point, while the sensor failure is detected based on the voltage difference between the second connecting point and the fourth connecting point.

According to the present invention having the above-described characteristic arrangement, the first, second, fifth, and sixth gauge resistors cooperatively constitutes a bridge circuit. The voltage difference between the first connecting point and the fifth connecting point is proportional the applied pressure. Thus, the applied pressure is detectable based on the electric signal caused between the the first connecting point and the fifth connecting point.

The third gauge resistor and the fourth gauge resistors cause the resistance change in the same direction in response to the applied pressure. When all of the gauge resistors are normal, no adverse influence is given to the voltage difference between the first connecting point and the fifth connecting point. The voltage difference between the second connecting point and the forth connecting point does not change.

If any one of the first to sixth gauge resistors is failed, the voltage difference between the second connecting point and the fourth connecting point will be changed. This change can be detected as a failure signal. Accordingly, the present invention provides a pressure sensor capable of detecting an abnormality in the output sensitivity.

Furthermore, it is desirable that the third and fourth gauge resistors and the first and fifth gauge resistors cause the resistance changes in the same direction.

BRIEF DESCRIPTION OF THE DRAWINGS

The above and other objects, features and advantages of the present invention will become more apparent from the following detailed description which is to be read in conjunction with the accompanying drawings, in which:

FIG. 25A is a plan view showing a diaphragm portion of a pressure sensor in accordance with a fifteenth embodiment of the present invention;

FIG. 25B is a cross-sectional view showing the diaphragm portion of the pressure sensor taken along a line L—L of FIG. 25A;

FIG. 25C is a graph showing the relationship between the position of diffused resistor and a generated stress in accordance with the fifteenth embodiment of the present invention;

FIG. 54 is a cross-sectional view showing a schematic arrangement of a pressure sensor in accordance with a twenty-sixth embodiment of the present invention;

DESCRIPTION OF PREFERRED EMBODIMENTS

Preferred embodiments of the present invention will be explained hereinafter with reference to the attached drawings.

First Embodiment

Hereinafter, a first embodiment of the present invention will be explained with reference to FIGS. 1A, 1B and 2. A pressure sensor of the first embodiment can be preferably used in an automotive vehicle to measure a hydraulic braking pressure of a brake system and a fuel pressure of a fuel injection system.

Figure 1A:
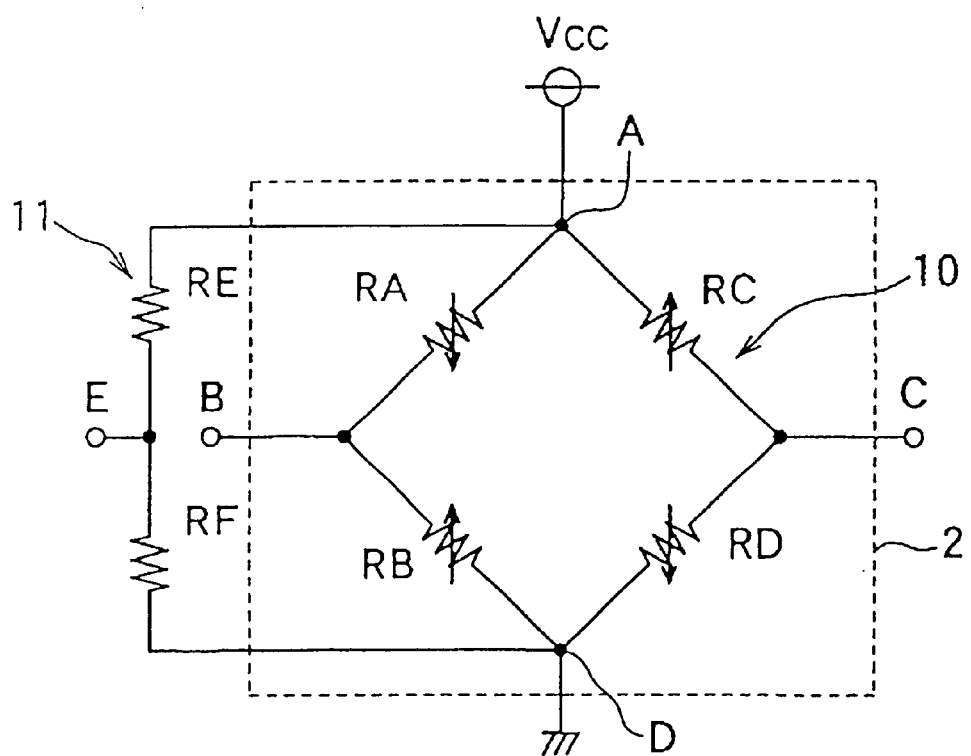
FIGS. 1A and 1B are circuit diagrams cooperatively showing the schematic arrangement of a pressure sensor in accordance with a first embodiment of the present invention.
Figure 1B:
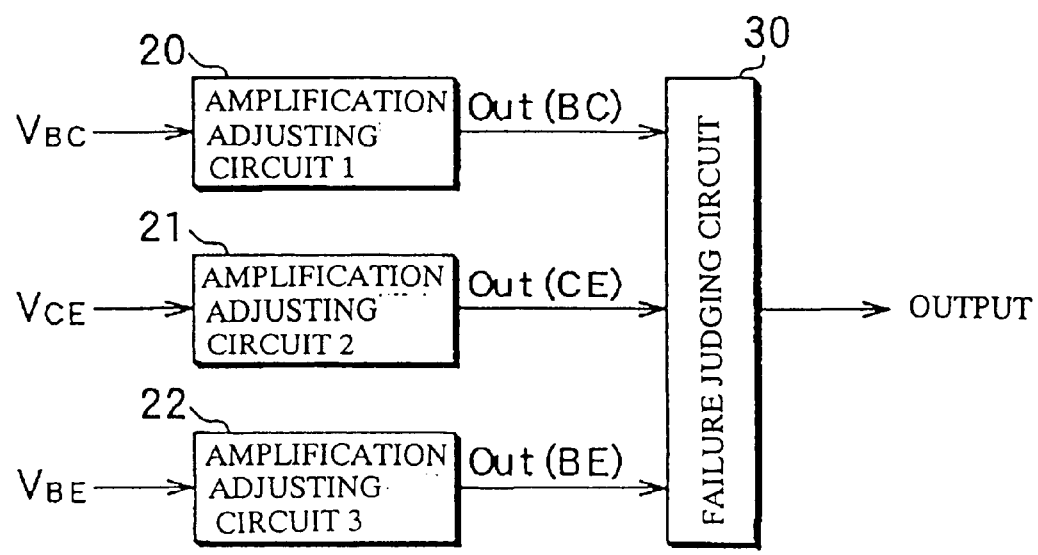

FIGS. 1A and 1B show the circuit arrangement of the pressure sensor of the first embodiment. FIG. 2 shows a partial cross section of the pressure sensor of the first embodiment. As shown in FIG. 1A, the pressure sensor comprises a bridge circuit 10 including a total of four gauge resistors (diffused resistors) RA, RB, RC, and RD arranged in a bridge connection.

Figure 2:
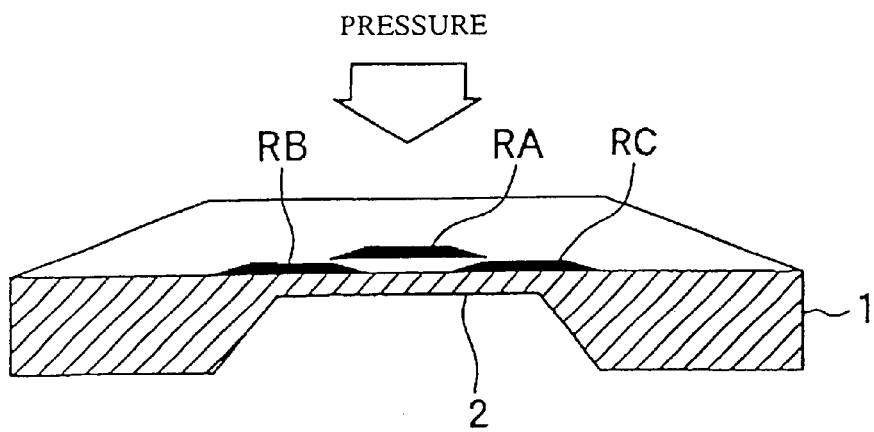
FIG. 2 is a partial cross-sectional view showing the pressure sensor in accordance with the first embodiment of the present invention.

As shown in FIG. 2, the bridge circuit 10 is formed on a thin diaphragm portion 2 of a silicon substrate 1. The diaphragm portion 2 is indicated by a dotted line in FIG. 1A. Among the resistors constituting the bridge circuit 10, two resistors RA and RD are formed in a central region of the diaphragm portion 2 and two other resistors RB and RC are formed in a peripheral region of the diaphragm portion 2. The diaphragm portion 2 causes a stress deformation in response to a stress applied on the diaphragm portion 2. In response to this deformation, a resistance of each of the resistors RA to RD varies in a direction shown by an arrow in FIG. 1A due to a piezo-resistance effect. The resistance values of resistors RA and RD decrease, while the resistance values of resistors RB and RC increase.

Furthermore, the pressure sensor of the first embodiment comprises a reference voltage generating circuit 11 is connected between one end and the other end of the bridge circuit 10. The reference voltage generating circuit 11 generates a reference voltage based on a resistor division. The reference voltage generating circuit 11 consists of two resistors RE and RF which are serially connected. The resistors RE and RF are disposed on a rigid portion of the silicon substrate 1 not influenced by the stress deformation caused in response to the application of pressure. The reference voltage is produced by a resistance division of the resistors RE and RF.

To avoid patterning and temperature influences, it is desirable to fabricate respective resistors RA to RF through substantially the same processes to have the same shape and the same resistance value.

A constant voltage Vcc is applied between a terminal A of the one end of the bridge circuit 10 (i.e., a power source terminal) and a terminal D of the other end of the bridge circuit 10 (i.e., a ground terminal). A midpoint B of the resistors RA and RB and a midpoint C of the resistors RC and RD serve as output terminals for outputting midpoint voltages. A voltage difference $V_{BC}$ between the midpoints B and C is outputted as a value representing the pressure applied on the diaphragm potion of the silicon substrate. The same effect will be obtained by applying a constant current between the terminals A and D.

Furthermore, to judge a failure of the bridge circuit 10, the first embodiment produces voltage differences $V_{CE}$ and $V_{BE}$. The voltage difference $V_{CE}$ is a voltage difference between the midpoint E of the reference voltage generating circuit 11 and the midpoint C of the bridge circuit 10, and the voltage difference $V_{BE}$ is a voltage difference between the midpoint E of the reference voltage generating circuit 11 and the midpoint B of the bridge circuit 10.

As shown in FIG. 1B, the voltages $V_{BC}$, $V_{CE}$, and $V_{BE}$ are entered into amplification (i.e., calibration) adjusting circuits 20, 21, and 22, respectively. The amplification adjusting circuits 20, 21, and 22 amplify the voltages $V_{BC}$, $V_{CE}$, and $V_{BE}$ and produce output signals Out(BC), Out(CE), and Out(BE). The output signals Out(BC), Out(CE), and Out(BE) are entered into a failure judging circuit (e.g., a diagnosis circuit) 30. The failure judging circuit 30, being a comparator, is arranged to perform a failure or fault judgement of the bridge circuit 10, as described later.

The failure judging circuit 30 can be incorporated in the pressure sensor, or can be separately provided in an external device such as an ECU (electronic control unit). When the failure judging circuit 30 is incorporated in the pressure sensor, the terminals connectable to outer devices are three terminals of the power source terminal A, the ground terminal D, and the Out(BC). When the failure judging circuit 30 is provided in the external device, it is necessary to increase the number of terminals connectable to outer devices, for example for the Out(CE) and Out(BE).

The failure judgement of the bridge circuit 10 is performed in the following manner.

As the resistance values of respective resistors RA to RF are identical to each other, the midpoint voltages at two midpoints B and C of the bridge circuit 10 are equal to the midpoint voltage of the midpoint E of the reference voltage generating circuit 11 under a condition where no pressure is applied on the diaphragm portion 2. Accordingly, when the voltage level at the terminal E is regarded as a reference level, the relationship of voltage differences $V_{BC}$, $V_{CE}$, and $V_{BE}$ between respective terminals B, C, and E is defined by the following formula 1-1.

$$V_{BC} = V_{CE} = V_{BE} = 0 \tag{1-1}$$

Furthermore, when the pressure is applied on the diaphragm portion 2 of the silicon substrate 1, the voltage level of the terminal B increases and the voltage level of the terminal C decreases. Meanwhile, the voltage level of the terminal E does not vary because the resistors RE and RF are disposed on the rigid portion of the silicon substrate 1 not influenced by the application of pressure. The resistors RA and RD cause the same resistance changes. Similarly, the resistors RB and RC cause the same resistance changes. The absolute value of the voltage change at the terminal B is thus equal to the absolute value of the voltage change at the terminal C. Accordingly, regarding the voltage level at the terminal E as a reference level, the relationship of voltage differences $V_{BC}$, $V_{CE}$, and $V_{BE}$ is defined by the following formula 1-2.

$$|V_{BC}| = 2 \times |V_{CE}| = 2 \times |V_{BE}| \tag{1-2}$$

Accordingly, it becomes possible to judge the failure of the bridge circuit 10 by comparing the absolute values of the voltage $V_{BC}$, $V_{CE}$, and $V_{BE}$. Namely, when the formula 1-2 is established, it can be concluded that the operation of the pressure sensor is normal. When the formula 1-2 is not established, it can be concluded that any failure has occurred in the bridge circuit.

However, the changes of the voltage $V_{BC}$, $V_{CE}$, and $V_{BE}$ are too small to directly use for the failure judgement of the bridge circuit. Accordingly, the first embodiment provides the amplification adjusting circuits 20, 21, and 22 for respective voltages $V_{BC}$, $V_{CE}$, and $V_{BE}$ as well as the failure judging circuit 30 comparing the output signals Out(BC), Out(CE), and Out(BE) of the amplification adjusting circuits 20, 21, and 22. Thus, it is judged whether or not the following formula 1-3 is established.

$$|Out(BC)| = 2 \times |Out(CE)| = 2 \times |Out(BE)| \tag{1-3}$$

Employing the arrangement of the first embodiment makes it possible to perform the failure judgement of the bridge circuit 10 as well as the failure judgement for the amplification adjusting circuits 20, 21, and 22.

As described above, in the pressure sensor using the bridge circuit 10, the first embodiment provides a reference voltage generating circuit so as not to be influenced by the application of pressure on the diaphragm portion. Thus, the first embodiment can surely detect a sensor failure, such as change of a bridge resistance value due to breakage of wire or short-circuit.

Second Embodiment

Figure 3:
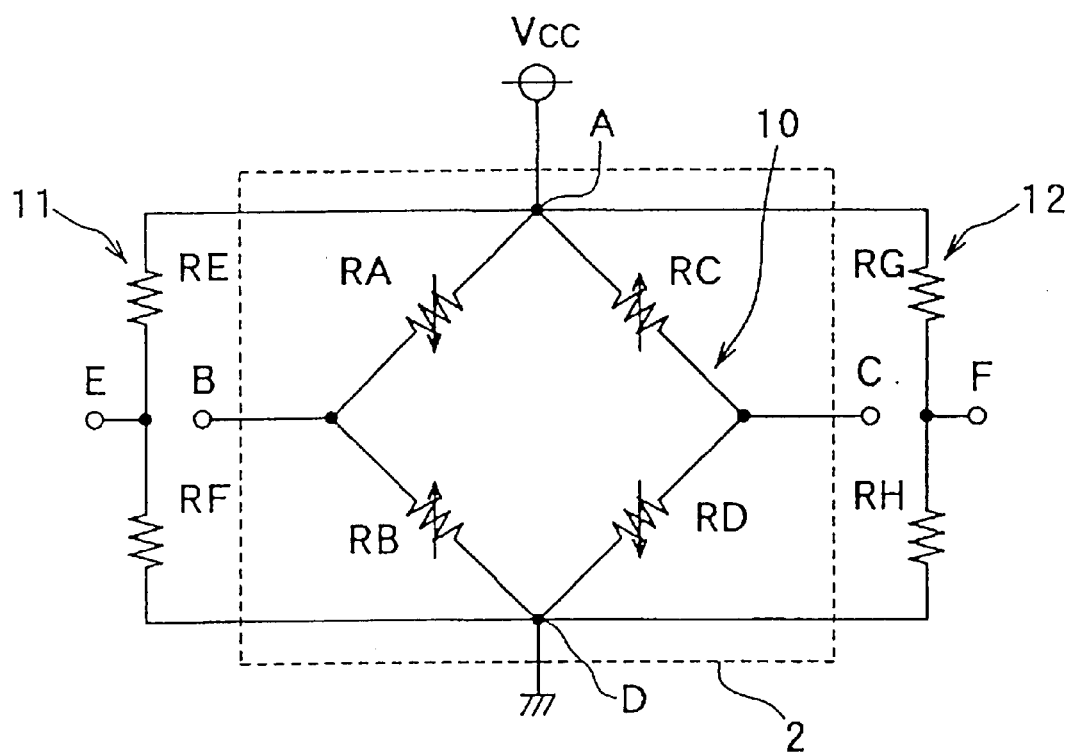
FIG. 3 is a circuit diagram showing the schematic arrangement of a pressure sensor in accordance with a second embodiment of the present invention.

Next, a second embodiment of the present invention will be explained with reference to FIG. 3. The pressure sensor of the second embodiment differs from the pressure sensor of the first embodiment in that the bridge circuit 10 comprises a second reference voltage generating circuit 12 in addition to the first reference voltage generating circuit 11. The components disclosed in the first embodiment are denoted by the same reference numerals and will not be explained. Like the first embodiment, the amplification adjusting circuits and the failure judging circuit are provided for the pressure sensor of the second embodiment although not shown in the drawing.

Like the first reference voltage generating circuit 11, the second reference voltage generating circuit 12 is connected between one end and the other end of the bridge circuit 10. The second reference voltage generating circuit 12 generates a reference voltage based on a resistor division. The second reference voltage generating circuit 12 consists of two resistors RG and RH which are serially connected. The resistors RG and RH are disposed on a rigid portion of the silicon substrate 1 not influenced by the stress deformation caused in response to the application of pressure. Thus, the resistors RG and RH cause no resistance change when a pressure is applied on the diaphragm portion 2.

To avoid patterning and temperature influences, it is desirable to fabricate respective resistors RA to RH through substantially the same processes to have the same shape and the same resistance value.

The failure judgement (i.e., diagnosis) of the bridge circuit 10 in accordance with the second embodiment is performed in the following manner.

When a pressure is applied on the diaphragm portion 2 of the silicon substrate 1, the voltage level of the terminal B increases and the voltage level of the terminal C decreases. Meanwhile, the voltage levels of the terminals E and F do not vary because the resistors RE, RF, RG, and RH are disposed on the rigid portion of the silicon substrate 1 not influenced by the application of pressure. The resistors RA and RD cause the same resistance changes. Similarly, the resistors RB and RC cause the same resistance changes. The absolute value of the voltage change at the terminal B is thus equal to the absolute value of the voltage change at the terminal C. Accordingly, when the voltage levels at the terminals E and F are regarded as reference levels, the relationship of voltage differences $V_{BC}$, $V_{CE}$, $V_{BE}$, $V_{CF}$ and $V_{BF}$ is defined by the following formula 1-4.

$$|V_{BC}|=2\times|V_{CE}|=2\times|V_{BE}|=2\times|V_{CF}|=2\times|V_{BF}| \quad (1\text{-}4)$$

The voltages differences $V_{BC}$, $V_{CE}$, $V_{BE}$, $V_{CF}$ and $V_{BF}$ are then processed in the corresponding amplification adjusting circuits to produce output signals Out(BC), Out(CE), Out(BE), Out(CF), and Out(BF), respectively. The relationship of output signals Out(BC), Out(CE), Out(BE), Out(CF), and Out(BF) is defined by the following formula 1-5.

$$|\text{Out}(BC)|=2\times|\text{Out}(CE)|=2\times|\text{Out}(BE)|=2\times|\text{Out}(CF)|=2\times|\text{Out}(BF)| \quad (1\text{-}5)$$

Thus, the occurrence of failure in the bridge circuit 10 is detectable by checking whether or not the above formula 1-4 or 1-5 is established.

The number of equations involved in the formulas 1-4 and 1-5 is larger than the number of equations involved in the formulas 1-2 and 1-3. Thus, the second embodiment ensures the failure judgement of the bridge circuit.

Although the second embodiment provides first and second reference voltage generating circuits 11 and 12, it is preferable to increase the number of reference voltage generating circuits.

Furthermore, it is not always necessary to use all of the equations involved in the formulas 1-4 and 1-5. For example, it is possible to compare a voltage difference between the midpoints B and C with a voltage difference between the midpoint B or the midpoint C and either of the reference voltages of the first and second reference voltage generating circuits 11 and 12.

Third Embodiment

Figure 4:
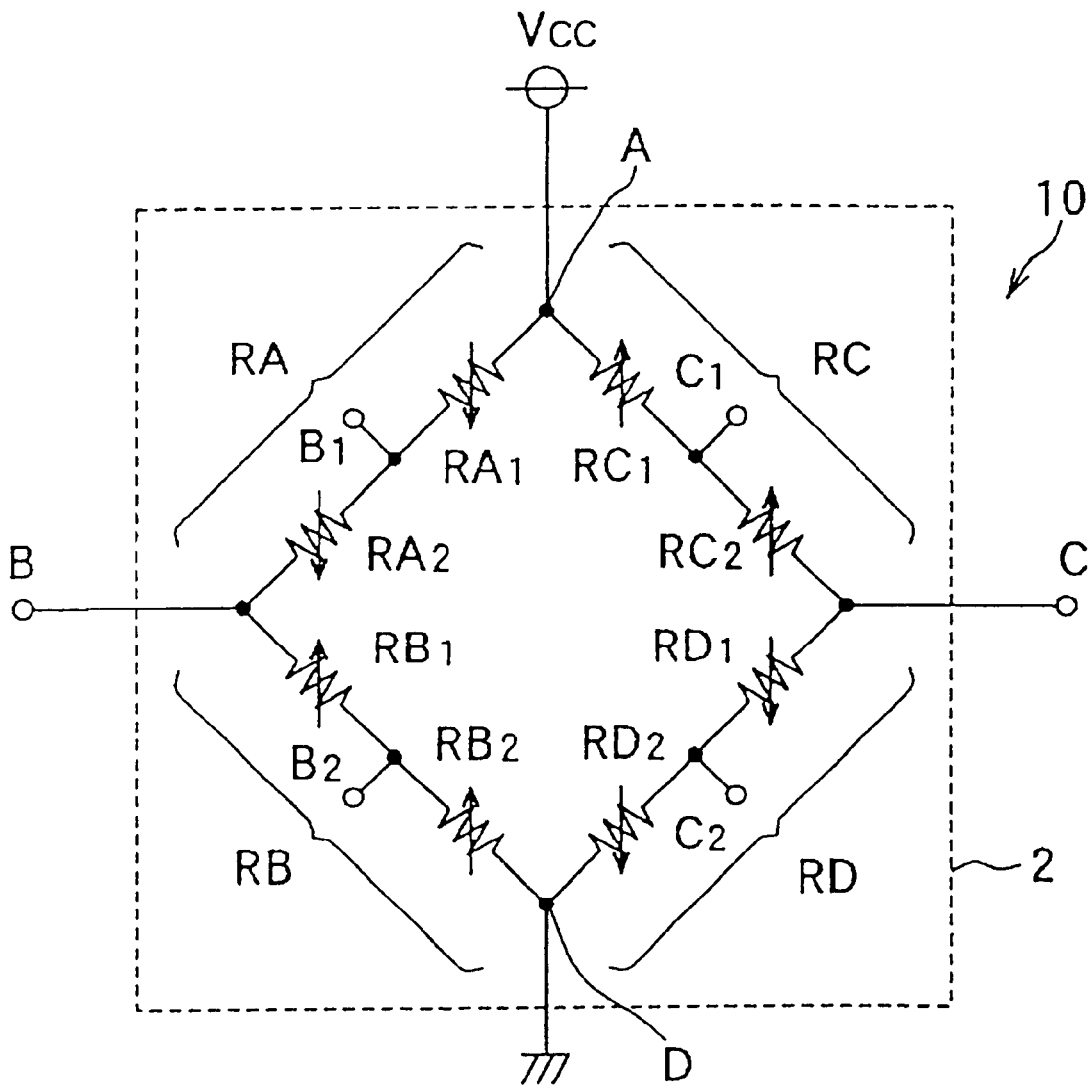
FIG. 4 is a circuit diagram showing the schematic arrangement of a pressure sensor in accordance with a third embodiment of the present invention.

A third embodiment of the present invention will be explained with reference to FIG. 4. A pressure sensor of the third embodiment differs from the pressure sensor of the first embodiment in the arrangement of the bridge circuit 10. The bridge circuit 10 of the third embodiment does not include the reference voltage generating circuit. The components disclosed in the first embodiment are denoted by the same reference numerals and will not be explained. Like the first embodiment, the amplification adjusting circuits and the failure judging circuit are provided for the pressure sensor of the third embodiment although not shown in the drawing.

According to the third embodiment, each of the four gauge resistors RA, RB, RC and RD is divided into two equal resistors. More specifically, the gauge resistor RA is a combination of two separate gauge resistors RA1 and RA2 which are serially connected. The gauge resistor RB is a combination of two separate gauge resistors RB1 and RB2 which are serially connected. The gauge resistor RC is a combination of two separate gauge resistors RC1 and RC2 which are serially connected. The gauge resistor RD is a combination of two separate gauge resistors RD1 and RD2 which are serially connected. All of the eight resistors RA1 to RD2 has the same resistance. A resistance value of respective resistors RA1 to RD2 varies in a direction shown by an arrow in FIG. 4 in response to a pressure applied on the diaphragm of the silicon substrate.

A constant voltage Vcc is applied between two terminals A and D. A midpoint B of the resistors RA and RB and a midpoint C of the resistors RC and RD serve as output terminals for outputting midpoint voltages. A voltage difference $V_{BC}$ between the midpoints B and C is outputted as a value representing the pressure applied on the diaphragm potion of the silicon substrate.

The bridge circuit 10 of the third embodiment produces a voltage difference $V_{B1C1}$ between an intermediate terminal B1 of the separate resistors RA1 and RA2 and an intermediate terminal C1 of the separate resistors RC1 and RC2, as well as a voltage difference $V_{B2C2}$ between an intermediate terminal B2 of the separate resistors RB1 and RB2 and an intermediate terminal C2 of the separate resistors RD1 and RD2.

Now, attention should be paid on the voltage level of the intermediate terminal B1 of the separate resistors RA1 and RA2 and the voltage level of the intermediate terminal C1 of the separate resistors RC1 and RC2. When a pressure is applied on the diaphragm portion 2, the voltage level of the terminal B1 increases and the voltage level of the terminal C1 decreases. In this case, the resistors RA1, RA2, RD1, and RD2 cause the same resistance changes, while the resistors RB1, RB2, RC1, and RC2 cause the same resistance changes.

Hence, the absolute value of the voltage difference $VB_{1C1}$ between the intermediate terminals B1 and C1 is obtained in the following manner. First, the absolute value of the voltage difference $V_{BC}$ between the midpoints B and C is divided by a division number of the resistors RA and RC. According to this embodiment, the division number of the resistors RA and RC is equal to 2. Then, the obtained value is multiplied with the number of separate resistors interposed between the power source terminal A and respective intermediate terminals B1 and C1. According to this embodiment, the number of the interposed separate resistors is 1. Similarly, the absolute value of the voltage difference $V_{B2C2}$ between the intermediate terminals B2 and C2 is obtained by dividing the absolute value of the voltage difference $V_{BC}$ by a division number of the resistors RB and RD, and then by multiplying the obtained value with the number of separate resistors interposed between the ground terminal D and respective intermediate terminals B2 and C2.

Therefore, the following formula 1-6 is established among the voltage difference $V_{BC}$ between the midpoints B and C, the voltage difference $V_{B1C1}$ between the intermediate terminals B1 and C1, and the voltage difference $V_{B2C2}$ between the intermediate terminals B2 and C2.

$$|V_{BC}|=2\times|V_{B1C1}|=2\times|V_{B2C2}| \tag{1-6}$$

The voltages differences $V_{BC}$, $V_{B1C1}$, and $V_{B2C2}$ are then processed in the corresponding amplification adjusting circuits to produce output signals Out(BC), Out(B1C1), and Out(B2C2), respectively. The relationship of output signals Out(BC), Out(B1C1), and Out(B2C2) is defined by the following formula 1-7.

$$|Out(BC)|=2\times|Out(B1C1)|=2\times|Out(B2C2)| \tag{1-7}$$

Thus, the occurrence of failure in the bridge circuit 10 is detectable by checking whether or not the above formula 1-6 or 1-7 is established. Namely, the third embodiment performs the failure judgement of the bridge circuit based on the comparison between the voltage difference $V_{BC}$ and the voltage differences $V_{B1C1}$ and $V_{B2C2}$, where $V_{BC}$ represents a voltage difference between the intermediate terminals B2 and C2, $V_{B1C1}$ represents a voltage difference between the intermediate terminals B1 and C1 which have the same voltage level when no pressure is applied on the diaphragm portion 2, and $V_{B2C2}$ represents a voltage difference between the intermediate terminals B2 and C2 which have the same voltage level when no pressure is applied on the diaphragm portion 2.

Although each of the above-described formulas 1-6 and 1-7 includes a plurality of equations for the failure judgement of the bridge circuit, it is not always necessary to use all of these equations. For example, the failure judgement of the bridge circuit can be performed by checking an establishment of $|V_{BC}|=2\times|V_{B1C1}|$ or $|V_{BC}|=2\times|V_{B2C2}|$ or an establishment of $|Out(BC)|=2\times|Out(B1C1)|$ or $|Out(BC)|=2\times|Out(B2C2)|$. In this case, the failure detection is feasible by comparing only two voltage differences. The circuit arrangement can be simplified.

Figure 5:
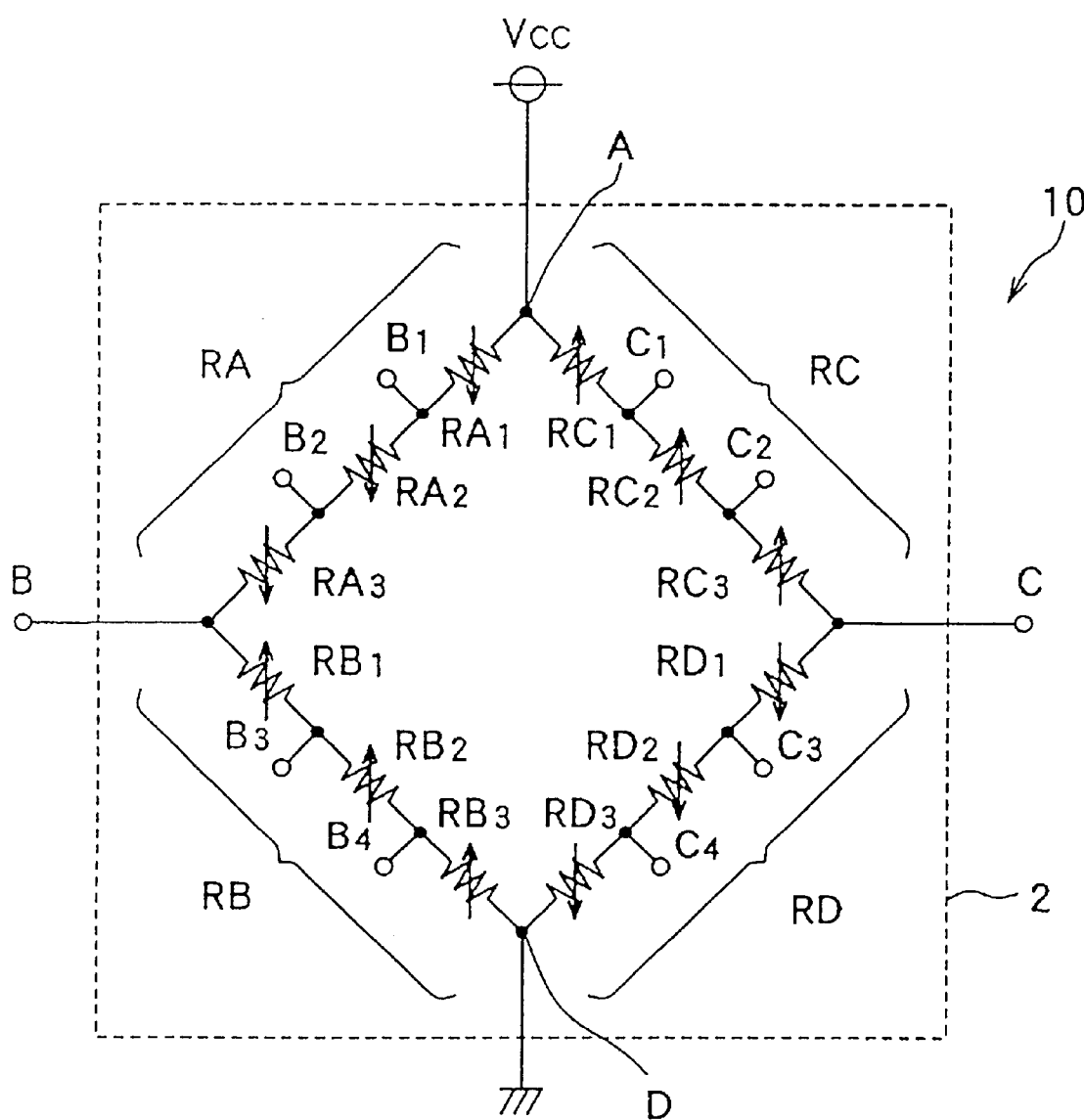
FIG. 5 is a circuit diagram showing the schematic arrangement of a modified pressure sensor in accordance with the third embodiment of the present invention.

Although all of four resistors RA to RD are divided into two separate resistors, the third embodiment allows to increase the number of separate resistors forming each of the resistors RA to RD. FIG. 5 shows a modified bridge circuit 10 wherein each of the resistors RA to RD is divided into three aseparate resistors. In this case, the relationship of 12 separate resistors RA1 to RD3 is define by the following formula 1-8.

$$|V_{BC}|=3\times|V_{B1C1}|=3\times|V_{B4C4}|=3\times|V_{B4C4}|=3/2\times|V_{B2C2}|=3/2\times|V_{B3C3}| \tag{1-8}$$

Furthermore, the division number of the resistors RA and RC can be differentiated from the division number of the resistors RB and RD.

Fourth Embodiment

Figure 6:
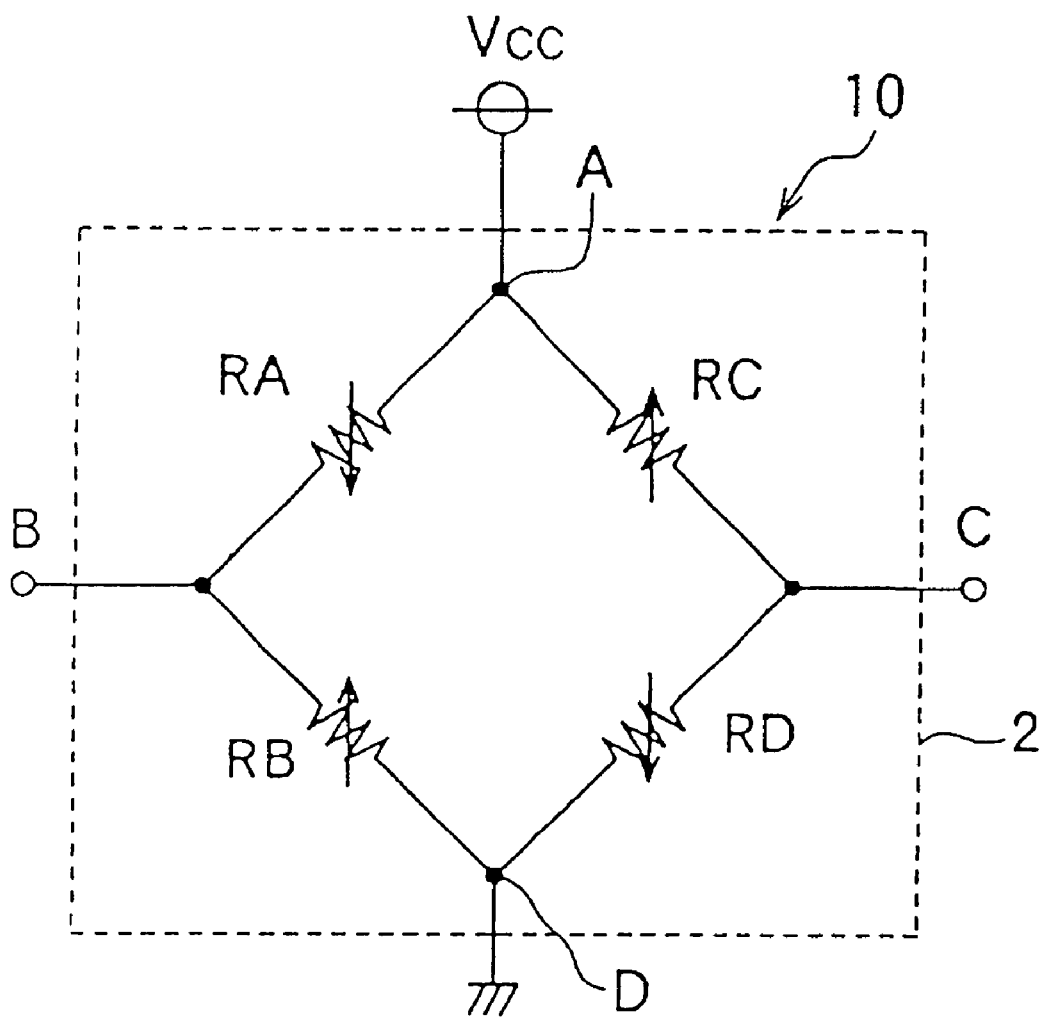
FIG. 6 is a circuit diagram showing the schematic arrangement of a pressure sensor in accordance with a fourth embodiment of the present invention.

A fourth embodiment of the present invention will be explained with reference to FIG. 6. Like a conventional bridge circuit, a pressure sensor of the fourth embodiment comprises a bridge circuit 10 with a total of four gauge resistors RA, RB, RC and RD arranged in a bridge connection. Like the first embodiment, the amplification adjusting circuits and the failure judging circuit are provided for the pressure sensor of the fourth embodiment although not shown in the drawing.

The failure judgement of the bridge circuit in accordance with the fourth embodiment is performed in the following manner.

When a pressure is applied on the diaphragm portion 2, the voltage level of the midpoint B increases and the voltage level of the midpoint C decreases. Meanwhile, the voltage levels of the terminals A and D do not vary. The resistors RA and RD cause the same resistance changes. Similarly, the resistors RB and RC cause the same resistance changes. The absolute value of the voltage change at the terminal B is thus equal to the absolute value of the voltage change at the terminal C.

Accordingly, the relationship of a voltage difference $V_{AC}$ between the terminals A and C, a voltage difference $V_{BD}$ between the terminals B and D, a voltage difference $V_{AB}$ between the terminals A and B, and a voltage difference $V_{CD}$ between the terminals C and D is defined by the following formula 1-9.

$$|V_{AC}|=|V_{BD}| \text{ and } |V_{AB}|=|V_{CD}| \tag{1-9}$$

Accordingly, the failure judgement of the bridge circuit can be performed by comparing the absolute values of respective voltage differences $V_{AC}$, $V_{BD}$, $V_{AB}$, and $V_{CD}$. Namely, when the formula 1-9 is established, it can be concluded that the operation of the pressure sensor is normal. When the formula 1-9 is not established, it can be concluded that any failure has occurred in the bridge circuit.

Fifth Embodiment

A fifth embodiment of the present invention will be explained with reference to FIGS. 7 and 8. FIG. 7 is a plan view showing a diaphragm portion of a pressure sensor in accordance with the fifth embodiment. FIG. 8 is a circuit diagram showing the schematic arrangement of the pressure sensor in accordance with the fifth embodiment.

Figure 7A:
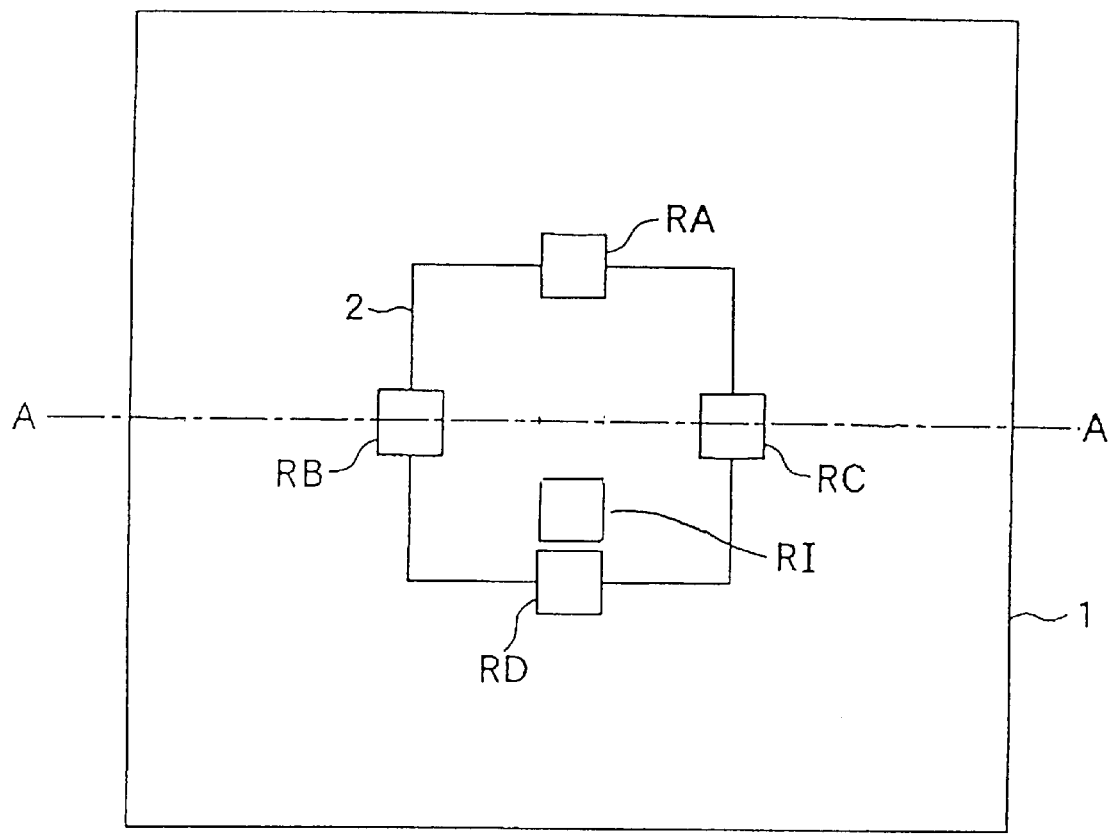
FIG. 7A is a plan view showing a diaphragm portion of a pressure sensor in accordance with a fifth embodiment of the present invention.
Figure 7B:
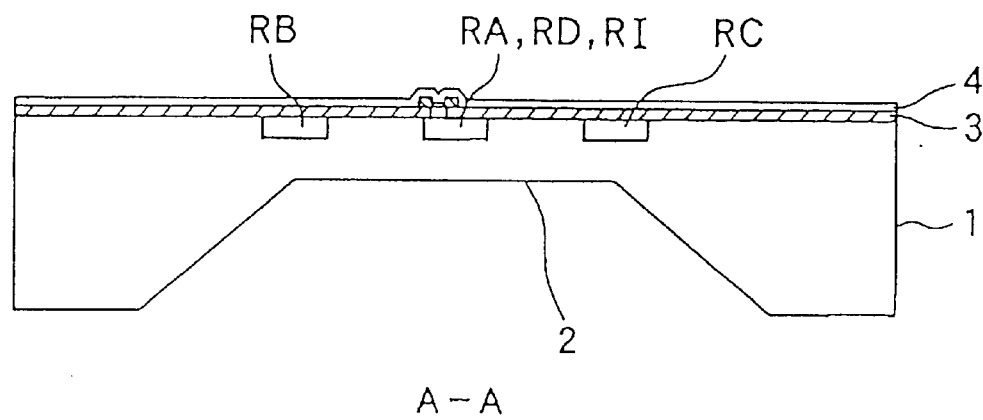
FIG. 7B is a cross-sectional view showing the diaphragm portion of the pressure sensor taken along a line A—A of FIG. 7A.
Figure 8:
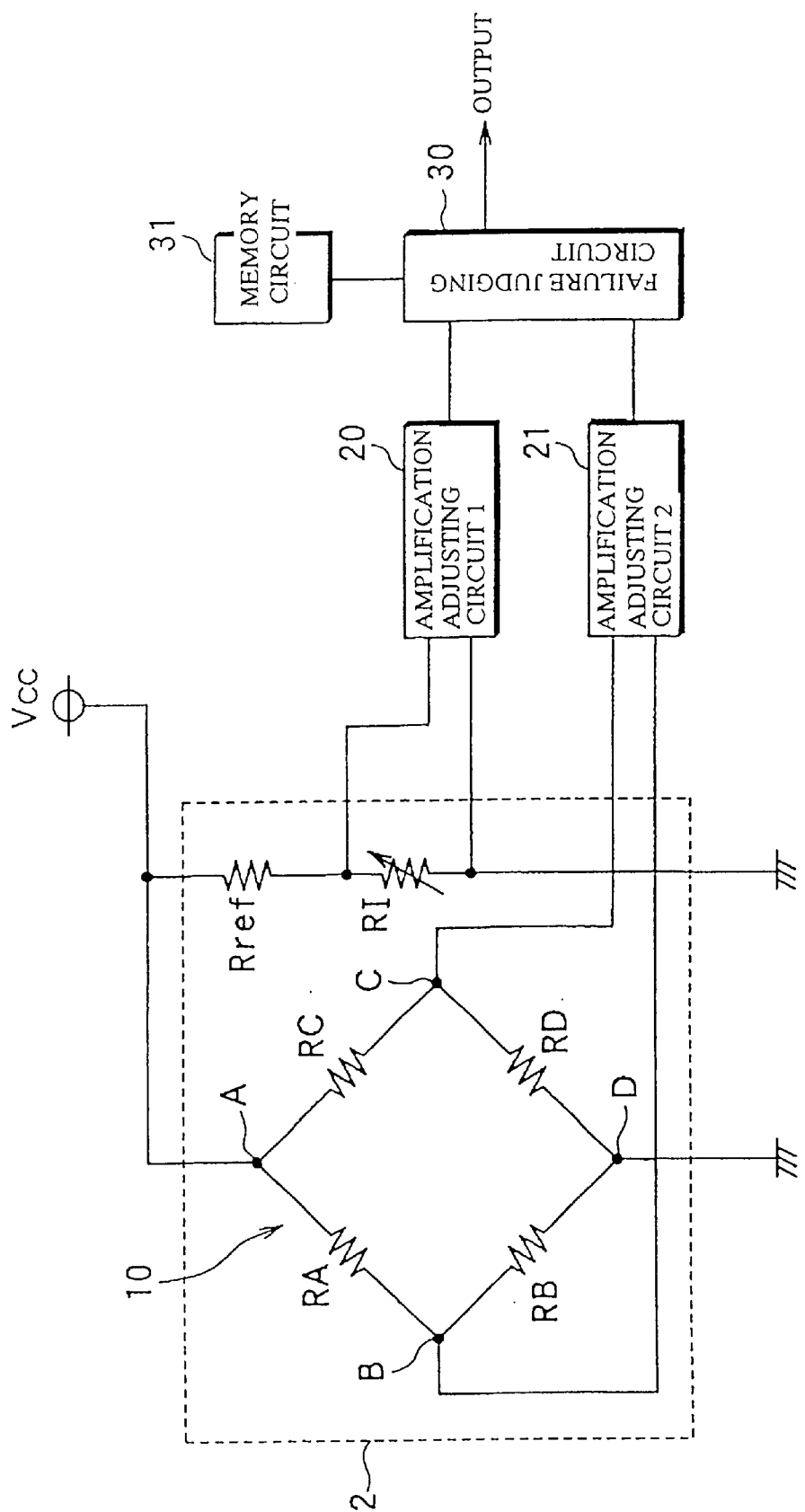
FIG. 8 is a circuit diagram showing the schematic arrangement of a pressure sensor in accordance with a fifth embodiment of the present invention.

As shown in FIGS. 7A and 7B, the pressure sensor of the fifth embodiment comprises a failure detecting diffused resistor RI in addition to the diffused resistors RA to RD constituting a pressure detecting bridge circuit. The diffused resistor RI is formed on a predetermined region of the diaphragm portion 2 of the silicon substrate 1. The predetermined region is offset from the center of the diaphragm portion 2. In other words, the predetermined region is a place where the balance of a radial stress and a circumferential stress is lost when a pressure is applied on the diaphragm.

An oxide film 3, serving as an insulation layer, is formed on the silicon substrate 1. The oxide film 3 is formed with contact holes. Although not shown in the drawing, a patterning of aluminum wiring is formed on the oxide film 3.

A protective film (i.e., a passivation film) 4 is formed on the oxide film 3 to cover the aluminum wiring.

A surface of silicon substrate 1 of the fifth embodiment is a (100) surface where <110> crystal axes exist perpendicularly to each other. As shown in FIG. 7A, the diff-used resistors RA to RD constituting the pressure detecting bridge circuit are disposed along two <110> crystal axis directions, with two resistors on each direction.

As shown in FIG. 8, the failure detecting diffused resistor RI is serially connected to a reference resistor Rref, in parallel with the pressure detecting bridge circuit 10. The pressure detecting bridge circuit 10 outputs a voltage difference between two midpoints caused in response to an application of pressure to the diaphragm portion 2. A resistance of the failure detecting diffused resistor RI increases in response to the application of pressure to the diaphragm portion 2. Thus, the failure detecting difflused resistor RI produces an output proportional to the resistance. The output signals of the failure detecting diffused resistor RI and the pressure detecting bridge circuit 10 are respective amplified in amplification adjusting circuits 20 and 21, and then sent to the failure judging circuit 30. The failure judging circuit 30 is arranged to perform a failure judgement.

The failure judgement of the fifth embodiment is performed in the following manner. First, the output voltage characteristics of the pressure detecting bridge circuit 10 to a pressure applied on the diaphragm portion 2 as well as the output resistance characteristics of the failure detecting diffused resistor RI to the pressure applied on the diaphragm portion 2 are measured in advance at a plurality of arbitrary pressure points. The measured relationships are stored in a memory circuit 31. With this arrangement, it becomes possible to obtain the change characteristics of an output value of the failure detecting diffused resistor RI. The output of the bridge circuit 10 and the output of the resistor RI vary in proportion to the change of a stress. The output change characteristics of the bridge circuit 10 and the output of the resistor RI are mutually different. A predetermined relationship is established between these outputs. Namely, when the operation of the pressure sensor is normal, the relationship between the output of the bridge circuit 10 and an output of the resistor RI at a certain pressure point is constant.

Accordingly, during the operation of the pressure sensor, the output of the bridge circuit 10 is compared with the output of the resistor RI. If the measured output relationship is not identical with the memorized relationship stored in the memory circuit 31, it can be judged that the bridge circuit 10 does not operate normally.

Furthermore, according to a conventional pressure sensor, the gauge resistors RA to RD constituting the pressure detecting bridge circuit are disposed on the diaphragm portion along two perpendicular directions with two resistors on each direction. The remaining portion is a unused region. However, according to the fifth embodiment, the failure detecting diffused resistor RI is provided in this unused region of the diaphragm portion. Thus, it becomes possible to provide a pressure sensor having the capability of detecting a sensor failure with a sensing portion whose size is substantially identical with that of the conventional pressure sensor. Thus, the pressure sensor can be downsized.

Although the fifth embodiment uses a diffused resistor for the failure detecting diffused resistor RI, it is possible to use a thin-film resistor for the failure detecting diffused resistor RI. Although the fifth embodiment uses only one resistor for constituting the failure detecting circuit, it is possible to use a plurality of resistors for the failure detecting circuit. For example, when the failure detecting circuit is constituted by two resistors serially connected, a midpoint voltage is outputted for the failure detection.

Sixth Embodiment

Figure 9A:
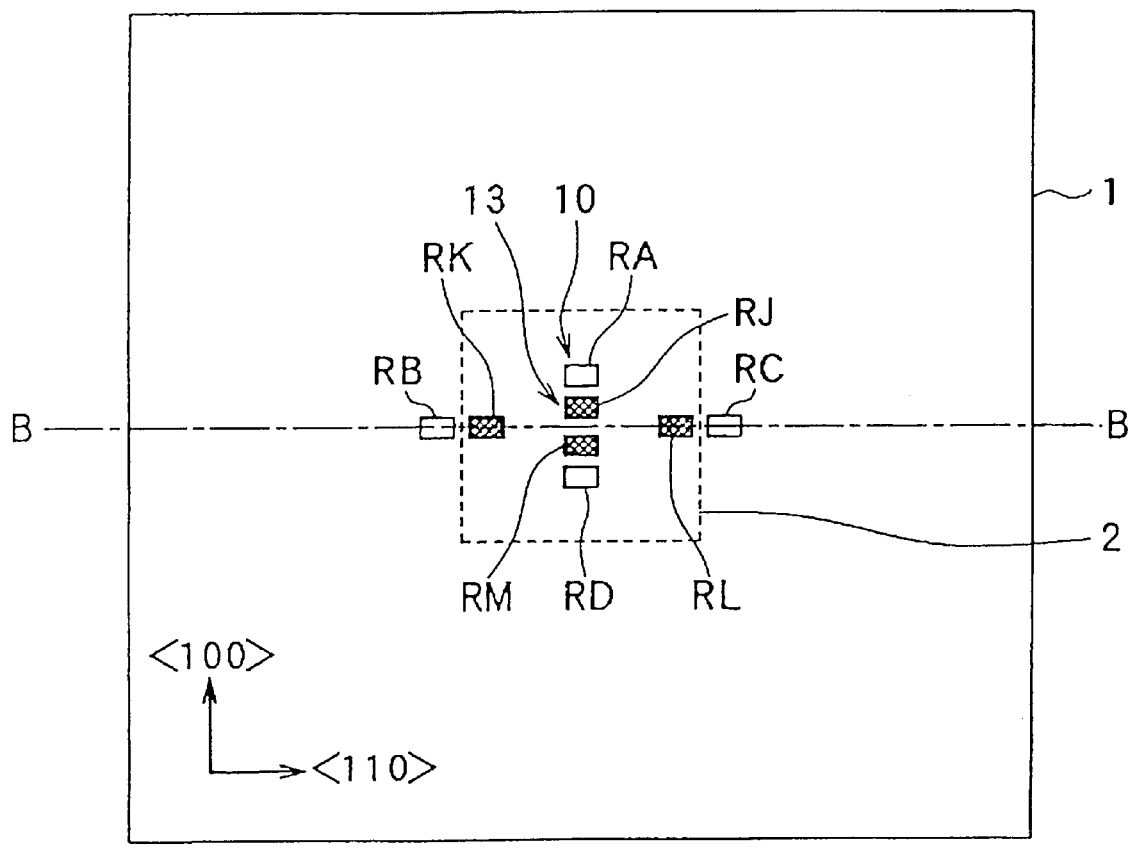
FIG. 9A is a plan view showing a diaphragm portion of a pressure sensor in accordance with a sixth embodiment of the present invention.
Figure 9B:
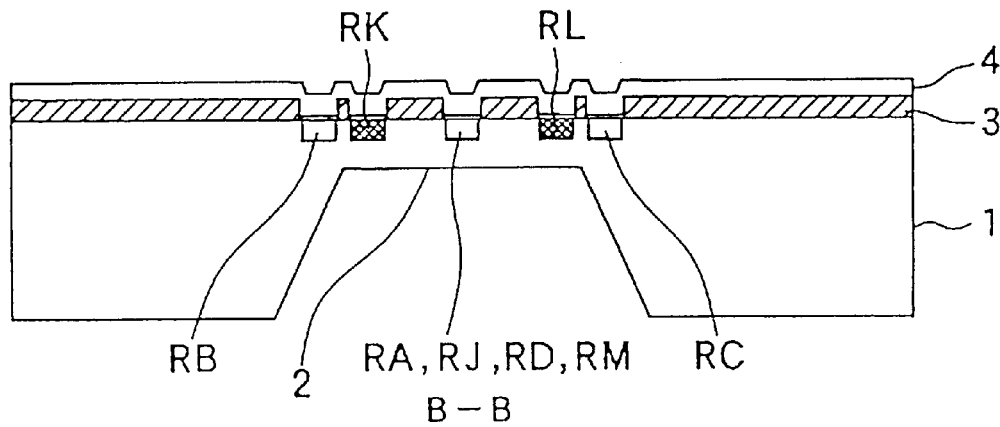
FIG. 9B is a cross-sectional view showing the diaphragm portion of the pressure sensor taken along a line B—B of FIG. 9A.

A sixth embodiment of the present invention will be explained with reference to FIG. 9A to 12. FIG. 9A is a plan view showing a diaphragm portion of a pressure sensor of the sixth embodiment. FIG. 9B is a cross-sectional view of the pressure sensor taken along a line B—B of FIG. 9A.

As shown in FIG. 9A, a total of eight diffused resistors RA~RD and RJ~RM are formed on the diaphragm portion 2 of the silicon substrate 1. The diffused resistors RA~RD, each shown by a white rectangle in the drawing, cooperatively constitute a pressure detecting bridge circuit 10. The remaining diffused resistors RJ~RM, each shown by a trellised rectangle in the drawing, cooperatively constitute a failure detecting bridge circuit 13. The failure detecting bridge circuit 13 is located inside the pressure detecting bridge circuit 10. A surface of silicon substrate 1 of the sixth embodiment is a (110) surface where both a <100> crystal axis and a <110> crystal axis exist perpendicularly to each other. The resistors RA, RD, RJ and RM are formed along a <100> crystal axis direction. The resistors RB, RC, RK and RL are formed along a <110> crystal axis direction.

Furthermore, as shown in FIG. 9B, the pressure sensor of the sixth embodiment comprises diffused resistors serving as the P-type diffused layer formed on an N-type silicon substrate. An oxide film 3, serving as an insulating layer, is formed on the diffused resistors. The oxide film 3 is formed with contact holes. Although not shown in the drawing, a patterning of aluminum wiring is formed on the oxide film 3. A protective film 4 is formed on the oxide film 3 to cover the aluminum wiring. However, instead of using the N-type silicon substrate, it is possible to use a P-type silicon substrate with an N-type layer epitaxially grown on this P-type silicon substrate.

Figure 10:
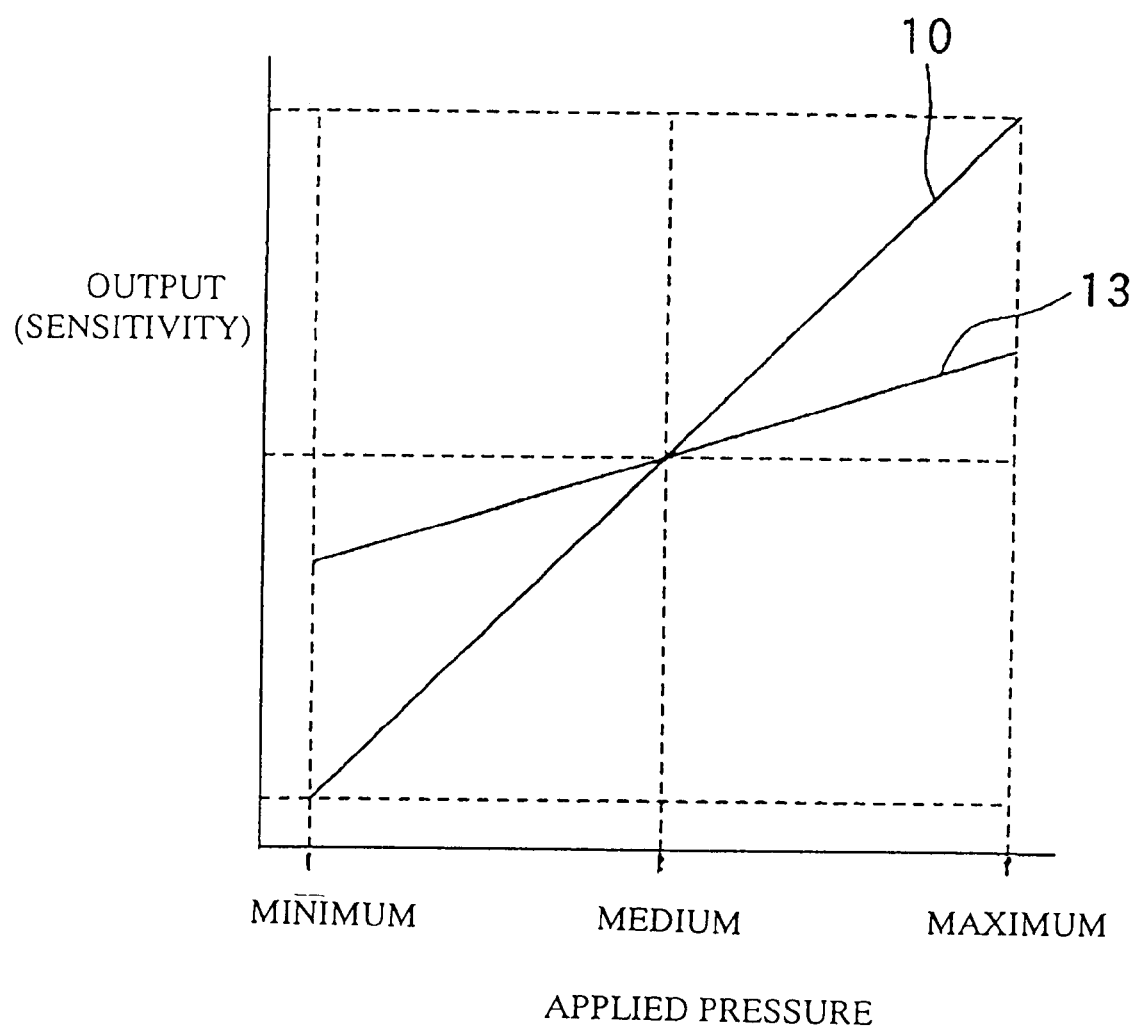
FIG. 10 is a graph showing the output characteristics of two bridge circuits of the pressure sensor in accordance with the sixth embodiment of the present invention.

FIG. 10 is a graph showing the output characteristics of two bridge circuits 10 and 13 responsive to a pressure variation. The output characteristics of two bridge circuits 10 and 13 are dependent on the arrangement of the resistors disposed on the diaphragm portion 2. According to the sixth embodiment, two bridge circuits 10 and 13 are disposed at different positions on the diaphragm portion 2. Thus, the bridge circuits 10 and 13 show mutually different output change characteristics (i.e., sensitivity) in response to a pressure applied on the diaphragm portion 2 as shown in FIG. 10. According to the sixth embodiment, the pressure detecting bridge circuit 10 has a higher sensitivity compared with the failure detecting bridge circuit 13. In other words, the pressure detecting bridge circuit 10 causes a large output change relative to a pressure variation.

Figure 11:
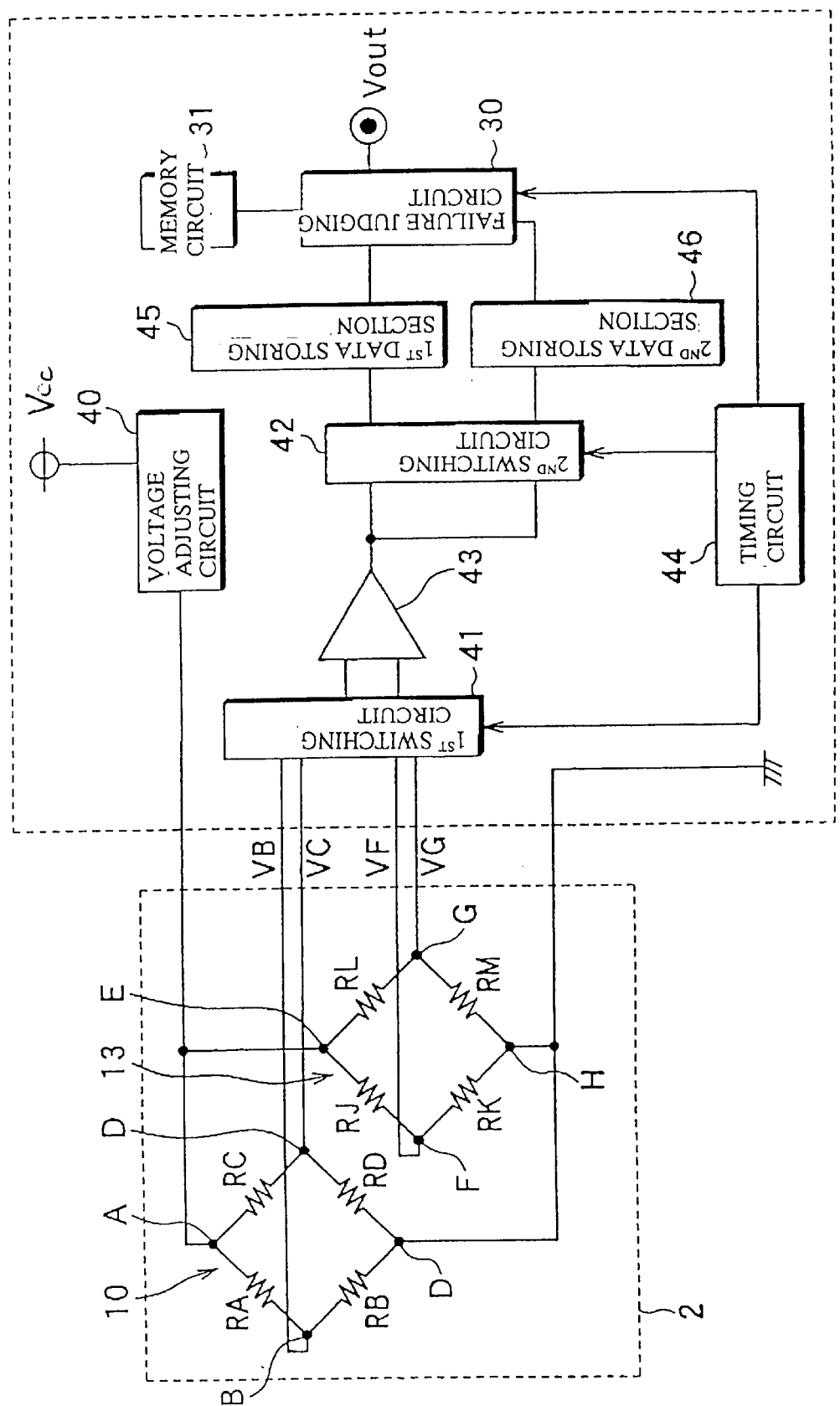
FIG. 11 is a circuit diagram showing the schematic arrangement of a pressure sensor in accordance with a sixth embodiment of the present invention.

FIG. 11 shows a schematic circuit arrangement of the pressure sensor in accordance with the sixth embodiment. As shown in FIG. 11, a voltage adjusting circuit 40 receives a constant voltage Vcc supplied from a constant voltage source and converts it into a predetermined voltage (e.g., 5V). The converted voltage is supplied to the bridge circuits 10 and 13. Two bridge circuits 10 and 13 are connected in parallel with each other and produce midpoint voltages VB and VC and midpoint voltages VF and VG, respectively. A first switching circuit 41 selectively switches the output signals of two bridge circuits 10 and 13. An amplification circuit 43 amplifies the selected output signals produced from the first switching circuit 41. A second switching circuit 42 performs a switching operation for storing the amplified output signals of the bridge circuit 10 into a first data storing section 45 and for storing the amplified output signals of the other bridge circuit 13 into a second data storing section 46. A failure judging circuit (i.e., a diagnosis circuit) 30 compares the output data stored in the first data storing section 45 and the second data storing section 46. The failure judging circuit 30 performs the failure judgement based on the output values of two bridge circuits 10 and 13. To avoid confusion of data, a timing circuit 44 controls the timing of the first and second switching circuits 41 and 42.

The failure detection of the pressure sensor in accordance with the sixth embodiment is performed in the following manner. First, the output voltage change characteristic of the pressure detecting bridge circuit 10 to a pressure applied on the diaphragm portion 2 as well as the output voltage change characteristic of the failure detecting bridge circuit 13 to the pressure applied on the diaphragm portion 2 are stored in advance in a memory circuit 31. To obtain these output voltage change characteristics, it is necessary to measure the output values of the bridge circuit 10 and 13 at least at two pressure points. Considering the nature of output voltage changes of the bridge circuits 10 and 13 which may not be linear, it is desirable to arbitrarily obtain output values at three or more pressure points to obtain accurate change characteristics.

The relationship between the output values of two bridge circuits 10 and 13 is a fixed relationship as shown in FIG. 10. Namely, when the operation of the pressure sensor is normal, the output values of two bridge circuits 10 and 13 at a certain pressure point are always the same respectively. Accordingly, during the operation of the pressure sensor, the output of the pressure detecting bridge circuit 10 is compared with the output of the failure detecting bridge circuit 13. If the measured output relationship is not identical with the memorized relationship stored in the memory circuit 31, it can be judged that the bridge circuit 10 does not operate normally.

According to the sixth embodiment, when any sensor failure is detected, the failure judging circuit 30 forcibly shifts its sensor output to a diagnosis region different from an ordinary output voltage range (e.g., 0.5~4.5 V) and generates an abnormal signal indicating an occurrence of abnormality.

Furthermore, according to a conventional pressure sensor, the gauge resistors RA to RD constituting the pressure detecting bridge circuit are disposed on the diaphragm portion along two perpendicular directions with two resistors on each direction. The remaining portion is a unused region. However, according to the sixth embodiment, the failure detecting circuit 13 is provided in this unused region of the diaphragm portion. Thus, it becomes possible to provide a pressure sensor having the capability of detecting a sensor failure with a sensing portion whose size is substantially identical with that of the conventional pressure sensor. Thus, the pressure sensor can be downsized.

Figure 12:
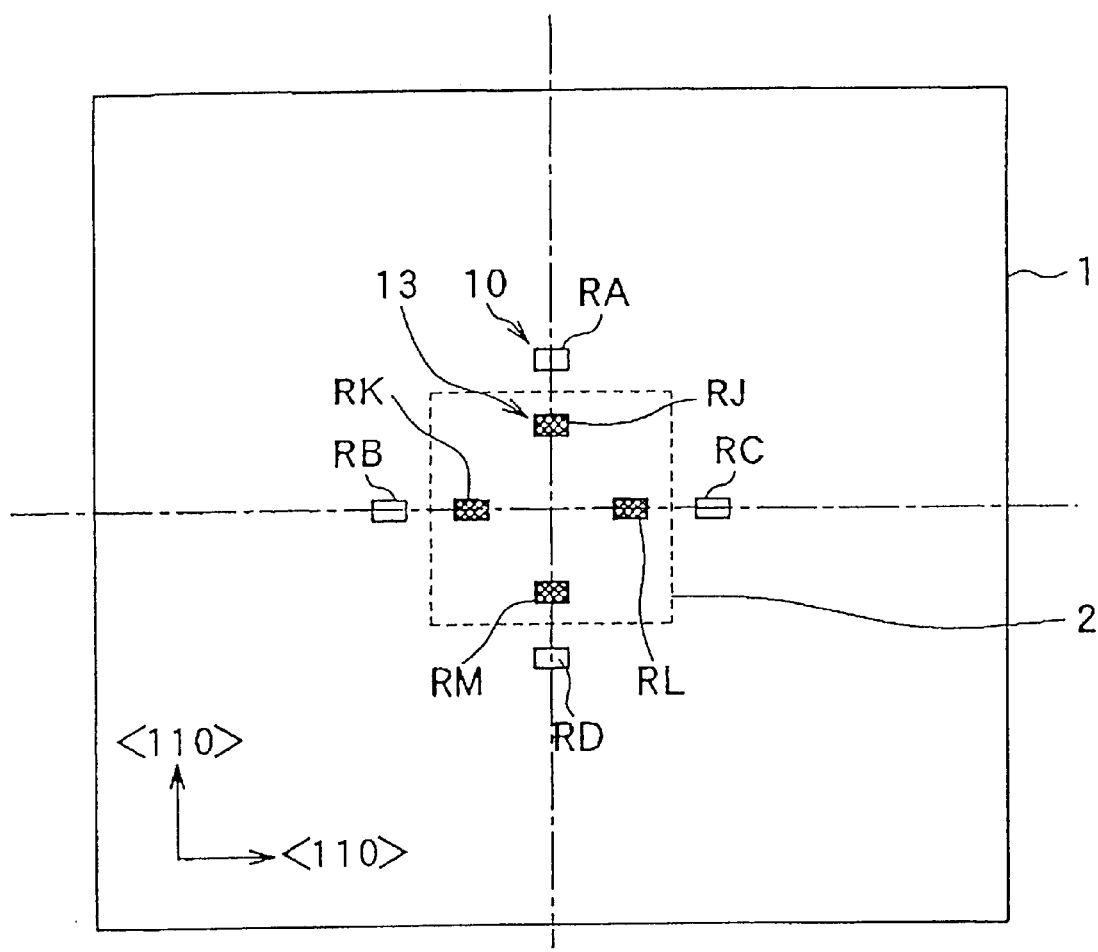
FIG. 12 is a plan view showing a diaphragm portion of a modified pressure sensor in accordance with the sixth embodiment of the present invention.

Although the above-described sixth embodiment uses a silicon substrate having a (110) surface, it is possible to use a silicon substrate having a (100) surface shown in FIG. 12. According to the (100) surface, two <110> crystal axes exist perpendicularly to each other. When the silicon substrate has a (110) surface, it is necessary to locate respective resistors at mutually different positions in the stress distribution, as shown in FIG. 9A. However, when the silicon substrate has a (100) surface, respective resistors can be equally disposed at the same positions in the stress distribution. Therefore, it becomes possible to equalize the temperature characteristics of respective resistors, for example, in the degree of deformation of the silicon substrate due to a temperature change as well as in the degree of change of a generated stress due to a temperature change.

Seventh Embodiment

Figure 13A:
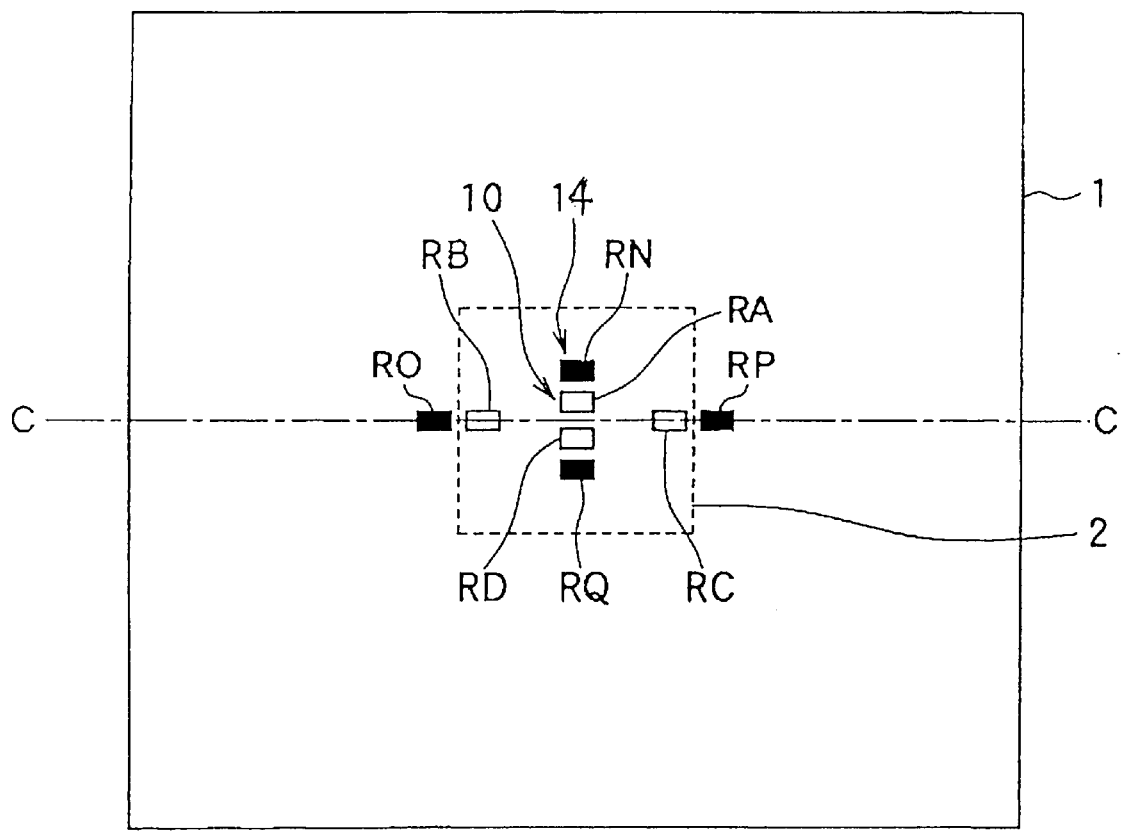
FIG. 13A is a plan view showing a diaphragm portion of a pressure sensor in accordance with a seventh embodiment of the present invention.
Figure 13B:
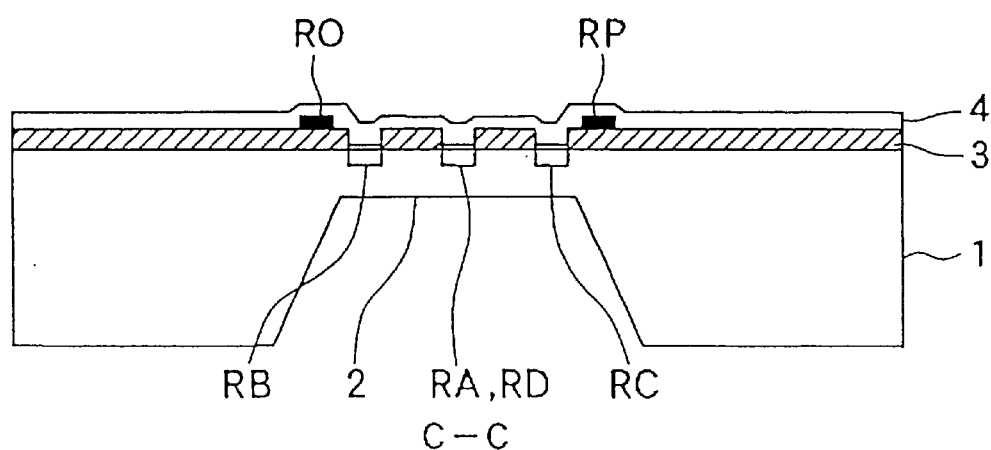
FIG. 13B is a cross-sectional view showing the diaphragm portion of the pressure sensor taken along a line C—C of FIG. 13A.

A seventh embodiment of the present invention will be explained with reference to FIGS. 13A and 13B. A pressure sensor of the seventh embodiment differs from the pressure sensor of the sixth embodiment in that the failure detecting bridge circuit 14 is formed by four thin-film resistors. The components similar to those disclosed in the sixth embodiment are denoted by the same reference numerals and will not be explained.

As shown in FIGS. 1 3A and 1 3B, the pressure sensor of the seventh embodiment comprises four diffused resistors RA~RD formed on a silicon substrate. An oxide film 3, serving as an insulating layer, is formed on the diffused resistors. Four thin-film resistors RN~RQ, for example made of a polysilicon, are formed on the oxide film 3. The four diffused resistors RA~RD constitute a pressure detecting bridge circuit 10. The four thin-film resistors RN~RQ constitute a failure detecting circuit. The thin-film resistors RN~RQ are located far from the center of the diaphragm portion 2 than the diffused resistors RA~RD.

The thin-film resistor has a low gauge factor compared with the diffused resistor. Thus, the pressure detecting circuit 10 and the failure detecting circuit 14 have mutually different output characteristics. In other word, according to this embodiment, the pressure detecting circuit 10 produces a higher output in response to a pressure variation. Accordingly, like the sixth embodiment, the seventh embodiment can detect an abnormal output value of the pressure sensor based on a comparison between the output of the pressure detecting bridge circuit and the output of the failure detecting bridge circuit.

Although the diffused resistors and the thin-film resistors are disposed at different positions, the seventh embodiment allows to overlap the diffused resistors and the thin-film resistors in a layer structure. Even in such a layer structure, the pressure detecting circuit and the failure detecting circuit have mutually different output characteristics due to difference of the gauge factors thereof.

Eighth Embodiment

Figure 14A:
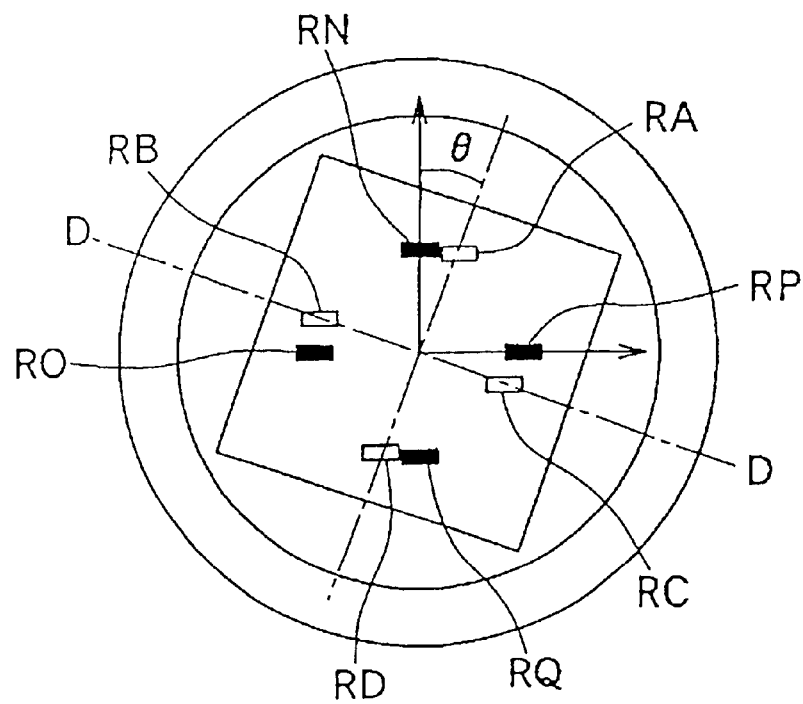
FIG. 14A is a plan view showing a diaphragm portion of a pressure sensor in accordance with an eighth embodiment of the present invention.
Figure 14B:
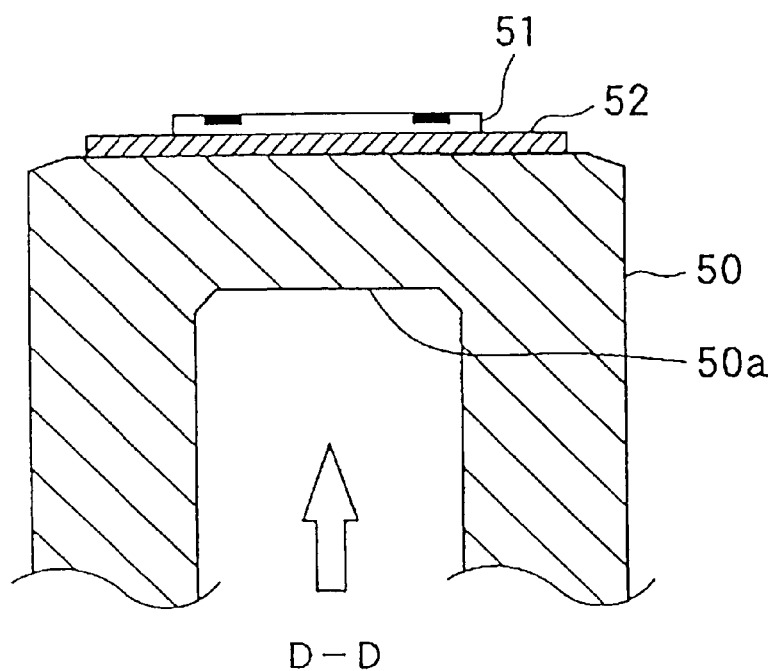
FIG. 14B is a cross-sectional view showing the diaphragm portion of the pressure sensor taken along a line D—D of FIG. 14.

Next, an eighth embodiment of the present invention will be explained with reference to FIGS. 14A and 14B. A pressure sensor of the eighth embodiment uses a metal diaphragm. As shown in FIGS. 14A and 14B, the pressure sensor comprises a metal stem 50 having a circular diaphragm portion 50a, and a silicon substrate 51 bonded on the diaphragm portion 50a. The pressure sensor of the eighth embodiment detects a pressure based on a deformation of the diaphragm 50a and a silicon substrate 51.

The metal stem 50 is configured into a hollow cylindrical shape and made of a metal having a low thermal expansion coefficient (such as covar etc. having a thermal expansion coefficient similar to that of silicon). The metal stem 50 receives a pressurized medium entered from one end as shown by an arrow. Thus, a pressure of the pressurized medium is applied on the diaphragm portion 50a formed at the other end of the stem 50.

The silicon substrate 51 is fixed to the diaphragm portion 50a via a glass layer 52. The glass layer 52 is made of a low melting point glass. The silicon substrate 51 has a (100) surface. Four diffused resistors RA~RD constituting a pressure detecting bridge circuit and four thin-film resistors RN~RQ constituting a failure detecting bridge circuit are formed on the silicon substrate 51. The diffused resistors RA~RD are angularly offset by an angle θ from the thin-film resistors RN~RQ.

Accordingly, like the above-described embodiments, the pressure sensor of the eighth embodiment can detect a sensor failure based on a comparison between the outputs of two bridge circuits which have mutually different output change characteristics.

Ninth Embodiment

Figure 15A:
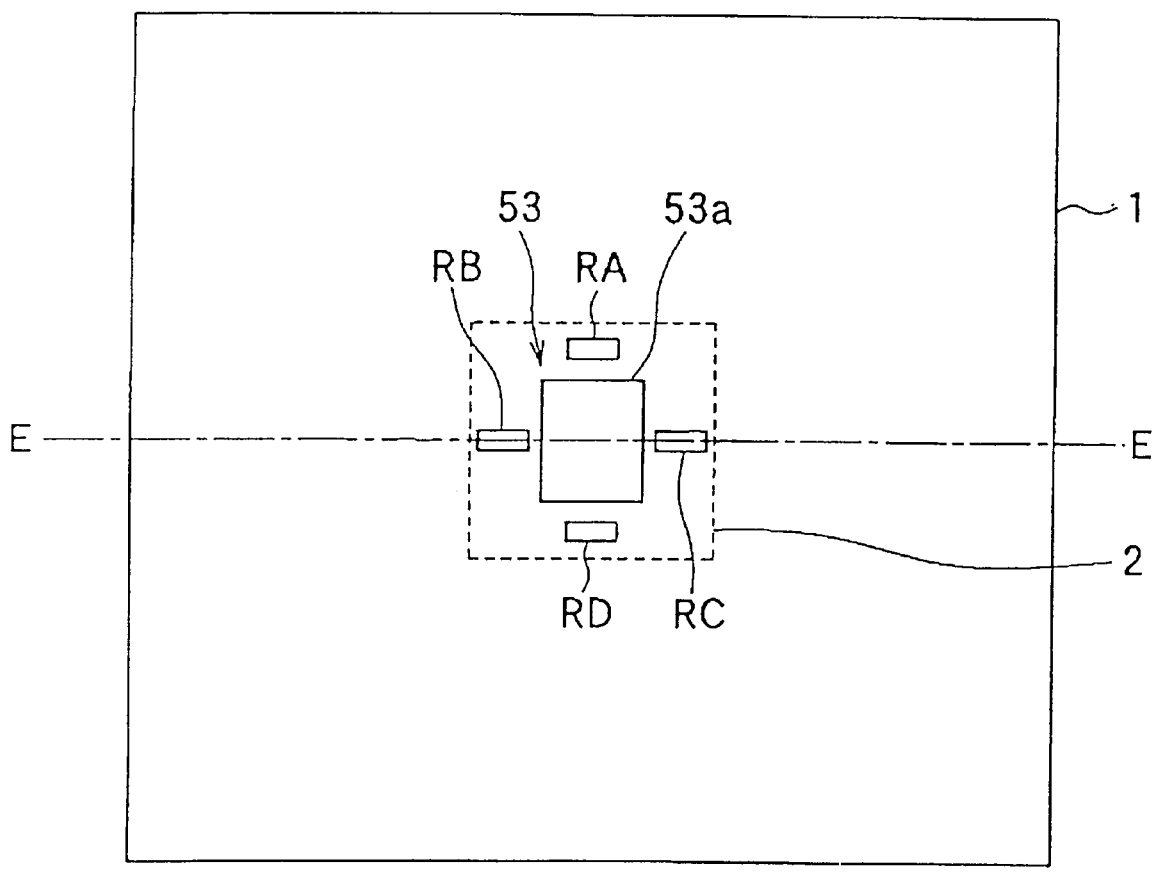
FIG. 15A is a plan view showing a diaphragm portion of a pressure sensor in accordance with a ninth embodiment of the present invention.
Figure 15B:
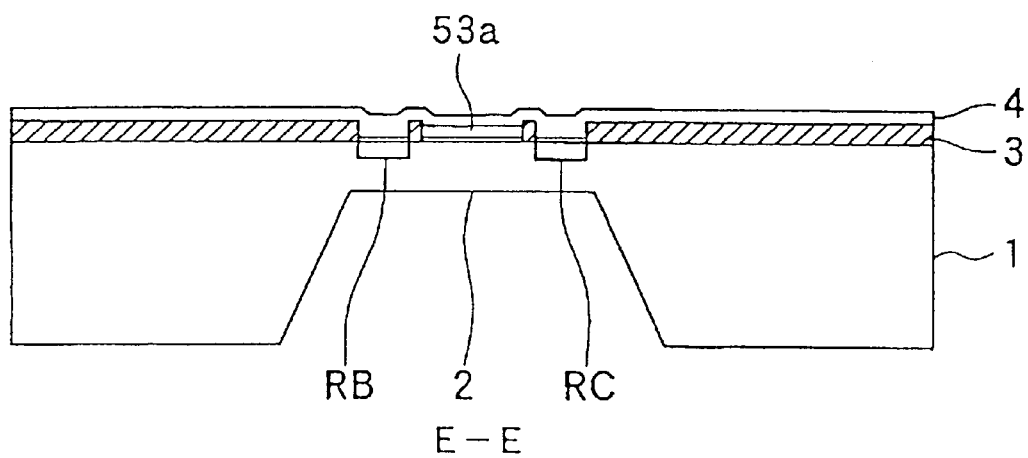
FIG. 15B is a cross-sectional view showing the diaphragm portion of the pressure sensor taken along a line E—E of FIG. 15A.

Next, a ninth embodiment of the present invention will be explained with reference to FIGS. 15A and 15B. FIG. 15A is a plan view showing a diaphragm portion of a pressure sensor of the ninth embodiment. FIG. 15B is a crosssectional view of the pressure sensor taken along a line E—E of FIG. 15A. The pressure sensor of the ninth embodiment differs from the pressure sensors of the above-described embodiment in that the failure detecting circuit is constituted by a capacitive sensor. The components similar to those disclosed in the abovedescribed embodiments are denoted by the same reference numerals and will not be explained.

As shown in FIG. 15A, the pressure sensor of the ninth embodiment comprises a capacitive sensor 53 serving as a failure detecting circuit in addition to four diffused resistors RA~RD constituting a pressure detecting circuit 10. The capacitive sensor 53 is provided at a central region of a diaphragm portion 2 of a silicon substrate 1. The electrical connection of the capacitive sensor 53 is parallel to that of the pressure detecting circuit 10.

The capacitive sensor 53 measures a pressure based on a change of an electrostatic capacitance between two electrodes. As shown in FIG. 15B, a diaphragm portion 2 is formed on a silicon substrate 1. A thin-film electrode 53a, made of a polycrystal silicon, is disposed in a confronting relationship with the diaphragm portion 2. A capacitor is formed between the thin-film electrode 53a and the diaphragm portion 2. When a pressure is applied on the diaphragm portion 2, the clearance between the thin-film electrode 53a and the diaphragm portion 2 decreases. In other words, the capacitance between the thin-film electrode 53a and the diaphragm portion 2 increases. The capacitive sensor 53 generates an electric signal responsive to a detected capacitance value.

In general, the capacitive sensor 53 can generate a large output compared with the bridge circuit 10 constituted by the diffused resistors. Thus, the capacitive sensor 53 and the pressure detecting circuit 10 have mutually different output characteristics.

Accordingly, like the above-described embodiments, the ninth embodiment can detect a sensor failure based on a comparison between the output of the pressure detecting bridge circuit 10 and the output of the capacitive sensor 53.

Tenth Embodiment

Figure 16A:
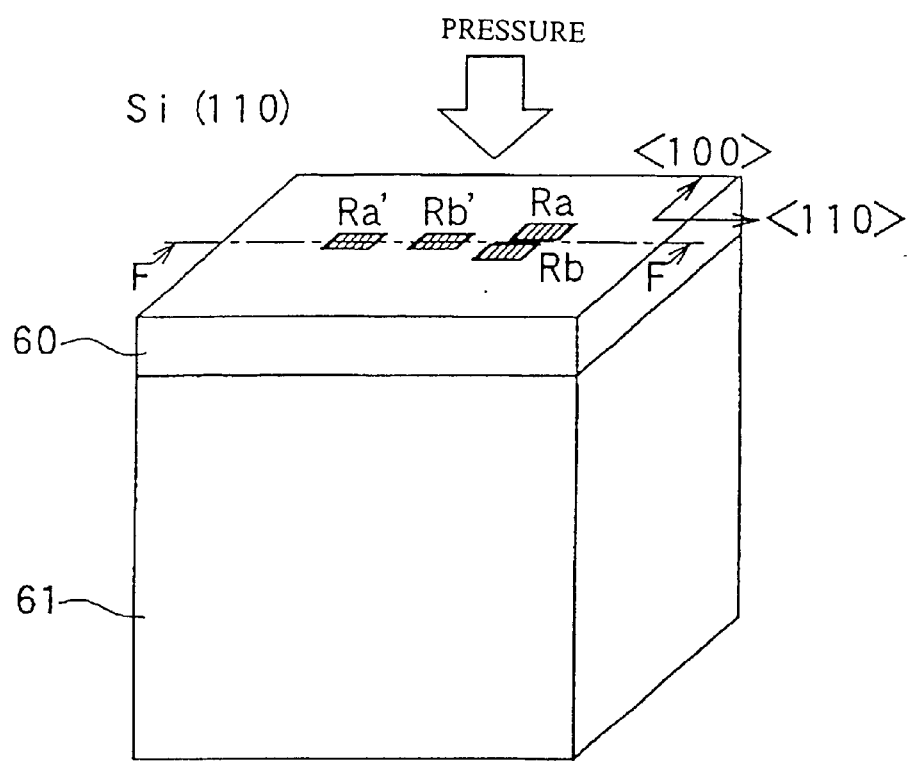
FIG. 16A is a perspective view showing a pressure sensor in accordance with a tenth embodiment of the present invention.
Figure 16B:
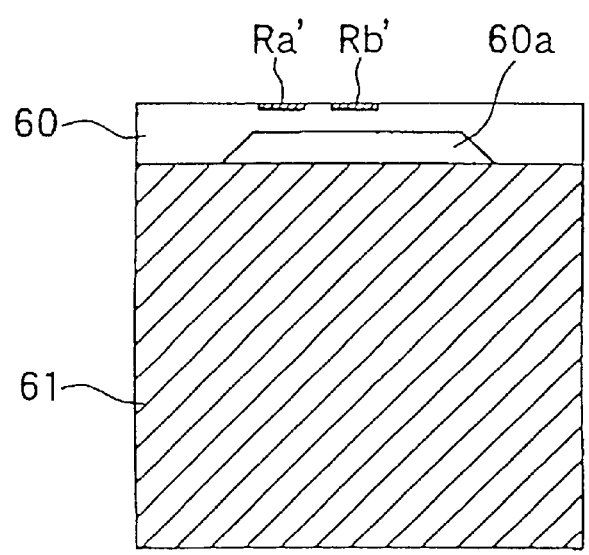
FIG. 16B is a cross-sectional view showing the diaphragm portion of the pressure sensor taken along a line F—F of FIG. 16A.
Figure 17A:
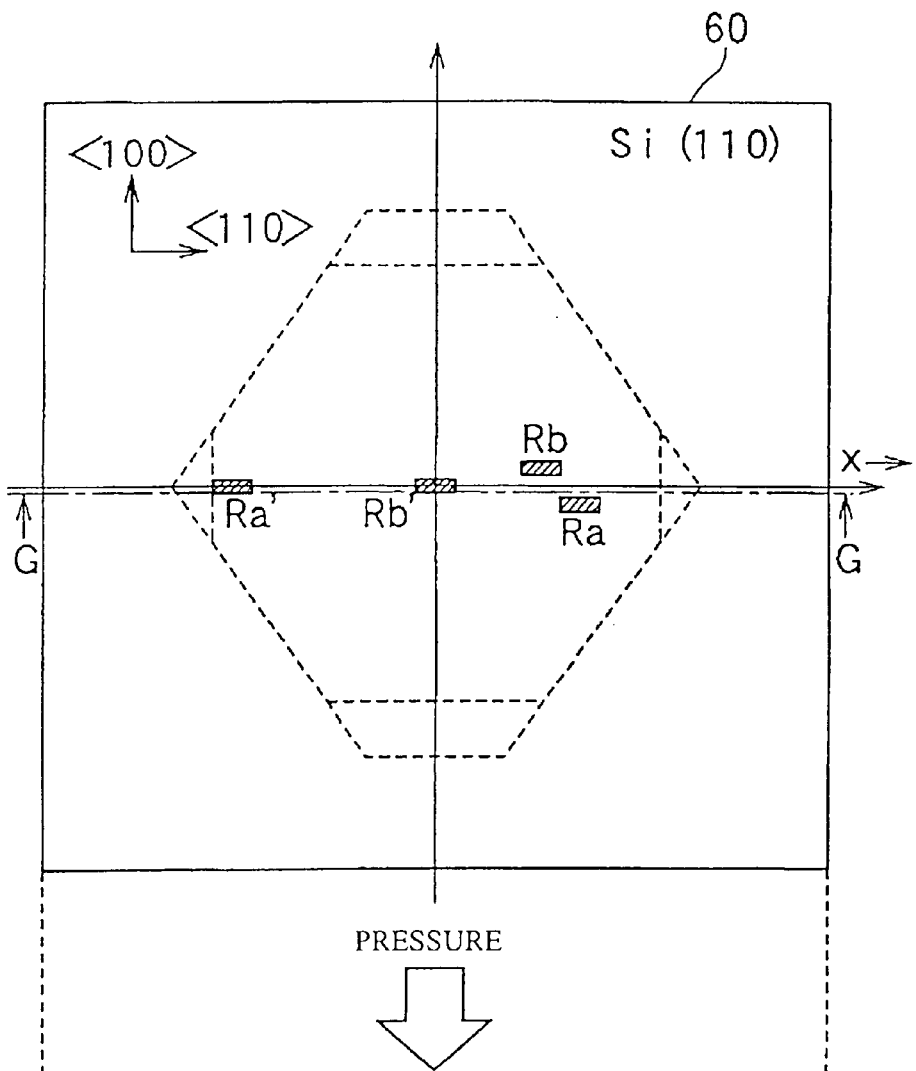
FIG. 17A is a plan view showing a diaphragm portion of a pressure sensor in accordance with a tenth embodiment of the present invention.
Figure 17B:
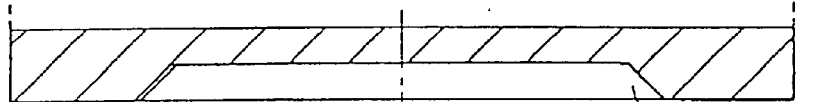
FIG. 17B is a cross-sectional view showing the diaphragm portion of the pressure sensor taken along a line G—G of FIG. 17A.
Figure 17C:
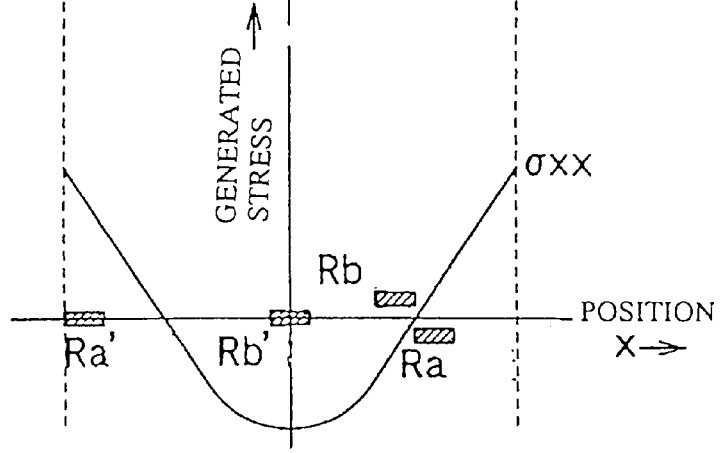
FIG. 17C is a graph showing the relationship between the position of diffused resistor and a generated stress in accordance with the tenth embodiment of the present invention.

Next, a tenth embodiment of the present invention will be explained with reference to FIGS, 16A, 16B and FIGS. 17A, 17B and 17C. FIG. 16A is a perspective view showing a pressure sensor of the tenth embodiment. FIG. 16B is a cross-sectional view of the pressure sensor taken along a line F—F of FIG. 16A. FIGS. 17A to 17C show the relationship between the position of the diff-used resistors and a stress generated by the pressure. FIG. 17A is a front view showing the pressure sensor of the tenth embodiment. FIG. 17B is a cross-sectional view taken along a line G—G of FIG. 17A. FIG. 17C is a view showing an x-directional component axx of a generated stress on an x axis of the diaphragm surface when a pressure is applied on the diaphragm portion.

The pressure sensor of the tenth embodiment differs from the pressure sensor of the sixth embodiment in that a reference pressure chamber 60a is formed by adhering a sensor chip 60 on a pedestal 61. The pressure detecting bridge circuit is a half bridge circuit consisting of two diffused resistors Ra and Rb. Similarly, the failure detecting bridge circuit is a half bridge circuit consisting of two diffused resistors Ra' and Rb'.

The diffused resistors Ra, Rb and Ra', Rb' are formed on a surface layer of the sensor chip 60 constituted by a silicon substrate having a (110) surface. Both of the diffused resistors Ra and Rb are disposed in the vicinity of a midpoint between a peripheral end and the center of the diaphragm portion. More specifically, as shown in FIG. 17C, the diffused resistor Ra is located in the vicinity of a specific point where a positive change of the resistance is minimized, i.e., a specific point where the tensile stress is minimized. The diffused resistor Rb is located in the vicinity of a specific point where a negative change of the resistance is minimized, i.e., a specific point where the compressive stress is minimized. Meanwhile, the diffused resistor Ra' is located near the peripheral edge of the diaphragm portion 2, and the diffused resistor Rb' is located at the center of the diaphragm portion 2. More specifically, as shown in FIG. 17C, the diffused resistor Ra' is located in the vicinity of a specific point where a positive change of the resistance is maximized, i.e., a specific point where the tensile stress is maximized. The diffused resistor Rb is located in the vicinity of a specific point where a negative change of the resistance is maximized, i.e., a specific point where the compressive stress is maximized.

According to the arrangement of this embodiment, the difflused resistors Ra and Rb cause small resistance changes in response to a pressure applied to the diaphragm portion. Thus, the pressure detecting bridge circuit has a low sensitivity. On the other hand, the diffused resistors Ra' and Rb' cause large resistance changes in response to a pressure applied to the diaphragm portion. Thus, the failure detecting bridge circuit has a high sensitivity.

In this manner, this embodiment provides a high-sensitive bridge circuit independent of the pressure detecting bridge to detect a sensor failure caused by a defective airtightness of the reference pressure chamber 60a when the sensor chip 60 peeled off the pedestal 61. Accordingly, the low-sensitive bridge circuit can be used for generating an output signal in accordance with a product specification, while the high-sensitive bridge circuit can be used for the failure detection.

Figure 18:
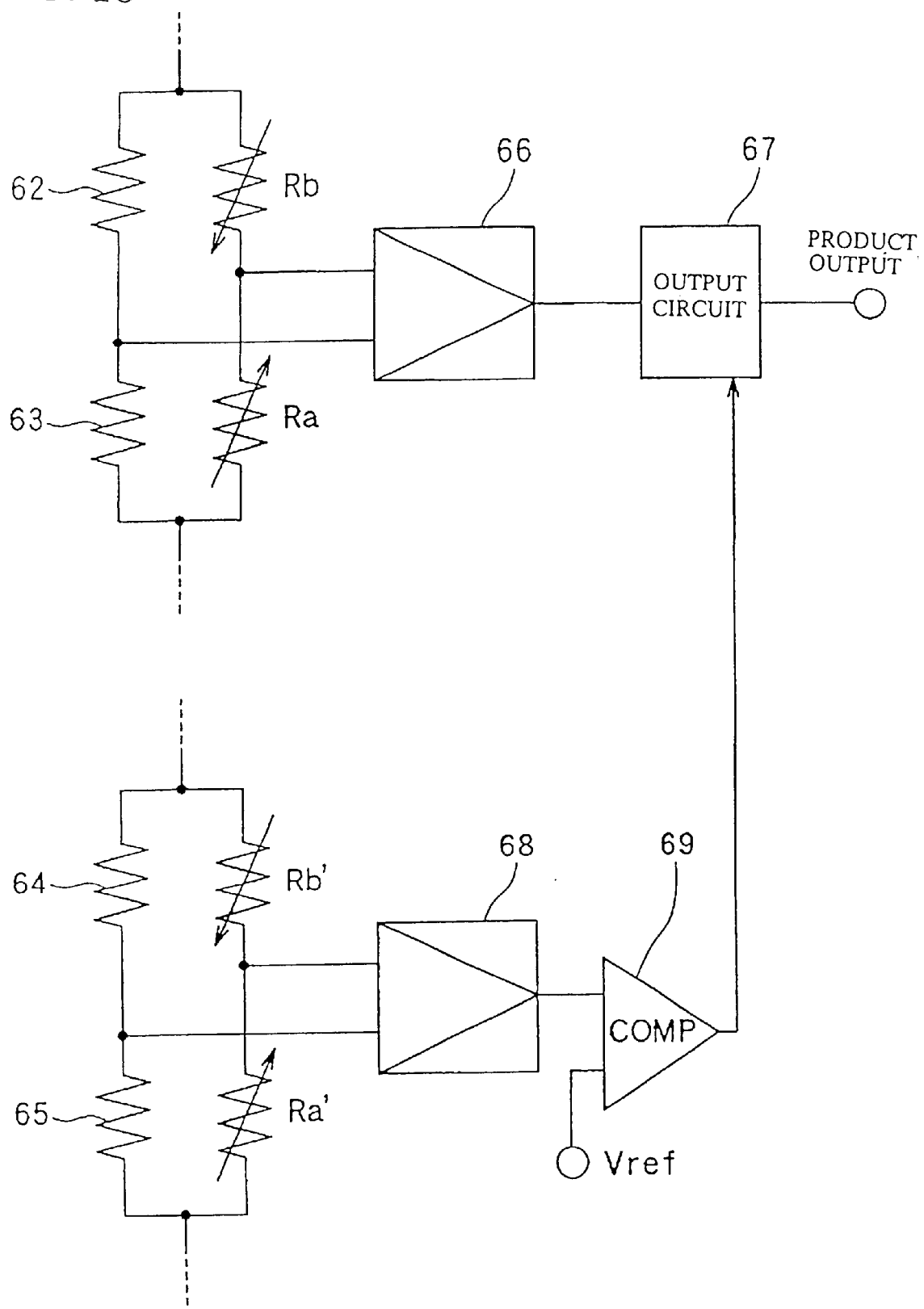
FIG. 18 is a circuit diagram showing the schematic diagram of the pressure sensor in accordance with the tenth embodiment of the present invention.

FIG. 18 shows a schematic circuit arrangement of the pressure sensor of the tenth embodiment. The pressure sensor comprises a pressure detecting bridge circuit consisting of two diffused resistors Ra and Rb and dummy resistors 62 and 63. Furthermore, the pressure sensor comprises a fail detecting bridge circuit consisting of two difflused resistors Ra' and Rb' and dummy resistors 64 and 65. The dummy resistors 62, 63, 64 and 65 are located at portions different from the diaphragm portion.

A voltage difference of midpoints of the pressure detecting bridge circuit is amplified by an amplification circuit 66 having a temperature compensating capability. An output of the amplification circuit 66 is outputted as a sensor output via an output circuit 67. A voltage difference of midpoints of the failure detecting bridge circuit is amplified by an amplification circuit 68 having a temperature compensating capability. A comparing circuit 69 compares an output of the amplification circuit 68 with a reference voltage Vref. A comparison result of the comparing circuit 69 is entered into the output circuit 67. When the output of the failure detecting circuit is abnormal, the comparing circuit 69 sends a failure signal to the output circuit 67. In response to the failure signal, the output circuit 67 forcibly shifts its output to a diagnosis region different from an ordinary output voltage range and generates an abnormal signal indicating an occurrence of abnormality.

As described above, the tenth embodiment comprises two bridge circuits having mutually different sensitivities. The low-sensitive bridge circuit is used for the pressure detection. The high-sensitive bridge circuit is used for the failure detection. Thus, the tenth embodiment can surely detect a sensor failure due to defective airtightness of the reference pressure chamber 60a.

Eleventh Embodiment

Figure 19A:
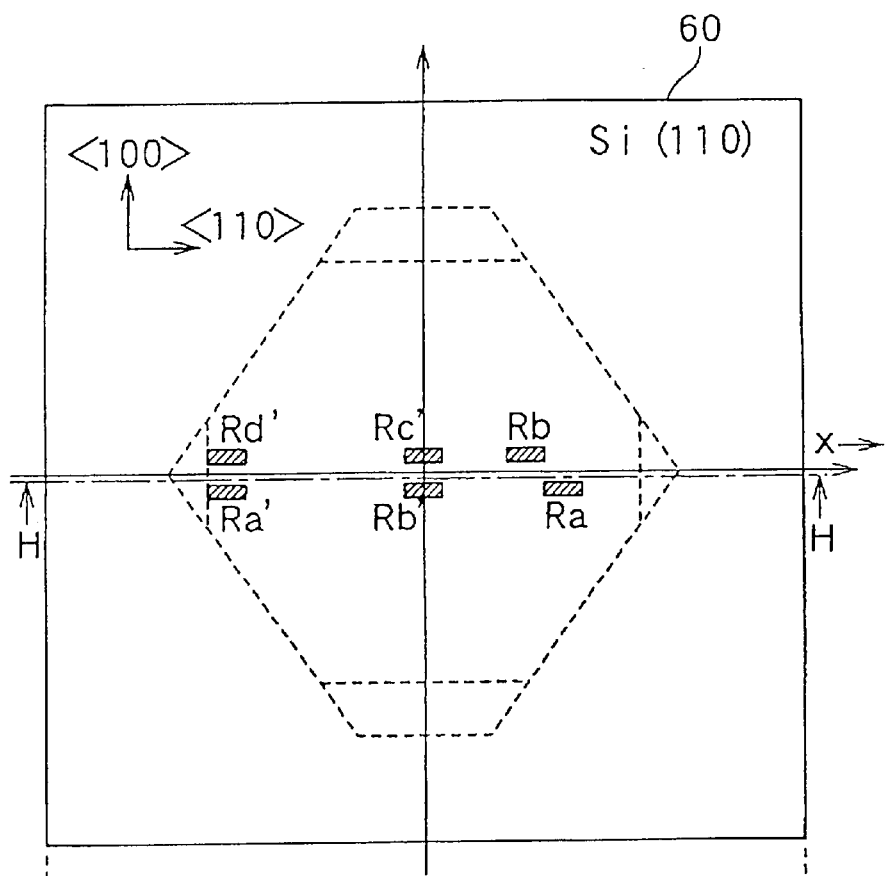
FIG. 19A is a plan view showing a diaphragm portion of a pressure sensor in accordance with an eleventh embodiment of the present invention.
Figure 19B:
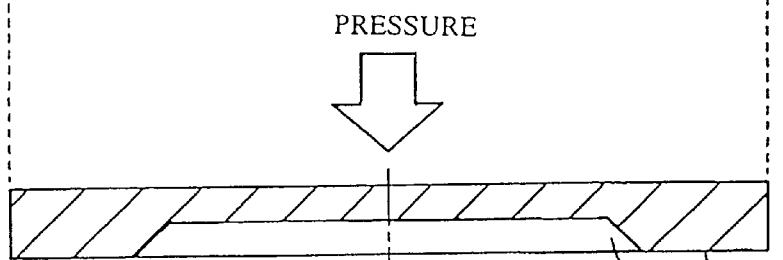
FIG. 19B is a cross-sectional view showing the diaphragm portion of the pressure sensor taken along a line H—H of FIG. 19A.
Figure 19C:
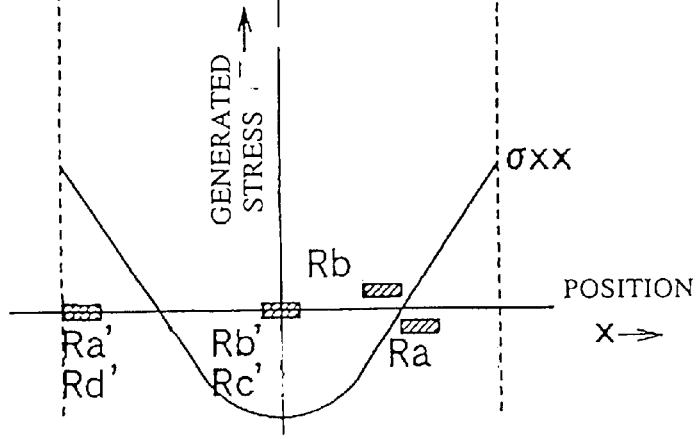
FIG. 19C is a graph showing the relationship between the position of diffused resistor and a generated stress in accordance with the eleventh embodiment of the present invention.
Figure 20:
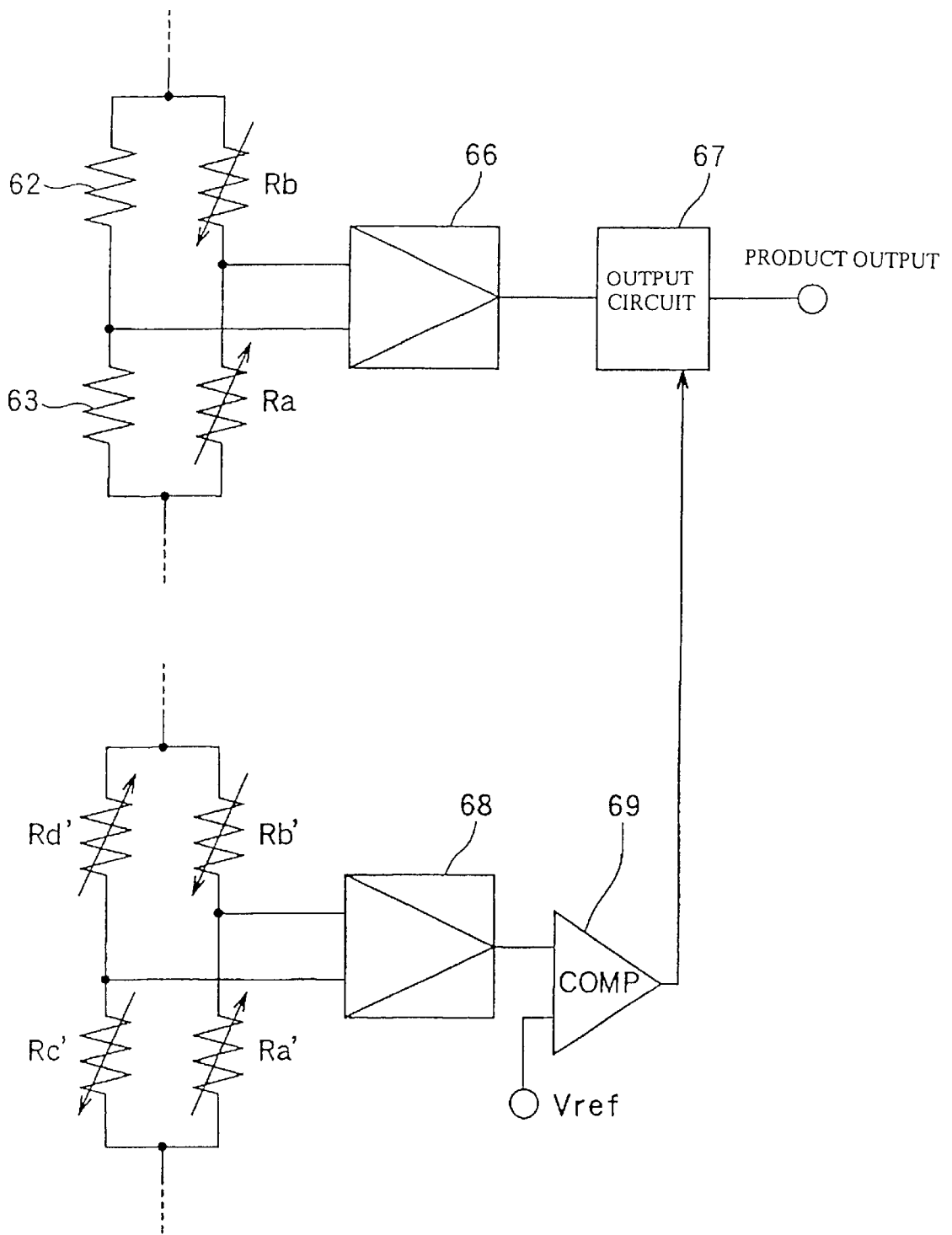
FIG. 20 is a circuit diagram showing the schematic diagram of the pressure sensor in accordance with the eleventh embodiment of the present invention.

An eleventh embodiment of the present invention will be explained with reference to FIGS. 19A, 19B, 19C and FIG. 20. FIG. 19A is a frontview showing a pressure sensor of the eleventh embodiment. FIG. 19B is a cross-sectional view taken along a line H-H of FIG. 19A. FIG. 19C is a view showing an x-directional component σxx of a generated stress on an x axis of the diaphragm surface when a pressure is applied on the diaphragm portion. FIG. 20 shows a schematic circuit arrangement of the pressure sensor of the eleventh embodiment.

The pressure sensor of the eleventh embodiment differs from the pressure sensor of the tenth embodiment in that the failure detecting circuit is constituted by a full bridge circuit consisting of four diffused resistors Ra'~Rd'.

In this case, the diffused resistors Rb' and Rc' are formed in a predetermined positional relationship so as to obtain mutually corresponding resistance changes (i.e., compressive stresses). The diffused resistors Ra' and Rd' are formed in a predetermined positional relationship so as to obtain mutually corresponding resistance changes (i.e., tensile stresses).

In this manner, the eleventh embodiment comprises the full-bridge circuit consisting of four diffused resistors Ra'~Rd' for failure detection. Thus, it becomes possible to improve the sensitivity of the failure detecting bridge circuit.

Twelfth Embodiment

Figure 21A:
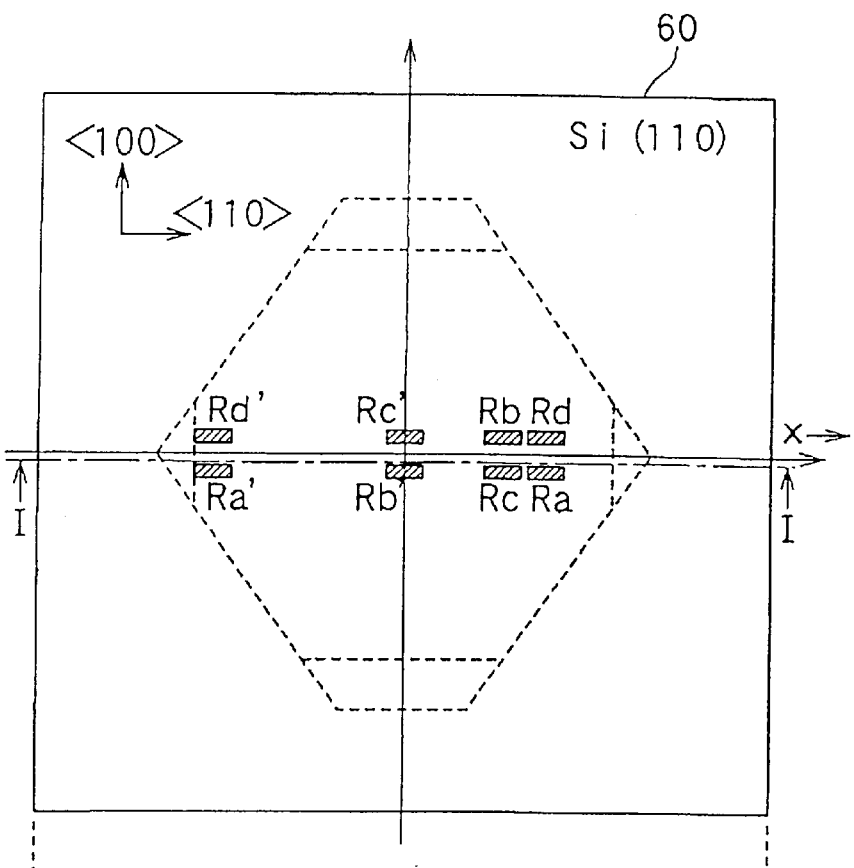
FIG. 21A is a plan view showing a diaphragm portion of a pressure sensor in accordance with a twelfth embodiment of the present invention.
Figure 21B:
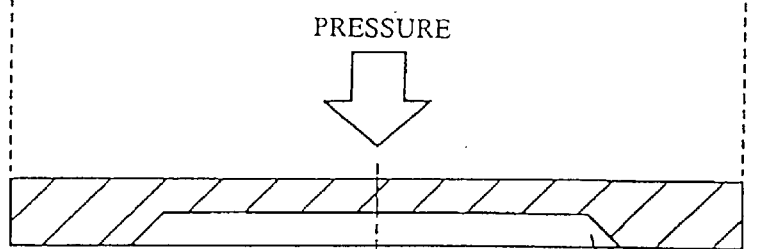
FIG. 21B is a cross-sectional view showing the diaphragm portion of the pressure sensor taken along a line I—I of FIG. 21A.
Figure 21C:
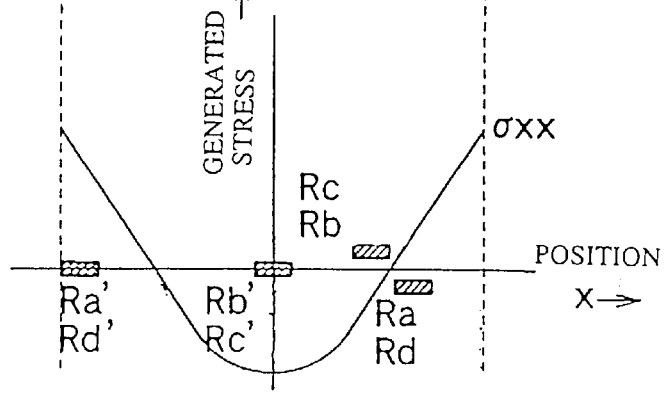
FIG. 21C is a graph showing the relationship between the position of diffused resistor and a generated stress in accordance with the twelfth embodiment of the present invention.
Figure 22:
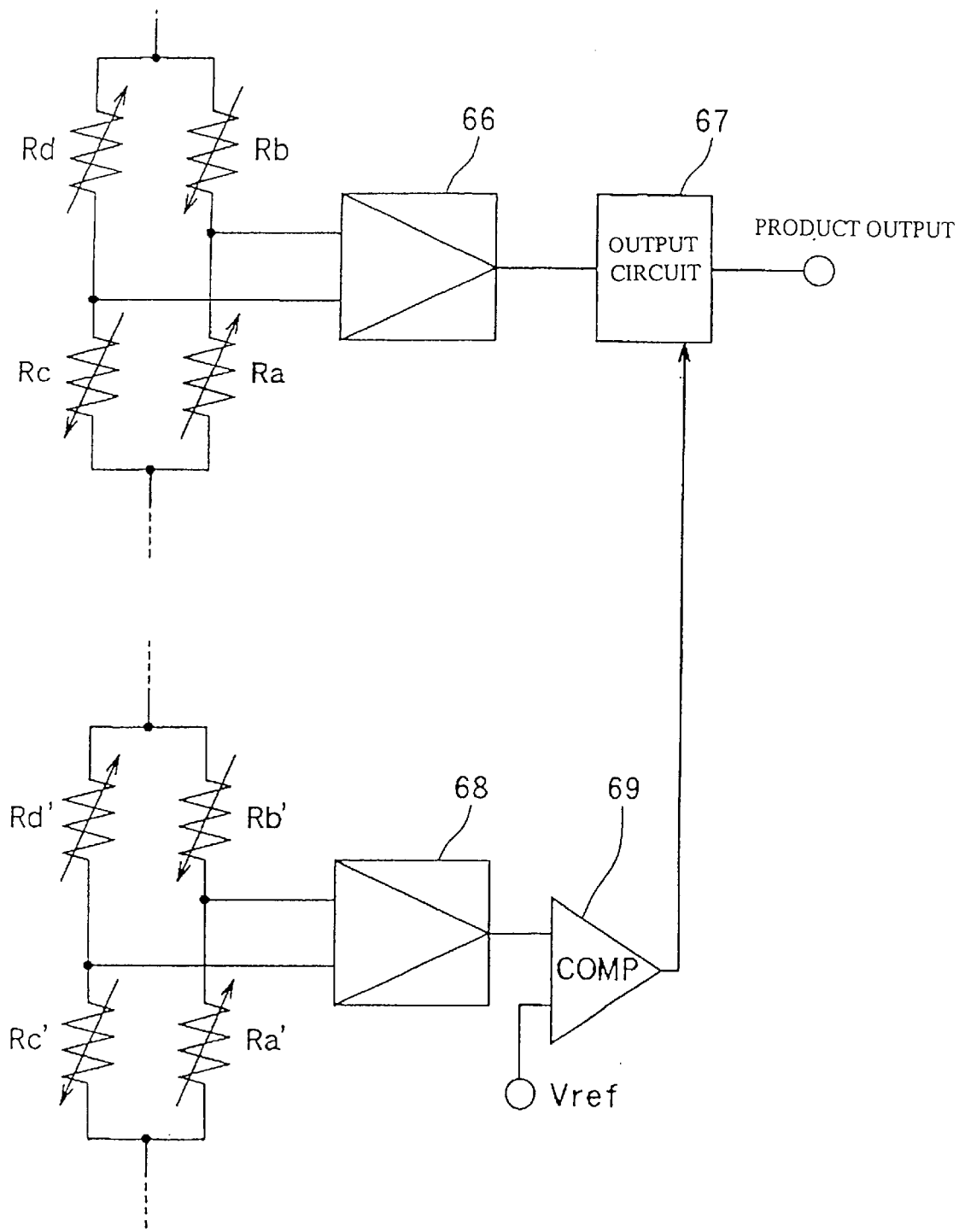
FIG. 22 is a circuit diagram showing the schematic diagram of the pressure sensor in accordance with the twelfth embodiment of the present invention.

A twelfth embodiment of the present invention will be explained with reference to FIGS. 21A, 21B, 21C and FIG. 22. FIG. 21A is a front view showing a pressure sensor of the twelfth embodiment. FIG. 21B is a cross-sectional view taken along a line I—I of FIG. 21A. FIG. 21C is a view showing an x-directional component σxx of a generated stress on an x axis of the diaphragm surface when a pressure is applied on the diaphragm portion. FIG. 22 shows a schematic circuit arrangement of the pressure sensor of the twelfth embodiment.

The pressure sensor of the twelfth embodiment differs from the pressure sensor of the eleventh embodiment in that the pressure detecting circuit is constituted by a full bridge circuit consisting of four diffused resistors Ra~Rd.

In this case, the diffused resistors Rb and Rc are formed in a predetermined positional relationship so as to obtain mutually corresponding resistance changes (i.e., compressive stresses). The diffused resistors Ra and Rd are formed in a predetermined positional relationship so as to obtain mutually corresponding resistance changes (i.e., tensile stresses).

In this manner, the twelfth embodiment comprises the full-bridge circuit consisting of four diffused resistors Ra~Rd for pressure detection. Thus, it becomes possible to improve the sensitivity of the pressure detecting bridge circuit.

Thirteenth Embodiment

Figure 23A:
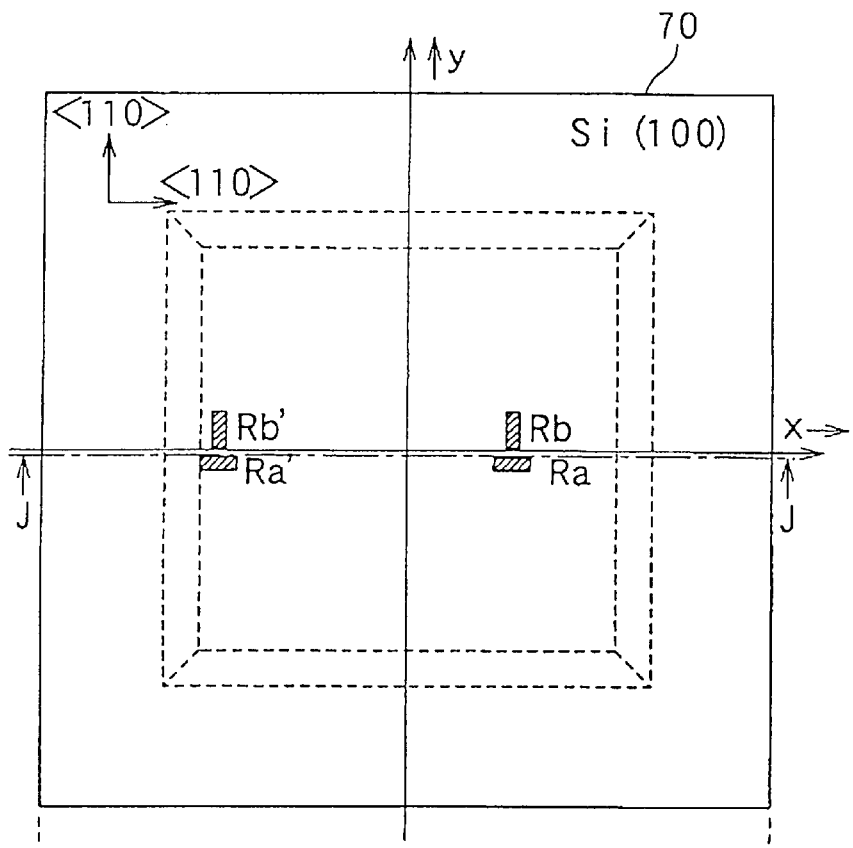
FIG. 23A is a plan view showing a diaphragm portion of a pressure sensor in accordance with a thirteenth embodiment of the present invention.
Figure 23B:
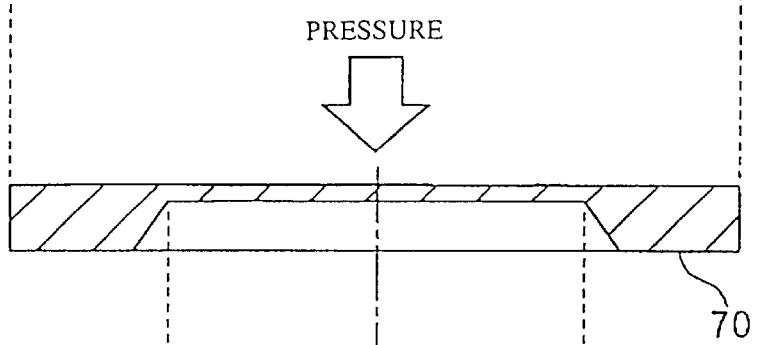
FIG. 23B is a cross-sectional view showing the diaphragm portion of the pressure sensor taken along a line J—J of FIG. 23A.
Figure 23C:
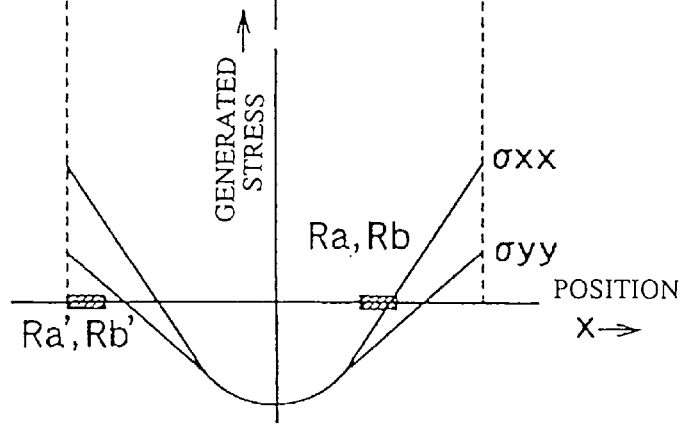
FIG. 23C is a graph showing the relationship between the position of diffused resistor and a generated stress in accordance with the thirteenth embodiment of the present invention.

A thirteenth embodiment of the present invention will be explained with reference to FIGS. 23A, 23B and 23C. FIG. 23A is a front view showing a pressure sensor of the thirteenth embodiment. FIG. 23B is a cross-sectional view taken along a line J—J of FIG. 23A. FIG. 23C is a view showing an x-directional component σxx and a y-directional component σyy of a generated stress on an x axis of the diaphragm surface when a pressure is applied on the diaphragm portion.

The pressure sensor of the thirteenth embodiment differs from the pressure sensor of the tenth embodiment in that diffused resistors Ra, Ra' and diffused resistors Rb, Rb' are formed on a surface layer of a sensor chip 70 made of a silicon substrate having a (100) surface and the longitudinal directions of diffused resistors Ra, Ra' and differentiated from those of the diffused resistors Rb, Rb'. The longitudinal direction is a current flow direction.

The piezo-resistance effect on the Si(100) surface is known by the nature that a resistance change amount $\Delta R$ is proportional to a stress difference ($\sigma xx - \sigma yy$). When $\Delta R$ represents a resistance change amount of the diffused resistors Ra, Ra' extending in the x direction, a resistance change amount of the other diffused resistors Rb, Rb' extending in the y direction is expressed by $-\Delta R$. Thus, the diffused resistors Ra, Ra' and the diffused resistors Rb, Rb' show the change characteristics different from each other even if the same pressure is applied.

Accordingly, the diffused resistor Ra extending in the x direction and the diffused resistor Rb extending in the y direction are located at a portion where the difference between σxx–σyy is minimized. On the other hand, the diffused resistor Ra' extending in the x direction and the diffused resistor Rb' extending in the y direction are located at a portion where the difference between σxx–σyy is maximized.

With this arrangement, the thirteenth embodiment provides a low-sensitive pressure detecting bridge circuit constituted by the difflused resistors Ra and Rb and a high-sensitive failure detecting bridge circuit constituted by the diffused resistors Ra' and Rb'. Accordingly, it becomes possible to have the same effects as those of the tenth embodiment.

Fourteenth Embodiment

Figure 24A:
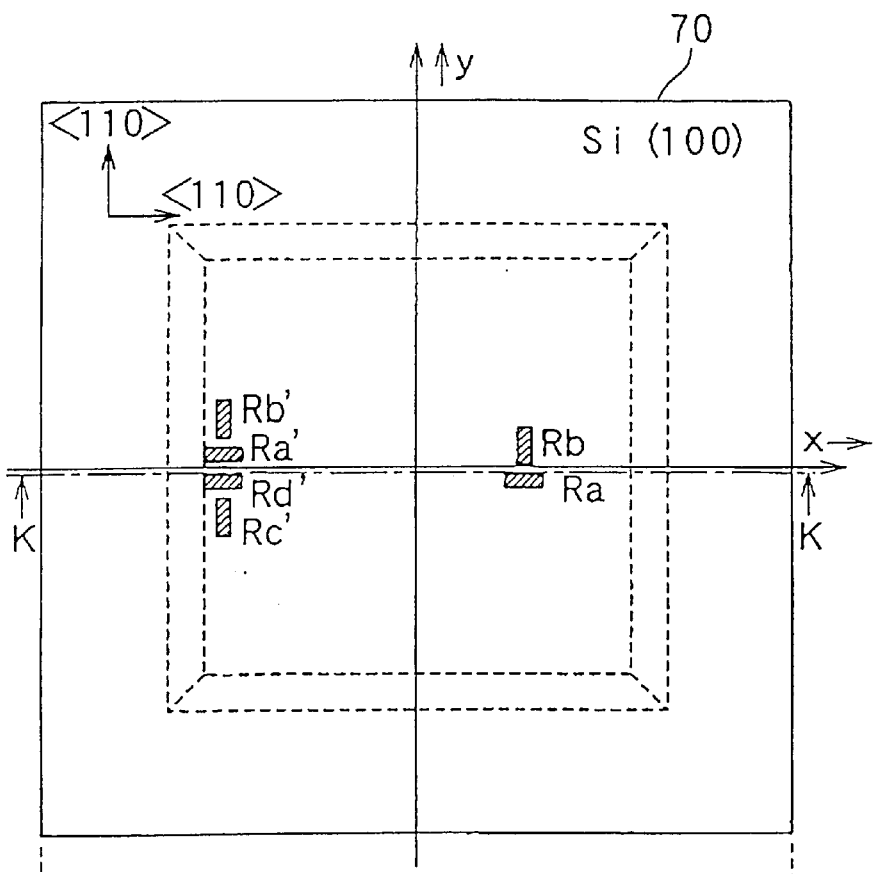
FIG. 24A is a plan view showing a diaphragm portion of a pressure sensor in accordance with a fourteenth embodiment of the present invention.
Figure 24B:
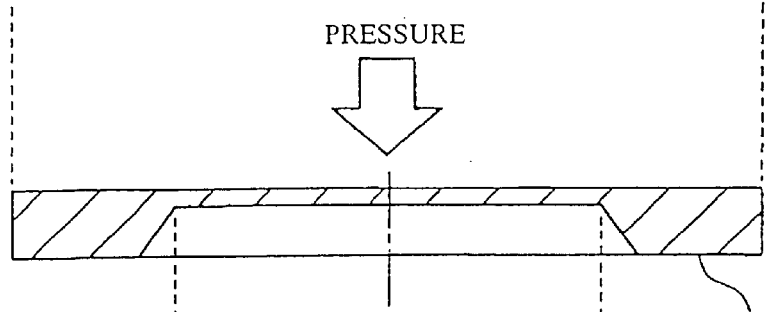
FIG. 24B is a cross-sectional view showing the diaphragm portion of the pressure sensor taken along a line K—K of FIG. 24A.
Figure 24C:
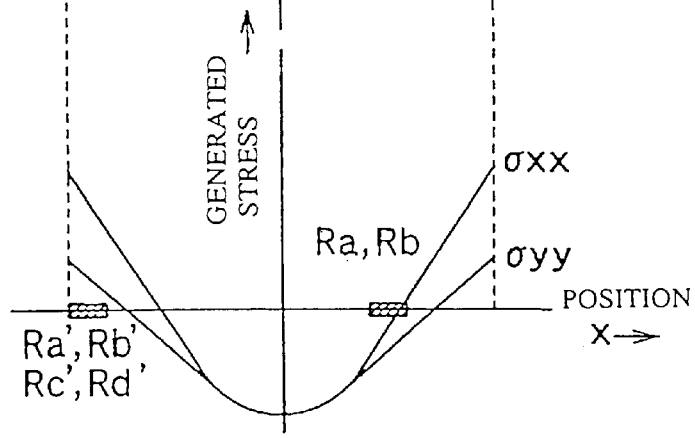
FIG. 24C is a graph showing the relationship between the position of diffused resistor and a generated stress in accordance with the fourteenth embodiment of the present invention.

Next, a fourteenth embodiment of the present invention will be explained Awith reference to FIGS. 24A, 24B, and 24C. FIG. 24A is a front view showing a pressure sensor of the fourteenth embodiment. FIG. 24B is a cross-sectional view taken along a line K—K of FIG. 24A. FIG. 24C is a view showing an x-directional component σxx and a y-directional component σyy of a generated stress on an x axis of the diaphragm surface when a pressure is applied on the diaphragm portion.

The pressure sensor of the fourteenth embodiment differs from the pressure sensor of the thirteenth embodiment in that the failure detecting bridge circuit is a full-bridge circuit consisting of four diffused resistors Ra'~Rd'.

A diffused resistor Rc' extends in the y direction and is located at a portion where a resistance change (i. e., compressive stress) corresponding to the diffused resistor Rb' is obtained. A diffused resistor Rd' extends in the x direction and is located at a portion where a resistance change (i.e., tensile stress) corresponding to the diffused resistor Ra' is obtained.

In this manner, the fourteenth embodiment arranges a high-sensitive failure detecting bridge circuit by a fill-bridge circuit consisting of four diffused resistors Ra'~Rd'.

Fifteenth Embodiment

Next, a fifteenth embodiment of the present invention will be explained with reference to FIGS. 25A, 25B, and 25C. FIG. 25A is a front view showing a pressure sensor of the fifteenth embodiment. FIG. 25B is a cross-sectional view taken along a line L—L of FIG. 25A. FIG. 25C is a view showing an x-directional component σxx and a y-directional component σyy of a generated stress on an x axis of the diaphragm surface when a pressure is applied on the diaphragm portion.

The pressure sensor of the fifteenth embodiment differs from the pressure sensor of the fourteenth embodiment in that the pressure detecting bridge circuit is a full-bridge circuit consisting of four diffused resistors Ra~Rd.

A diffused resistor Rc extends in the y direction and is located at a portion where a resistance change (i. e., compressive stress) corresponding to the diffused resistor Rb is obtained. A diffused resistor Rd extends in the x direction and is located at a portion where a resistance change (i.e., tensile stress) corresponding to the diffused resistor Ra is obtained.

In this manner, the fifteenth embodiment arranges a high-sensitive pressure detecting bridge circuit by a full-bridge circuit consisting of four diffused resistors Ra~Rd.

Various Modifications

Each of the above-described embodiments constitutes the bridge circuit by the resistors having the same resistance. However, considering the manufacturing error, it is possible to provide an adjusting resistor (i.e., a variable resistor) near each resistor for performing a trimming adjustment to equalize the resistance values of respective resistors constituting the bridge circuit.

Furthermore, in each of the above-described embodiments, a failure of the bridge circuit is judged by checking whether or not the compared output values agree. However, considering the manufacturing error of the pressure sensor or sensor accuracy, it is possible to provide a certain amount of margin in the judgement. For example, the equation $|V_{BC}|=2\times|V_{CE}|$ in the formula 1-2 can be redefined in the following manner.

$|V_{BC}|=2\times|V_{CE}|\pm\epsilon$ (where $\epsilon$ is an allowable error)

According to the first to fourth embodiments, the failure judgement of the bridge circuit is performed based on a comparison of respective voltage differences at a certain timing. However, it is possible to compare the changes of the voltage differences during a predetermined time.

In the above-described fifth to ninth embodiments, the failure detecting circuit may be disposed at an arbitrary position on the diaphragm portion irrespective of the arrangement of each embodiment, as far as the output characteristics of the failure detecting circuit is differentiated from that of the pressure detecting circuit.

Furthermore, in the third embodiment, the failure detection is performed by using voltage levels of division points of equally divided resistors. However, it may be possible to use unevenly divided resistors. In this respect, the failure detection can be performed by using an uneven arrangement where the resistors disposed on two sides of the bridge circuit are divided at equivalent points having the same voltage levels when no pressure is applied.

Figure 26:
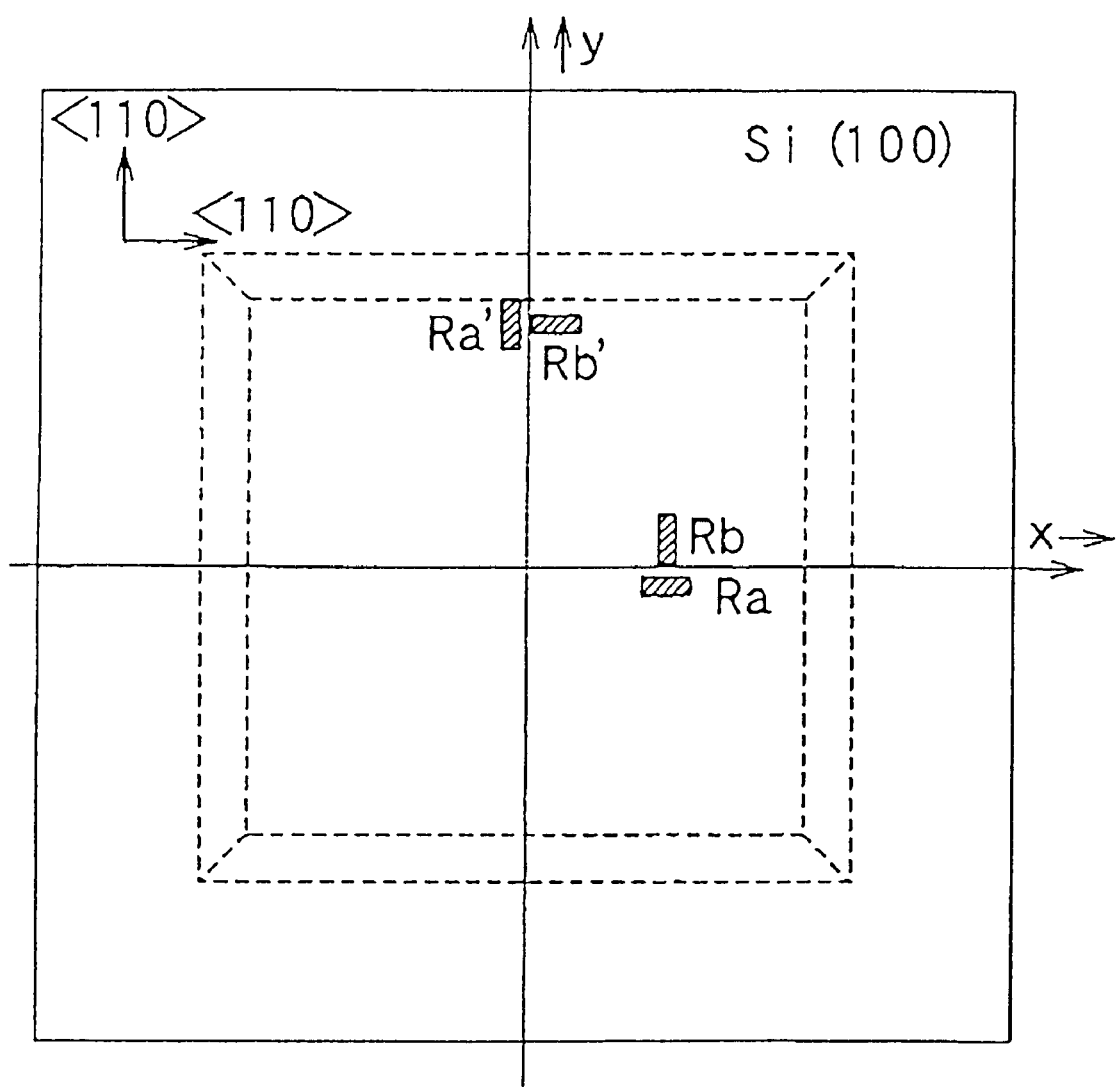
FIG. 26 is a plan view showing an arrangement of diffused resistors Ra, Rb, Ra', and Rb' in accordance with a modified embodiment of the present invention.

Furthermore, according to the thirteenth embodiment, all of the diffused resistors Ra, Rb and Ra', Rb' are offset in the x direction from the center of the diaphragm portion. However, as shown in FIG. 26, it is possible to arrange the diffused resistors Ra', Rb' so as to be offset in the y direction from the center of the diaphragm portion, while the diffused resistors Ra, Rb are offset in the x direction from the center of the diaphragm portion.

Figure 27A:
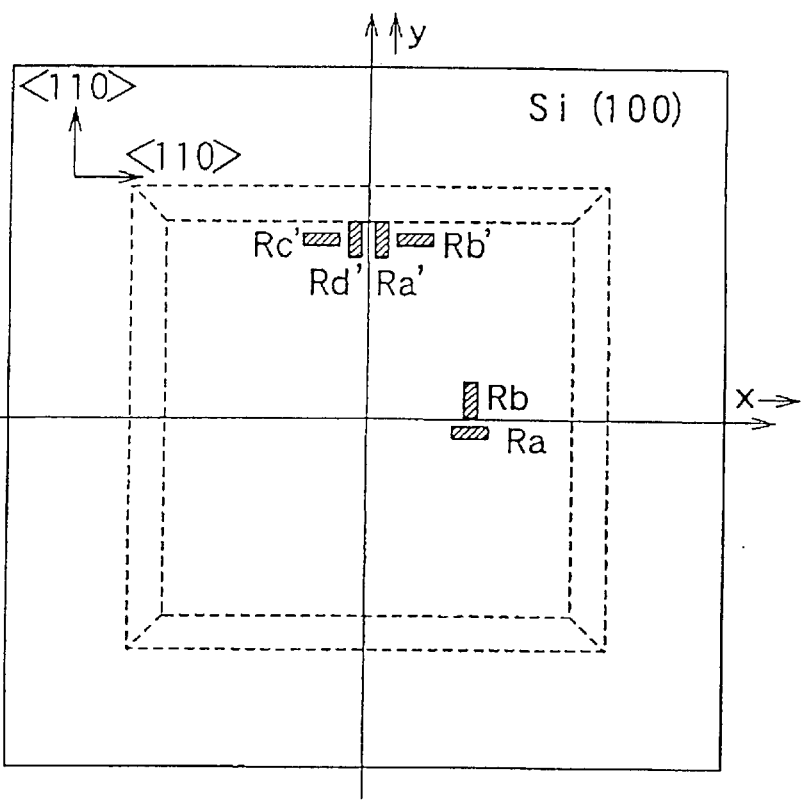
FIGS. 27A and 27B are plan views showing an arrangement of diffused resistors Ra, Rb, and Ra'~Rd' in accordance with another modified embodiment of the present invention.
Figure 27B:
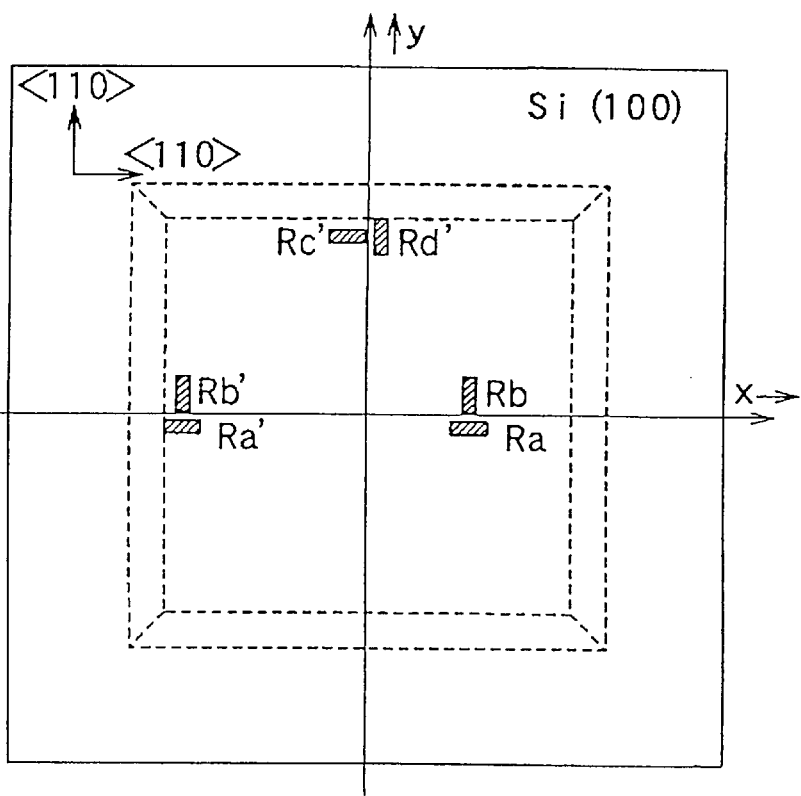

Similarly, as shown in FIG. 27A, the fourteenth embodiment can be modified to provide the diffused resistors Ra'~Rd' offset in the y direction from the center of the diaphragm portion and the diffused resistors Ra, Rb offset in the x direction from the center of the diaphragm portion. Alternatively, the fourteenth embodiment can be modified to provide the diffused resistors Rc', Rd' offset in the y direction from the center of the diaphragm portion and the diffused resistors Ra, Rb and Ra', Rb' offset in the x direction from the center of the diaphragm portion.

Figure 28A:
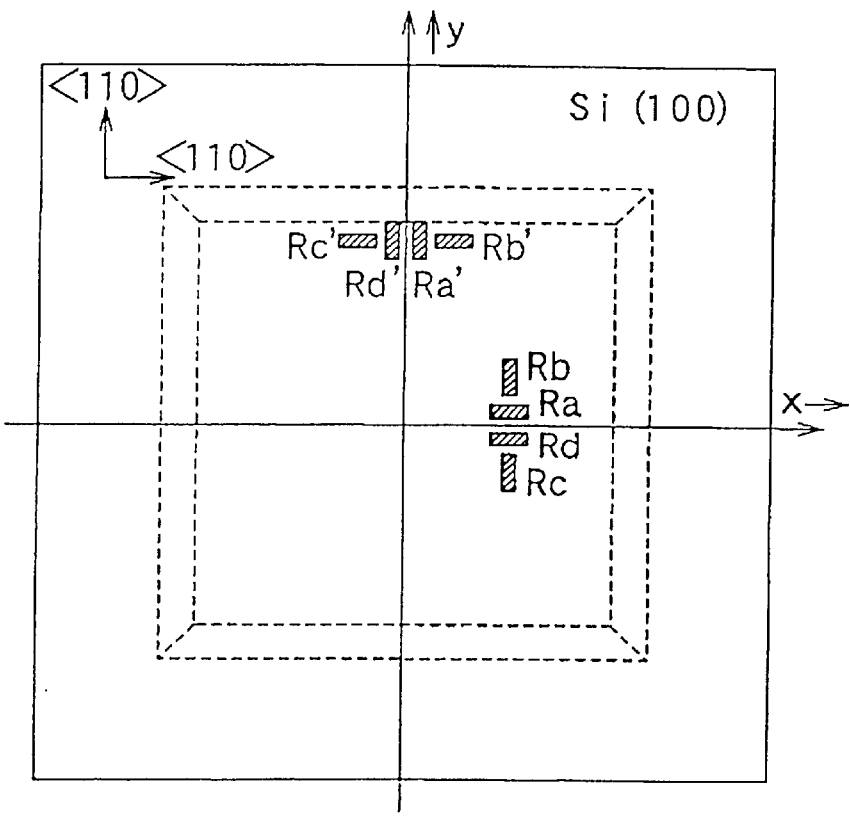
FIGS. 28A and 28B are plan views showing an arrangement of diffused resistors Ra~Rd, and Ra'~Rd' in accordance with another modified embodiment of the present invention.
Figure 28B:
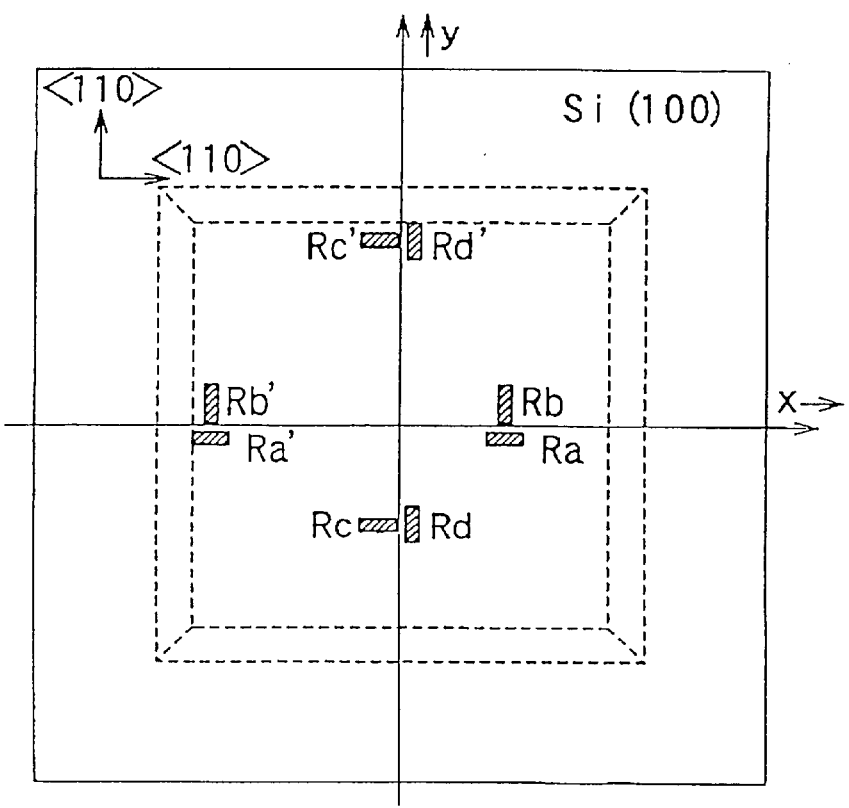

Similarly, as shown in FIG. 28A, the fifteenth embodiment can be modified to provide the diffused resistors Ra'~Rd' offset in the y direction from the center of the diaphragm portion and the diffused resistors Ra~Rd offset in the x direction from the center of the diaphragm portion. Alternatively, the fifteenth embodiment can be modified to provide the diffused resistors Rc, Rd and Rc', Rd' offset in the y direction from the center of the diaphragm portion and the diffused resistors Ra, Rb and Ra', Rb' offset in the x direction from the center of the diaphragm portion.

The arrangements shown in FIGS. 26 to 28B are merely examples. The present invention can be applied to other arrangements.

The above-described tenth through fifteenth embodiments are based on the pressure sensor subjected to an extremely high pressure (e.g., 50 atm. or above). Thus, a high-sensitive failure detecting circuit is separately provided. However, when the pressure sensor is used in a relatively low pressure environment (e.g. 1~10 atm.), it may not be necessary to increase the sensitivity of the failure detecting circuit as explained hereinafter.

In FIG. 16, under a premise that the reference pressure chamber 60a is vacuum, the diaphragm portion is slightly bent toward the reference pressure chamber in an atmosphere. When a pressure is applied on the diaphragm portion, the diaphragm portion further deforms toward the reference pressure chamber. On the contrary, the deformation of the diaphragm portion reduces in a negative pressure lower than the atmospheric pressure. The deformation of the diaphragm portion is completely eliminated when the absolute pressure becomes 0. Under a premise that the pressure sensor is subjected to positive pressures only, a signal indicating a negative pressure is abnormal. When the airtightness of the reference pressure chamber 60a is defective, the outside pressure of the diaphragm portion may become identical with the inside pressure of the diaphragm portion. In this case, the deformation of the diaphragm portion is eliminated. In other words, the condition of absolute pressure=0 is realized.

Figure 29:
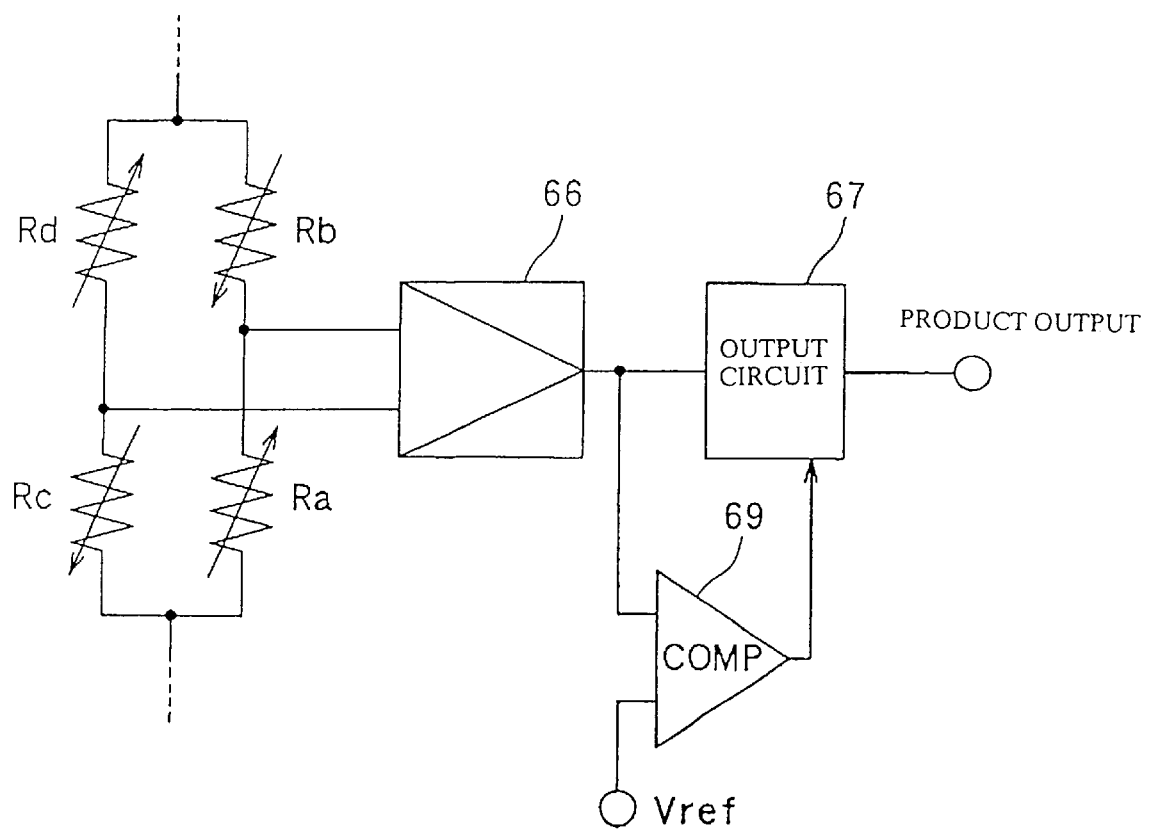
FIG. 29 is a circuit diagram showing the arrangement of a pressure sensor in accordance with another modified embodiment of the present invention.

Hence, a circuit arrangement shown in FIG. 29 can be used for detecting an output of a pressure nearly equal to 0 or a negative pressure. A failure mode for detecting a defective airtightness of the reference voltage chamber 60a can be realized.

Figure 30:
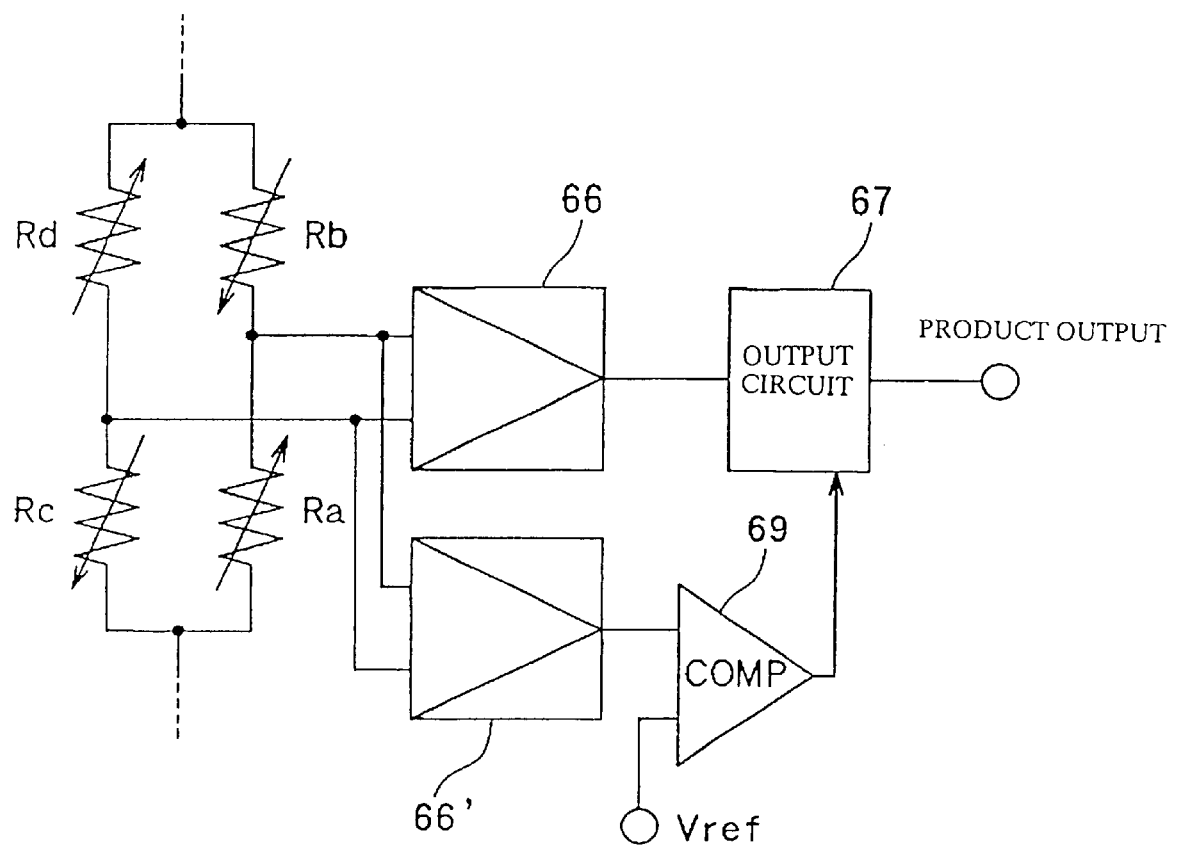
FIG. 30 is a circuit diagram showing the arrangement of a pressure sensor in accordance with another modified embodiment of the present invention.

Furthermore, instead of using the circuit arrangement shown in FIG. 29, a circuit arrangement shown in FIG. 30 can be used when the pressure sensor needs to be durable in a more higher pressure range (e.g., 10~50 atm.). The circuit arrangement shown in FIG. 30 comprises two series of amplifiers 66 and 66'. The sensitivity of the failure detecting circuit can be improved.

The above-described tenth to fifteenth embodiments are based on the pressure sensors having a diaphragm portion formed by a thin portion of a semiconductor substrate, with gauge resistors formed on the surface of the semiconductor substrate. However, the present invention relating to detection of a defective airtightness can be similarly applied to other pressure sensors having a reference pressure chamber. Thus, the present invention can be applied to capacitive or other pressure sensors.

Next, the detailed and practical arrangement of the above-described first embodiment will be explained.

For example, a conventional sensor abnormality detecting apparatus disclosed in the published Japanese patent application No. 8-247881 has the following problems.

① First, a sum (V1+V2−2·V3) is obtained by successively switching the contact points of two switch SW1 and SW2, it is difficult to perform an accurate abnormal detection based on the output voltages V1 and V2 obtained at the same time. For example, during a time duration for connecting the contact position of the switches SW1 and SW2 to a b position and then to a c position, a pressure applied on a pressure sensor may vary and therefore the output voltages V1 and V2 may change correspondingly. However, such a normal change may be erroneously judged as a sensor abnormality.

② Furthermore, successively switching the contact points of two switch SW1 and SW2 for obtaining the sum (V1+V2−2·V3) takes a significant time. This will cause a delay in detecting a sensor abnormality caused in the pressure sensor.

③ Moreover, the above-described abnormality detecting apparatus requires an information processing apparatus comprising a MPU performing calculations necessary for abnormality detection as well as controlling the switches SW1 and SW2. Arranging the sensor unit in this manner so as to have abnormality detecting capability is disadvantageous in that the scale of the sensor unit is increased and the cost of the sensor unit is increased.

Sixteenth Embodiment

Figure 31:
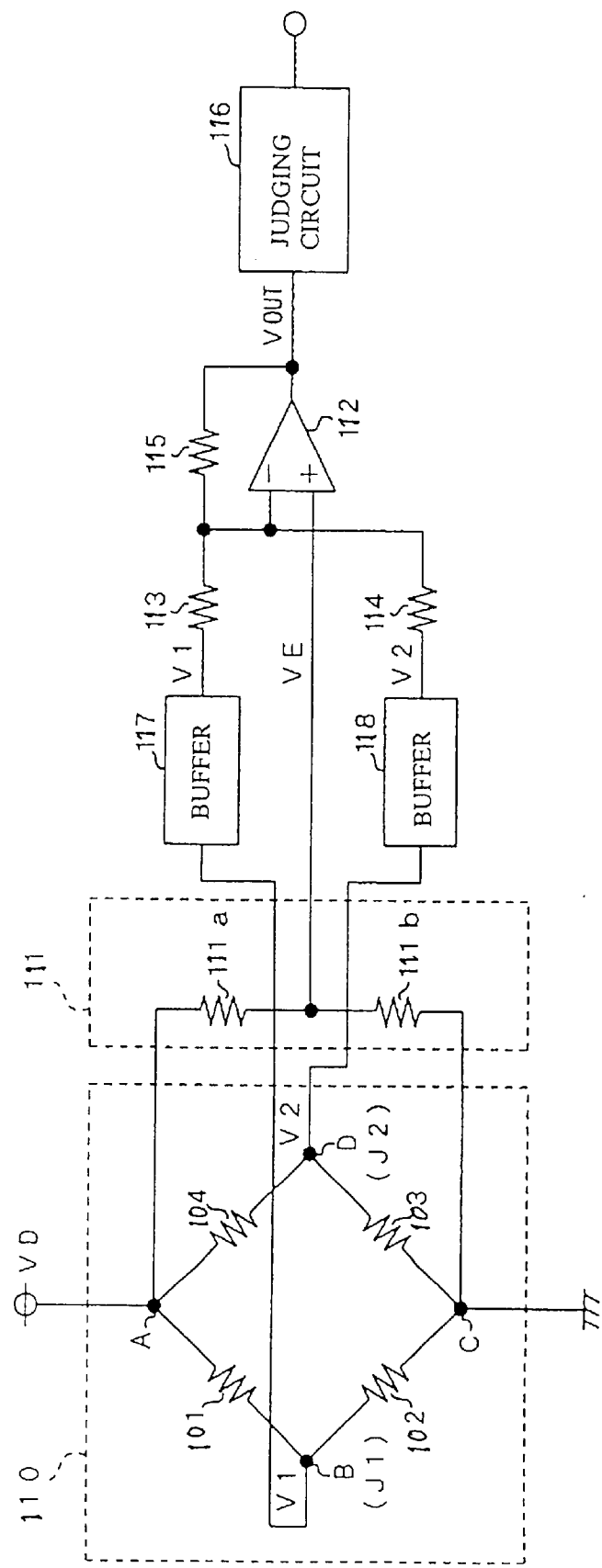
FIG. 31 is a circuit diagram showing a sensor abnormality detecting circuit in accordance with a sixteenth embodiment of the present invention.

To accomplish the above and other related objects, as can be understood with reference to a circuit arrangement shown in FIG. 31, the sixteenth embodiment of the present invention provides a sensor abnormality detecting circuit for a sensor 110 having a first output terminal J1 generating a first output voltage V1 and a second output terminal J2 generating a second output voltage V2. The first output voltage and the second output voltage vary in mutually opposed positive and negative directions in response to a sensed physical quantity by the same voltage amount with respect to a predetermined equilibrium voltage V0. The sensor abnormality detecting circuit comprises a reference voltage generating circuit 111 for generating a reference voltage VE substantially identical with the equilibrium voltage V0. An operational amplifier 112 has one input terminal receiving the reference voltage VE Bgenerated from the reference voltage generating circuit 111. A first resistor 113 has one end receiving the first output voltage V1 of the sensor 110 and the other end connected to the other input terminal of the operational amplifier 112. A second resistor 114 has one end receiving the second output voltage V2 of the sensor 110 and the other end connected to the other input terminal of the operational amplifier 112. The second resistor 114 has the same resistance as that of the first resistor 113. A third resistor 115 is connected between an output terminal of the operational amplifier 112 and the other input terminal of the operational amplifier 112. And, a judging circuit 116 for generating an abnormal signal notifying an occurrence of sensor abnormality when an output voltage VOUT of the operational amplifier 112 is outside a predetermined normal voltage range.

According to the circuit arrangement shown in FIG. 31, one input terminal of the operational amplifier 112 is a non-inverting input terminal (+) and the other input terminal of the operational amplifier 112 is an inverting input terminal (−). Although the circuit arrangement of FIG. 31 uses the pressure sensor 110, the sensor abnormality detecting circuit of the present invention can be applied to other sensors.

In the above sensor abnormality detecting circuit, when the first resistor 113 and the second resistor 114 have a resistance R and the third resistor 115 has a resistance X·R. The output voltage VOUT of the operational amplifier 112 is defined by the above-described formula 2-1 or 2-2.

When the operation of sensor 110 is normal, the output voltage V1 and the output voltage V2 change by the same amount in the mutually opposed positive and negative directions with respect to the reference voltage VE. Thus, when the operation of sensor 110 is normal, the output voltage VOUT of the operational amplifier 112 becomes substantially equal to VE as understood from the formulas 2-1 and 2-2.

When the operation of sensor 110 is abnormal, the balance of output voltages V1 and V2 is lost. More specifically, the absolute difference ΔV1 between the first output voltage V1 and the equilibrium voltage V0 is not equal to the absolute difference ΔV2 between the second output voltage V2 and the equilibrium voltage V0. Thus, the output voltage VOUT of the operational amplifier 112 deviates to either a positive direction or a negative direction with respect to the reference voltage VE.

Hence, in the sensor abnormality detecting circuit, the judging circuit 116 makes a judgement as to whether the output voltage VOUT of the operational amplifier 112 is outside the predetermined normal voltage range. When the output voltage VOUT is outside the predetermined normal voltage range, the judging circuit 116 outputs an abnormal signal notifying an occurrence of abnormality in the sensor 110.

According to the sensor abnormality detecting circuit of the sixteenth embodiment, the abnormality of sensor 110 is accurately detected based on the output voltages V1 and V2 obtained at the same time. Furthermore, the abnormality of sensor 110 is so quickly detectable that the delay time is substantially eliminated. It is not necessary to provide a high-performance information processing apparatus, such as MPU. Thus, it becomes possible to provide a small-scale circuit arrangement for detecting the abnormality of sensor 110.

As understood from the above detection principle, it is desirable that the reference voltage VE produced from the reference voltage generating circuit 111 is equal to the equilibrium voltage V0 of the sensor 110. However, even if the reference voltage VE is not completely identical with the equilibrium voltage V0, such a tiny difference can be absorbed by the normal voltage range of the judging circuit 116. Thus, the present invention sets the reference voltage VE produced from the reference voltage generating circuit 111 to be substantially equal to the equilibrium voltage V0 of the sensor 110.

Meanwhile, in the sensor abnormality detecting circuit shown in FIG. 31, the one end of the first resistor 113 can be directly connected to the first output terminal J1 of the sensor 110 and the end of the second resistor 114 can be directly connected to the second output terminal J2 of the sensor 110. However, depending on the arrangement of the sensor 110, the output voltages V1 and V2 may be adversely deviated when the current flows from the output terminals J1 and J2 into a circuit portion consisting of the operational amplifier 112 and the first to third resistors 113, 114, and 115.

Hence, as can be understood with reference to the circuit arrangement shown in FIG. 31, it is desirable that a first buffer 117 is provided for receiving the first output voltage V1 of the sensor 110 and applying the received first output voltage V1 to the one end of the first resistor 113, and a second buffer 118 is provided for receiving the second output voltage V2 of the sensor 110 and applying the received second output voltage V2 to the one end of the second resistor 114. Namely, the first buffer 117 is provided between the first output terminal J1 of the sensor 110 and the first resistor 113. The second buffer 118 is provided between the second output terminal J2 of the sensor 110 and the second resistor 114.

Thus, according to the sensor abnormality detecting circuit shown in FIG. 31, it becomes possible to prevent the current from flowing from the output terminals J1 and J2 of the sensor 110 into the circuit consisting of the operational amplifier 112 and the first to third resistors 113, 114, and 115. The abnormality of sensor 110 can be accurately detected.

Seventeenth Embodiment

Figure 32:
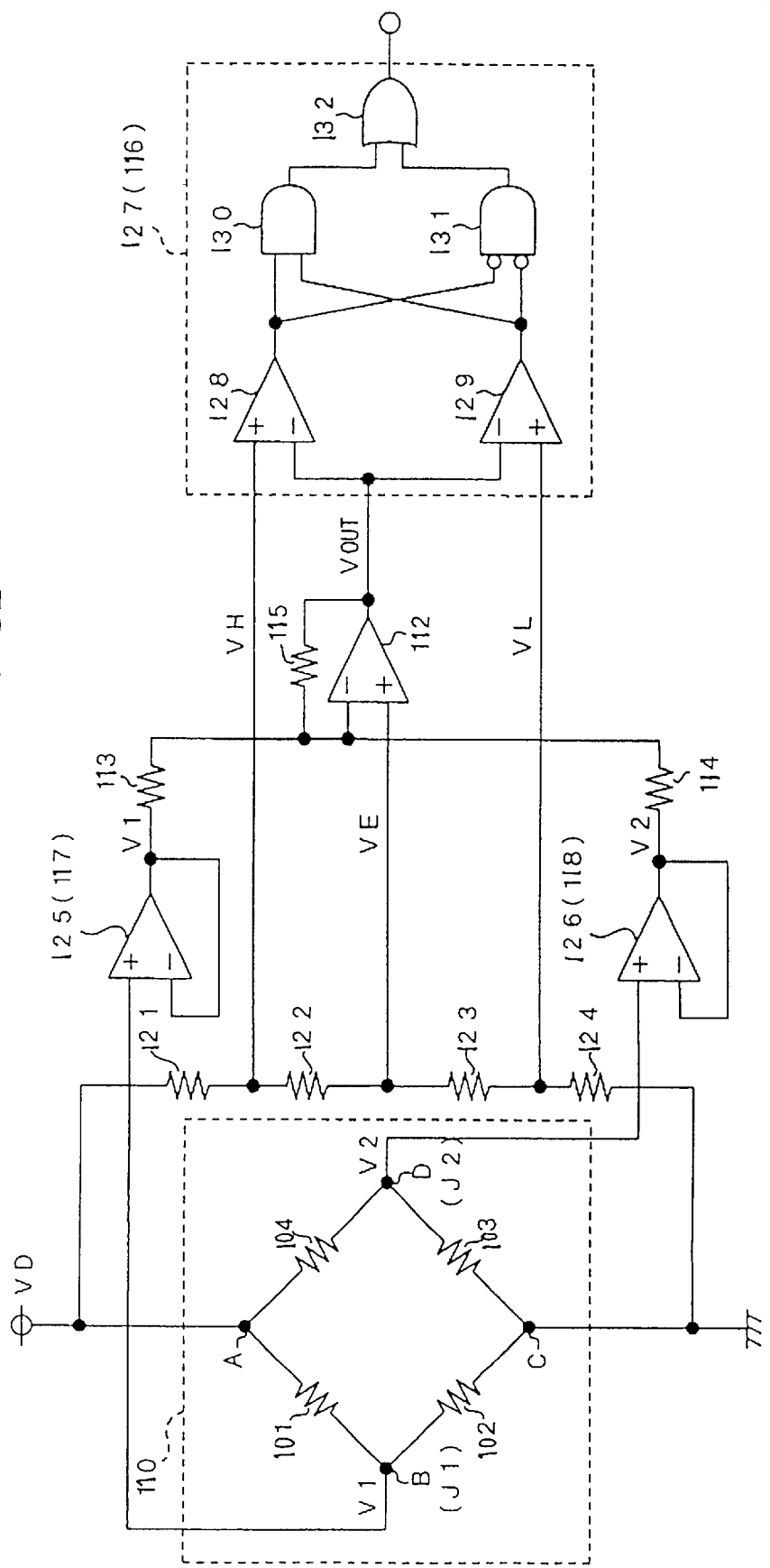
FIG. 32 is a circuit diagram showing a sensor abnormality detecting circuit in accordance with a seventeenth embodiment of the present invention.

FIG. 32 is a circuit diagram showing a sensor abnormality detecting circuit in accordance with a seventeenth embodiment of the present invention.

The sensor abnormality detecting circuit of the seventeenth embodiment is used for detecting abnormality of a pressure sensor 110. FIG. 32 is a detailed arrangement of the sensor abnormality detecting circuit of FIG. 31. In FIG. 32, components identical with those shown in FIG. 31 are denoted by the same reference numerals and will not be explained in detail.

As shown in FIG. 32, the sensor abnormality detecting circuit of the seventeenth embodiment differs from the circuit shown in FIG. 31 in the following points I- to I-3.

I-1: Among connecting points A~D connecting four gauge resistors 101~104 constituting the pressure sensor 110, a total of four resistors 121, 122, 123, and 124 are serially connected from a connecting point A of gauge resistors 101 and 104 to a connecting point C of gauge resistors 102 and 103.

Accordingly, apower voltage VD applied to the pressure sensor 110, i.e., the power voltage VD applied between the connecting points A and D, are divided by four resistors 121~124. The seventeenth embodiment determines resistance values of four resistors 121~124 in such a manner the connectmg points of the resistors 121~124 generate predetermined voltages according to the following points (1)~(3).

(1) A connecting point of the resistors 122 and 123 generates a reference voltage VE which is equal to an equilibrium voltage V0 of two output voltages V1 and V2 of the pressure sensor 110. The reference voltage VE is equal to a half of the powervoltage VD. The connecting point of the resistors 122 and 123 is connected to the non-inverting input terminal of the operational amplifier 112.

(2) A connecting point of the resistors 121 and 122 generates a first criterial voltage VH (=VE+α) which is higher than the reference voltage VE (=VD/2) by a predetermined voltage a.

(3) A connecting point of the resistors 123 and 124 generates a second criterial voltage VL (=VE−α) which is lower than the reference voltage VE (=VD/2) by a predetermined voltage a.

According to the seventeenth embodiment, the four resistors 121~124 cooperatively serve as the reference voltage generating circuit 111. Each of four resistors 121~124 is formed by a thin-film resistor having substantially no temperature dependency. The resistance of the thin-film is adjustable by a laser trimming. However, no trimming will be necessary when the ratio of thin-resistors is finely controlled.

I-2: An operational amplifier 125, having an inverting input terminal connected to an output terminal, serves as the first buffer 117. A non-inverting input terminal of the operational amplifier 125, serving as an input terminal of the first buffer 117, is connected to the first output terminal J1 of the pressure sensor 110 (i.e., connected to the connecting point B of the gauge resistors 101 and 102). An output terminal of the operational amplifier 125, serving as an output terminal of the first buffer 117, is connected to the one end of the first resistor 113.

Similarly, an operational amplifier 126, having an inverting input terminal connected to an output terminal, serves as the second buffer 118. A non-inverting input terminal of the operational amplifier 126, serving as an input terminal of the second buffer 118, is connected to the second output terminal J2 of the pressure sensor 110 (i.e., connected to the connecting point D of the gauge resistors 103 and 104). An output terminal of the operational amplifier 126, serving as an output terminal of the second buffer 118, is connected to the one end of the second resistor 114.

I-3: A window comparator 127 serves as the judging circuit 116. The window comparator 127 comprises a first comparator 128 generating a low-level signal when the output voltage VOUT of the operational amplifier 112 is higher than the first criterial voltage VH generated from the connecting point of the resistors 121 and 122 and otherwise generating a high-level signal, a second comparator 129 generating a high-level signal when the output voltage VOUT of the operational amplifier 112 is lower than the second criterial voltage VL generated from the connecting point of the resistors 123 and 124 and otherwise generating a low-level signal, a first AND gate 130 generating a high-level signal when both of the comparators 128 and 129 generate high-level signals and otherwise generating a low-level signal, a second AND gate 131 generating a high-level signal when both of the comparators 128 and 129 generate low-level signals and otherwise generating a low-level signal, and an OR gate 132 outputting a logical sum signal of the outputs of the AND gates 130 and 131.

Accordingly, the OR gate 132 of the window comparator 127 generates a low-level signal when the output voltage VOUT of the operational amplifier 112 is within a normal voltage range from the second criterial voltage VL (=VE−α) to the first criterial voltage VH (=VE+α) which is a voltage range used for abnormality judgement.

On the other hand, when the output voltage VOUT of the operational amplifier 112 is outside the above normal voltage range (=VE±α), namely, when the output voltage VOUT of the operational amplifier 112 is higher than the first criterial voltage VH or lower than the second criterial voltage VL, the OR gate 132 of the window comparator 127 generates a high-level signal which notifies occurrence of abnormality in the pressure sensor 110.

In the above-described sensor abnormality detecting circuit of the seventeenth embodiment, the operational amplifier 125 serving as the first buffer 117 generates the voltage V1 identical with the first output voltage V1 (i.e., output voltage V1 generated from the first output terminal J1) of the pressure sensor 110. Similarly, the operational amplifier 126 serving as the second buffer 118 generates the voltage V2 identical with the second output voltage V2 (i.e., output voltage V2 generated from the second output terminal J2) of the pressure sensor 110.

Furthermore, in the sensor abnormality detecting circuit of the seventeenth embodiment, the resistance of the third resistor 115 is set to be X times the resistance of the first and second resistors 113 and 114, where X is larger than 1.

Accordingly, the output voltage VOUT of the operational amplifier 112 is defined by the formula 2-1 or 2-2. When the operation of the pressure sensor 110 is normal, i.e., when the changes of output voltages V1 and V2 of the pressure sensor 110 are identical with respect to the reference voltage VE, the voltage VOUT of the operational amplifier 112 becomes equal to the reference voltage VE.

On the other hand, when the balance of output voltages V1 and V2 is lost due to occurrence of abnormality in the pressure sensor 110, the voltage VOUT of the operational amplifier 112 deviates in a positive or a negative direction. When the voltage VOUT of the operational amplifier 112 is outside the above normal voltage range (=VE±α), the window comparator 127 (i.e., the OR gate 132) generates the high-level signal notifying the occurrence of abnormality in the pressure sensor 110.

According to the sensor abnormality detecting circuit in accordance with the seventeenth embodiment of the present invention, the abnormality of sensor 110 is accurately detected based on the output voltages V1 and V2 obtained at the same time. Furthermore, the abnormality of sensor 110 is so quickly detectable that the delay time is substantially eliminated. It is not necessary to provide a high-performance information processing apparatus, such as MPU. Thus, it becomes possible to provide a small-scale circuit arrangement for detecting the abnormality of sensor 110.

As the power voltage VD applied to the pressure sensor is divided by the resistors 121~124 to generate the reference voltage VE, even if the actual equilibrium voltage V0 of the pressure sensor 110 varies in response to a variation of the power voltage VD, the reference voltage VE can be always equalized to the equilibrium voltage V0. Accordingly, even when the power voltage VD applied to the pressure sensor 110 varies, the abnormality of pressure sensor 110 can be accurately detected.

Furthermore, the operational amplifier 125 serving as the first buffer 117 is provided between the first output terminal J1 of the pressure sensor 110 and the first resistor 113. The operational amplifier 126 serving as the second buffer 118 is provided between the second output terminal J2 of the pressure sensor 110 and the second resistor 114. Thus, it becomes possible to prevent the current from flowing from the output terminals J1 and J2 of the pressure sensor 110 to the circuit portion consisting of the operational amplifier 112 and the first to third resistors 113, 114 and 115. In other words, it becomes possible to prevent the output voltages V1 and V2 from deviating. The abnormality of the pressure sensor 110 can be accurately detected.

Eighteenth Embodiment

Figure 33:
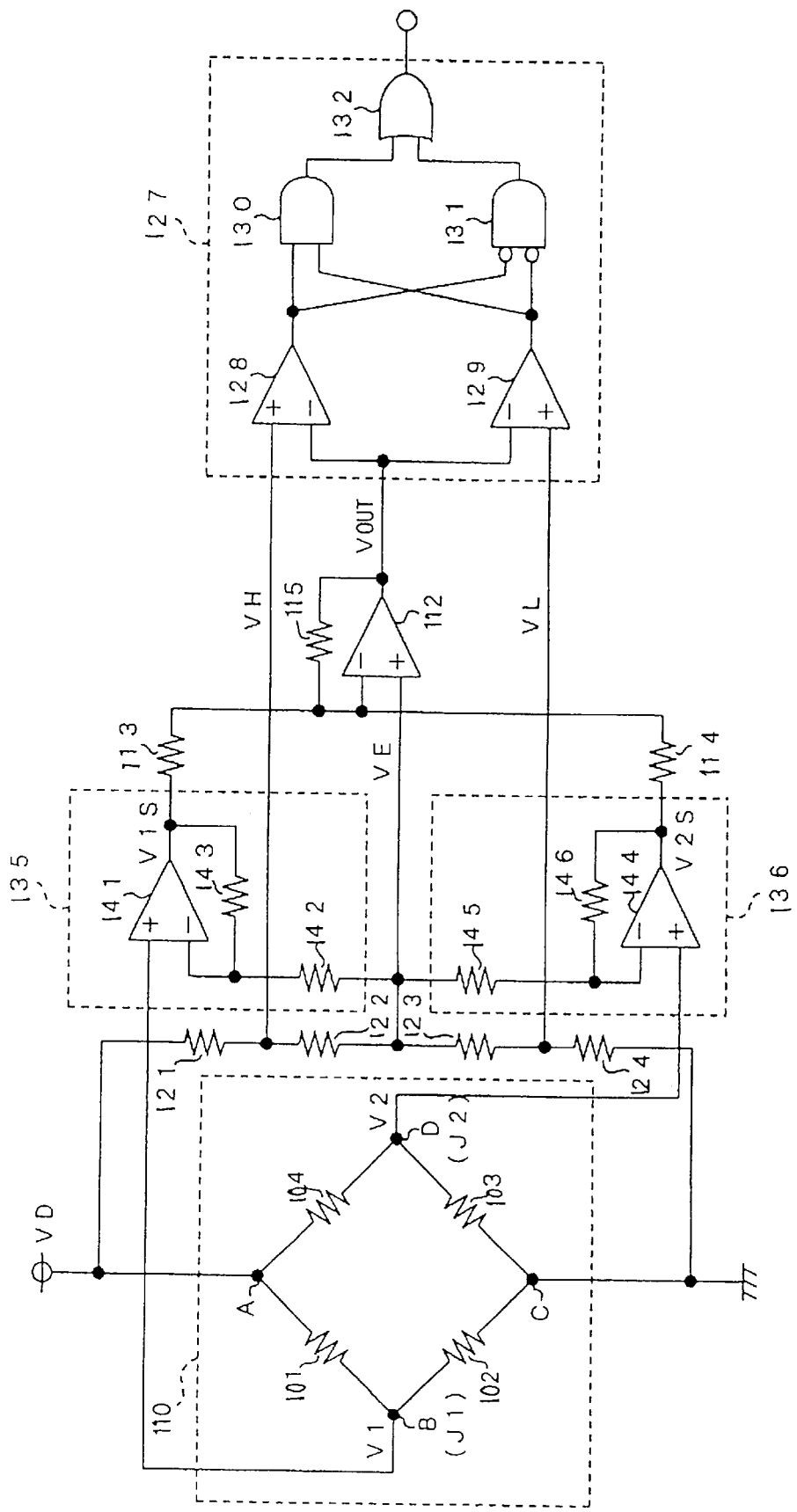
FIG. 33 is a circuit diagram showing a sensor abnormality detecting circuit in accordance with an eighteenth embodiment of the present invention.

Next, FIG. 33 is a circuit diagram showing the arrangement of a sensor abnormality detecting circuit in accordance with an eighteenth embodiment of the present invention. Like the sensor abnormality detecting circuit of the seventeenth embodiment, the sensor abnormality detecting circuit of the eighteenth embodiment is used for detecting the abnormality of the pressure sensor 110. In FIG. 33, components identical with those shown in FIG. 32 are denoted by the same reference numerals and will not be explained in detail.

As shown in FIG. 33, the sensor abnormality detecting circuit of the eighteenth embodiment differs from the sensor abnormality detecting circuit of the seventeenth embodiment (shown in FIG. 32) in the following points II-1 and II-2.

II-1: The operational amplifier 125 serving as the first buffer 117 is replaced by a first differential amplifier 135 which has a non-inverting input terminal receiving the first output voltage V1 of the pressure sensor 110 and an inverting input terminal receiving the reference voltage VE generated from a connecting point of the resistors 122 and 123.

Similarly, the operational amplifier 126 serving as the second buffer 118 is replaced by a second differential amplifier 136 which has a non-inverting input terminal receiving the second output voltage V2 of the pressure sensor 110 and an inverting input terminal receiving the reference voltage VE.

More specifically, the first differential amplifier 135 comprises an operational amplifier 141 having a non-inverting input terminal connected to the first output terminal J1 of the pressure sensor 110, a resistor 142 connected between the connecting point of the resistors 122 and 123 and an inverting input terminal of the operational amplifier 141, and a resistor 143 connected between an output terminal of the operational amplifier 141 and the inverting input terminal of the operational amplifier 141. The output terminal of the operational amplifier 141, serving as an output terminal of the first differential amplifier 135, is connected to the one end of the first resistor 113. The non-inverting input terminal of the operational amplifier 141 serves as the non-inverting input terminal of the first differential amplifier 135. An end of the resistor 142, positioned far from the operational amplifier 141, serves as the inverting input terminal of the first differential amplifier 135.

Similarly, the second differential amplifier 136 comprises an operational amplifier 144 having a non-inverting input terminal connected to the second output terminal J2 of the pressure sensor 110, a resistor 145 connected between the connecting point of the resistors 122 and 123 and an inverting input terminal of the operational amplifier 144, and a resistor 146 connected between an output terminal of the operational amplifier 144 and the inverting input terminal of the operational amplifier 144. The output terminal of the operational amplifier 144, serving as an output terminal of the second differential amplifier 136, is connected to the one end of the second resistor 114. The non-inverting input terminal of the operational amplifier 144 serves as the non-inverting input terminal of the second differential amplifier 136. An end of the resistor 145, positioned far from the operational amplifier 144, serves as the inverting input terminal of the second differential amplifier 136.

Regarding the resistors 142, 143, 145, and 146, a ratio of the resistance of resistor 143 to the resistance of resistor 142 is set to be identical with a ratio of the resistance of resistor 146 to the resistance of resistor 145.

It is now assumed that "Rb/Ra" represents the ratio of the resistance of resistor 143 to the resistance of resistor 142 as well as the ratio of the resistance of resistor 146 to the resistance of resistor 145. An amplification factor Y of the first differential amplifier 135 and the second differential amplifier 136 is expressed by "1+Rb/Ra." From the above-described formulas 2-3 and 2-4, the output voltage V1S (i.e., a voltage applied to the one end of the first resistor 113) of the first differential amplifier 135 is expressed by the following formula 2-6, and the output voltage V2S (i.e., a voltage applied to the one end of the second resistor 114) of the second differential amplifier 136 is expressed by the following formula 2-7.

$$V1S=(1+Rb/Ra)\times(V1-VE)+VE \qquad (2\text{-}6)$$

$$V2S=(1+Rb/Ra)\times(V2-VE)+VE \qquad (2\text{-}7)$$

The output voltage VOUT of the operational amplifier 112 is rewritten by replacing V1 and V2 of the formula 2-1 by V1S and V2S of the above formulas 2-6 and 2-7, as shown by the following formula 2-8.

$$V_{\text{OUT}}=-X(1+Rb/Ra)\{(V1-VE)+(V2-VE)\}+VE \qquad (2\text{-}8)$$

As understood from the formula 2-8, according to the sensor abnormality detecting circuit of the eighteenth embodiment, when the balance of the output voltages V1 and V2 of the sensor 110 are lost, the output voltage VOUT of the operational amplifier 112 largely deviates in either a positive or a negative direction from the reference voltage VE.

II-2: In view of the above, according to the abnormality detecting circuit of the eighteenth embodiment, the resistance values of four resistors 121~124 are set in such a manner that the first criterial voltage VH generated from the connecting point of resistors 121 and 122 is slightly higher than that of the first seventeenth and the eighteenth criterial voltage VL generated from the connecting point of resistors 123 and 124 is slightly lower than that of the seventeenth embodiment. In other words, the normal voltage range (=VE±α) is set to be slightly wider.

According to the above-described abnormality detecting circuit in accordance with the eighteenth embodiment of the present invention, when the balance of the output voltages V1 and V2 of the sensor 110 are lost, the output voltage VOUT of the operational amplifier 112 largely deviates from the reference voltage VE. Thus, the abnormality of the pressure sensor 110 can be accurately performed.

Furthermore, it is possible to suppress the influence of an offset voltage inherent existing in the operational amplifier 112.

Furthermore, the operational amplifiers 141 and 144 constituting the first and second differential amplifiers 135 and 136 operate in the same manner as the first and second buffers 117 and 118 (i.e., the operational amplifiers 125 and 126) in the seventeenth embodiment. Namely, the operational amplifiers 141 and 144 prevent surplus current from flowing excessively Thus, it becomes possible to prevent the current from flowing excessively from the output terminals J1 and J2 of the pressure sensor 110 into the circuit portion consisting of the operational amplifier 112 and the first to third resistors 113, 114, and 115.

Nineteenth Embodiment

Figure 34:
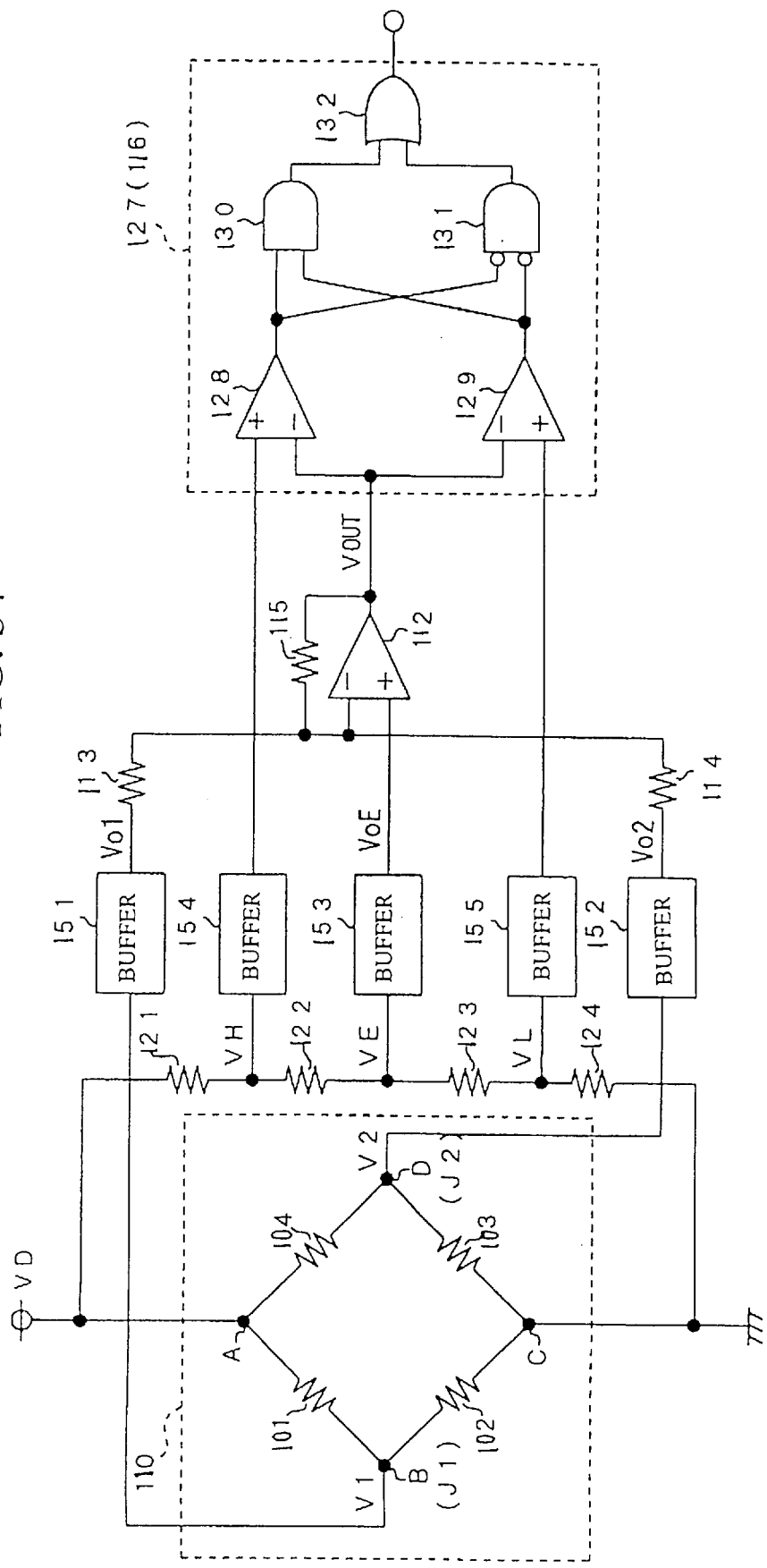
FIG. 34 is a circuit diagram showing a sensor abnormality detecting circuit in accordance with a nineteenth embodiment of the present invention.

Next, FIG. 34 is a circuit diagram showing the arrangement of a sensor abnormality detecting circuit in accordance with a nineteenth embodiment of the present invention. Like the sensor abnormality detecting circuit of the seventeenth embodiment, the sensor abnormality detecting circuit of the nineteenth embodiment is used for detecting the abnormality of the pressure sensor 110. In FIG. 34, components identical with those shown in FIG. 32 are denoted by the same reference numerals and will not be explained in detail.

As shown in FIG. 34, the sensor abnormality detecting circuit of the nineteenth embodiment differs from the sensor abnormality detecting circuit of the seventh embodiment (shown in FIG. 32) in the following points III-1 and III-2.

III-1: The buffer 117, which is a voltage-follower circuit constituted by the operational amplifier 25, is replaced by a buffer 151 having a later-described arrangement. Similarly, the buffer 118, which is a voltage-follower circuit constituted by the operational amplifier 126, is replaced by a buffer 152 having a later-described arrangement.

III-2: A buffer 153 is interposed between the connecting point of the resistors 122 and 123 and the non-inverting input terminal of the operational amplifier 112. Thus, the buffer 153 receives the reference voltage VE generated from the connecting point of the resistors 122 and 123.

Furthermore, a buffer 154 is interposed between the connecting point of the resistors 121 and 122 and the non-inverting input terminal of the first comparator 128 constituting part of the window comparator 127. The buffer 154 receives the first criterial voltage VH generated from the connecting point of the resistors 121 and 122. Similarly, a buffer 155 is interposed between the connecting point of the resistors 123 and 124 and the non-inverting input terminal of the second comparator 129 constituting part of the window comparator 127. The buffer 155 receives the second criterial voltage VL generated from the connecting point of the resistors 123 and 124.

Figure 35A:
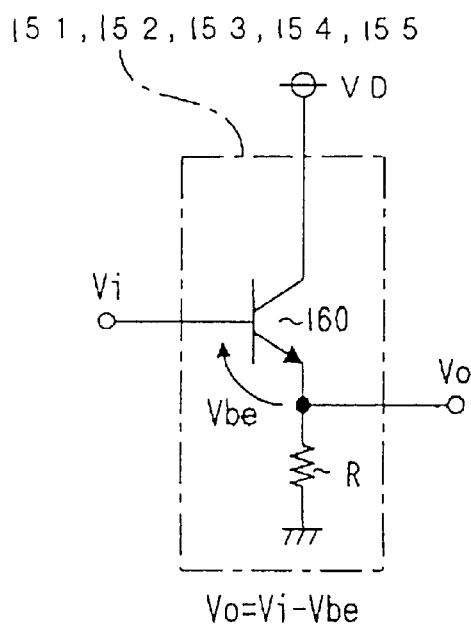
FIGS. 35A to 35D are circuit diagrams each showing a level shift circuit acting as a buffer.

Each of the above five buffers 151~155 is a level shift circuit which outputs an output voltage Vo by shifting an input voltage Vi by a specific voltage Vsf (i.e., Vo=Vi+Vsf). FIG. 35A shows a practical circuit arrangement of the buffers 151~155.

More specifically, as shown in FIG. 35A, each of the buffers 151~155 comprises an NPN transistor 60 having a collector receiving the power voltage VD supplied to the sensor 110 (i.e., connected to a higher-voltage terminal of the power voltage VD), and a resistor R interposed between an emitter of the NPN transistor 160 and a ground terminal (i.e., a lower-voltage terminal of the power voltage VD). A base of the NPN transistor 160 serves as an input terminal of the buffer, while the emitter of the NPN transistor 160 serves as an output terminal of the buffer.

Accordingly, each of the buffers 151~155 produces the output voltage Vo (=Vi−Vbe) by shifting the input voltage Vi to a low-voltage side by a base-emitter voltage Vbe of the NPN transistor 160. Thus, the above specific voltage Vsf is equal to "−Vbe."

In the abnormality detecting circuit of the nineteenth embodiment comprising the buffers 151~155, the buffer 151 produces an output voltage Vo1 which is supplied to the one end of the first resistor 113. The output voltage Vo1 is equal to a voltage (=V1−Vbe) obtained by shifting the first output voltage V1 of the pressure sensor 110 to the lower-voltage side by Vbe. Similarly, the buffer 152 produces an output voltage Vo2 which is supplied to the one end of the second resistor 114. The output voltage Vo2 is equal to a voltage (=V2−Vbe) obtained by shifting the second output voltage V2 of the pressure sensor 110 to the lower-voltage side by Vbe. Furthermore, a voltage VoE supplied from the buffer 153 to the non-inverting input terminal of the operational amplifier 112 is equal to a voltage (=VE−Vbe) obtained by shifting the reference voltage VE to the lower-voltage side by Vbe. In other words, three input voltages V01, V02, and V0E are entered into a signal processing circuit portion consisting of the first to third resistors 113, 114, and 115 and the operational amplifier 112. All of these three input voltages V01, V02, and V0E are shifted to the lower-voltage side by the same voltage Vbe.

As understood from the above-described formula 2-1, according to the sensor abnormality detecting circuit of the nineteenth embodiment, the output voltage VOUT of the operational amplifier 112 is proportional to a sum of a first value obtained by subtracting the reference voltage VE from the first output voltage V1 of the sensor 110 and a second value obtained by subtracting the reference voltage VE from the second output voltage V2 of the sensor 110.

In this case, the output voltage VOUT of the operational amplifier 112 varies about a reference level of "VE−Vbe." However, due to functions of the buffers 154 and 155, the criterial range of the window comparator 127 (i.e., the normal voltage range for the abnormal judgement) is equally shifted to the low-voltage side by the same voltage Vbe. Namely, the criterial range of the window comparator 127 is shifted to "VH−Vbe"~"VL−Vbe." This is because the voltage (VH−Vbe), i.e., the voltage obtained by shifting the first criterial voltage VH to the lower-voltage side by Vbe, is supplied from the buffer 154 to the non-inverting input terminal of the first comparator 128 and also the voltage (VL−Vbe), i.e., the voltage obtained by shifting the second criterial voltage VL to the lower-voltage side by Vbe, is supplied from the buffer 155 to the non-inverting input terminal of the second comparator 129.

Accordingly, the sensor abnormality detecting circuit of the nineteenth embodiment can bring the same functions and effects as those of the sensor abnormality detecting circuit of the seventeenth embodiment. Furthermore, it becomes possible to accurately perform the abnormality judgement without requiring adjusting the resistance values of the resistors 121~124 for modifying the first and second criterial voltages VH and VL.

Especially, the level shift circuit is structurally simple compared with the voltage-follower circuit using an operational amplifier. Thus, the nineteenth embodiment of the present invention provides a compact circuit arrangement for the sensor abnormality detecting circuit.

According to the nineteenth embodiment, the buffer 151 serves as the first buffer, the buffer 152 serves as the second buffer, the buffer 153 serves as the third buffer, the buffer 154 serves as the fourth buffer, and the buffer 155 serves as the fifth buffer. The resistors 121~124 not only work as the reference voltage generating circuit 111 but also operate as a criterial voltage generating circuit of the present invention.

Figure 35B:
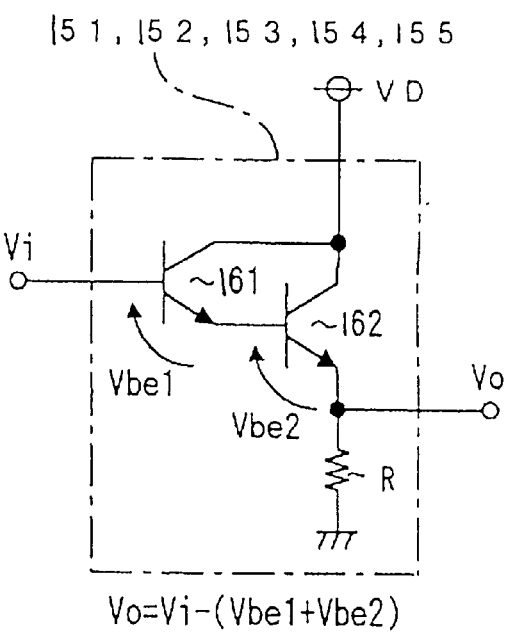
Figure 35C:
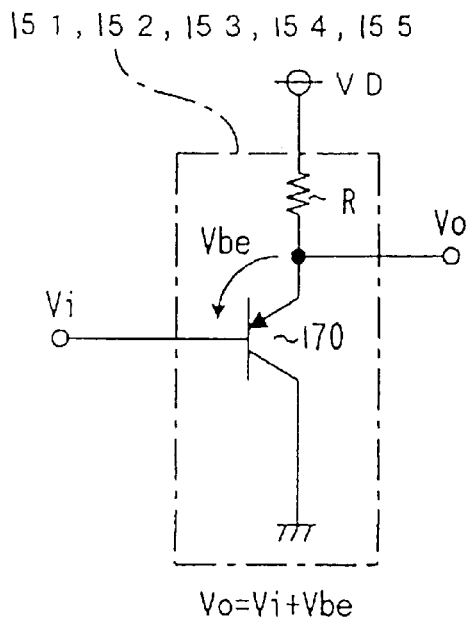
Figure 35D:
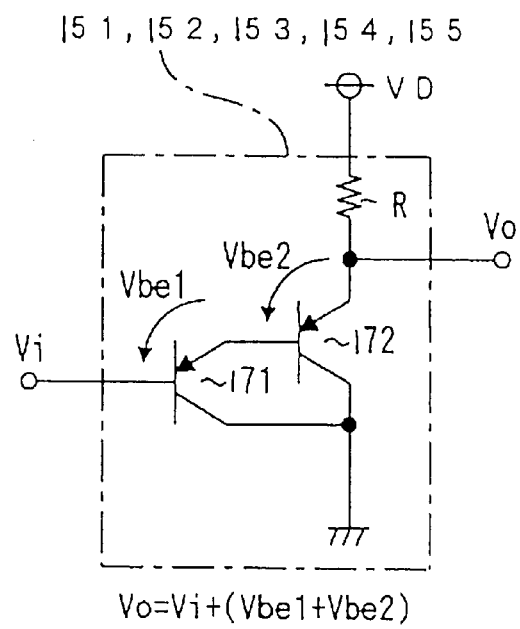

Besides the level shift circuit shown in FIG. 35A, each of the buffers 151~155 can be constituted by any other level shift circuits shown in FIGS. 35B, 35C, and 35D.

First, the level shift circuit shown in FIG. 35B differs from the level shift circuit shown in FIG. 35A in that the NPN transistor 160 is replaced by two NPN transistors 161 and 162 connected by a Darlington connection. The first-stage NPN transistor 161 has a base serving as an input terminal of the buffer. The second-stage NPN transistor 162 has an emitter serving as an output terminal of the buffer.

In the level shift circuit of FIG. 35B, it is now assumed that "Vbe1" represents a base-emitter voltage of the first-stage NPN transistor 161 and "Vbe2" represents a base-emitter voltage of the second-stage NPN transistor 162. This level shift circuit produces an output voltage Vo (=Vi −(Vbe (Vbe1+Vbe2)) by shifting an input voltage Vi to the lower-voltage side by a voltage "Vbe1+Vbe2." In this case, the specific voltage Vsf for shifting the input voltage Vi is equal to "−(Vbe1+Vbe2)."

Next, the level shift circuit shown in FIG. 35C comprises a PNP transistor 170 having a collector connected to the ground terminal, and a resistor R connected between an emitter of the PNP transistor 170 and the power voltage terminal (i.e., a higher-voltage terminal generating the power voltage VD). A base of the PNP transistor 170 serves as the input terminal of the buffer, while the emitter of the PNP transistor 170 serves as the output terminal of the buffer. In other words, the level shift circuit shown in FIG. 35B differs from the level shift circuit shown in FIG. 35A in that the NPN transistor 160 is replaced by the PNP transistor 170.

According to the level shift circuit of FIG. 35C, an output voltage Vo (=Vi+Vbe) is produced by shifting an input voltage Vi to the higher-voltage side by the base-emitter voltage Vbe. In this case, the specific voltage Vsf for shifting the input voltage Vi is equal to "Vbe."

Next, the level shift circuit shown in FIG. 35D differs from the level shift circuit shown in FIG. 35C in that the PNP transistor 170 is replaced by two PNP transistors 171 and 172 connected by a Darlington connection. The first-stage PNP transistor 171 has a base serving as an input terminal of the buffer. The second-stage PNP transistor 172 has an emitter serving as an output terminal of the buffer.

In the level shift circuit of FIG. 35D, it is now assumed that "Vbe1" represents a base-emitter voltage of the first-stage PNP transistor 171 and "Vbe2" represents a base-emitter voltage of the second-stage PNP transistor 172. This level shift circuit produces an output voltage Vo (=Vi+ (Vbe1+Vbe2)) by shifting an input voltage Vi to the higher-voltage side by a voltage "Vbe1+Vbe2." In this case, the specific voltage Vsf for shifting the input voltage Vi is equal to "(Vbe1+Vbe2)."

Twentieth Embodiment

Next, a twentieth embodiment of the present invention will be explained with reference to FIG. 36. The twentieth embodiment is a pressure detecting apparatus 180 serving as a physical quantity detecting apparatus incorporating the sensor abnormality detecting circuit described in any one of the abovedescribed sixteenth to nineteenth embodiments.

Figure 36:
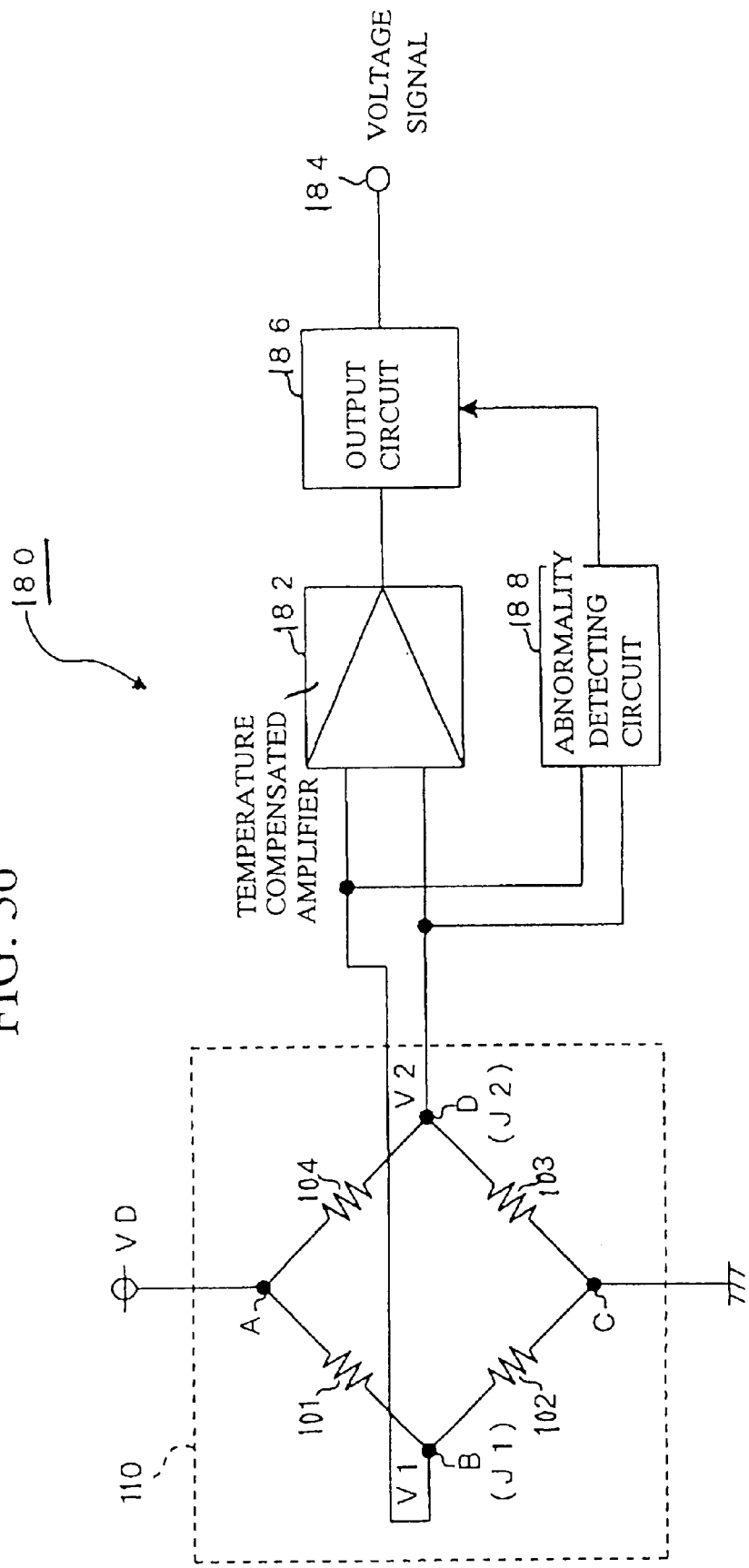
FIG. 36 is a circuit diagram showing the arrangement of a pressure detecting apparatus in accordance with a twentieth embodiment of the present invention.

As shown in FIG. 36, the pressure detecting apparatus 180 comprises the above-described pressure sensor 110, an amplifier 182 receiving the first output voltage V1 and the second output voltage V2 of the pressure sensor 110 to amplify a voltage difference of the output voltages V1 and V2 and outputting an analog pressure signal corresponding to a pressure P detected by the pressure 110 (e.g., a voltage signal of 0.5V~4.5V corresponding to a sensing signal representing a sensed physical quantity), an output terminal 184 outputting an output signal of the amplifier 182 to an external device, an output circuit 186 provided between the output terminal 84 and the amplifier 182, and a sensor abnormality detecting circuit 188.

The sensor abnormality detecting circuit 188 is any one of the sensor abnormality detecting circuit described in any one of the above-described sixteenth to nineteenth embodiments (refer to FIGS. 31 to 34). The sensor abnormality detecting circuit 188 detects the abnormality of the pressure sensor 110. The amplifier 182 has a temperature compensating function.

When the window comparator 127 (more specifically, the OR gate 132) of the abnormality detecting circuit 88 produces a low-level signal, the output circuit 186 directly outputs the output of the amplifier 182 to the output terminal 184.

On the other hand, when the window comparator 127 produces a high-level signal (i.e., in an abnormal situation), the output circuit 186 produces a specific voltage (e.g., a voltage not larger than 0.3V or not smaller than 4.7V) outside the above normal voltage range of 0.5V~4.5V.

Accordingly, when the window comparator 127 produces the signal indicating the abnormality of pressure sensor 110, the pressure detecting apparatus 180 outputs a specific voltage which is different from a normal voltage to notify the occurrence of abnormality of the pressure sensor 110.

In this manner, according to the pressure detecting apparatus 180 of the twentieth embodiment, an electronic control apparatus or other apparatus which detects a sensed pressure based on the analog voltage signal received from the pressure detecting apparatus 180 can immediately know the occurrence of abnormality in the pressure sensor 110 upon receiving the specific voltage (e.g., the voltage not larger than 0.3V or not smaller than 4.7V) outside the above normal voltage range. There is no necessity of providing a separate signal line.

The present invention is not limited to the above-described sixteenth to twentieth embodiments, and therefore can be applied to various embodiments.

For example, in the sensor abnormality detecting circuit shown in FIG. 32, it is preferable to provide a buffer (corresponding to the third buffer) similar to the buffers 117 and 118 between the connecting point of the resistors 122 and 123 and the non-inverting input terminal of the operational amplifier 112. In other words, in the abnormality detecting circuit shown in FIG. 34, each of the buffers 151~155 can be replaced by a buffer constituting the voltage-follower circuit including an operational amplifier.

Furthermore, in the sensor abnormality detecting circuit shown in FIG. 33, it is preferable to provide a buffer constituting the voltage-follower circuit between the connecting point of the resistors 122 and 123 and the connecting point of the resistors 142 and 145, so that the reference voltage VE is applied via this buffer to the connecting point of the resistors 142 and 145 and to the non-inverting input terminal of the operational amplifier 112. With this arrangement, it becomes possible to completely avoid the deviation of the reference voltage VE, thereby enabling a highly-accurate abnormal detection. When the resistance values of the resistors 121~124 are sufficiently small compared with the resistance values of the resistors 142~146, the reference voltage VE does not largely deviate. Thus, such a buffer can be provided if required.

Furthermore, in the sensor abnormality detecting circuit shown in FIG. 33, it is preferable to provide a buffer between the first output terminal J1 of the pressure sensor 110 and the first differential amplifier 135 and a buffer between -the second output terminal J2 of the pressure sensor 110 and the second differential amplifier 136.

Although each of the above-described abnormality detecting circuits is to detect the abnormality of the pressure sensor 110. The present invention is not limited to the above-described pressure sensor, and is therefore applicable to an acceleration sensor or other sensors.

Furthermore, when the equilibrium voltage V0 does not vary in the normal operating condition (for example, when the power voltage VD of the pressure sensor 110 in the above-described embodiments does not vary), it is possible to use constant voltage circuits for generating the reference voltage VE and the first and second criterial voltages VH and VL.

In general, operational amplifiers and comparators are not free from error caused by the offset voltage. However, in the above formulas, such an error is neglected. Moreover, in the abnormality detecting circuits shown in FIGS. 32 and 33 and their modifications, the buffers can be constituted by any other circuit other than the voltage-follower circuit including an operational amplifier.

Twenty-first Embodiment

Next, a practical circuit arrangement relating to the third embodiment shown in FIGS. 4 and 5 will be explained.

Figure 37:
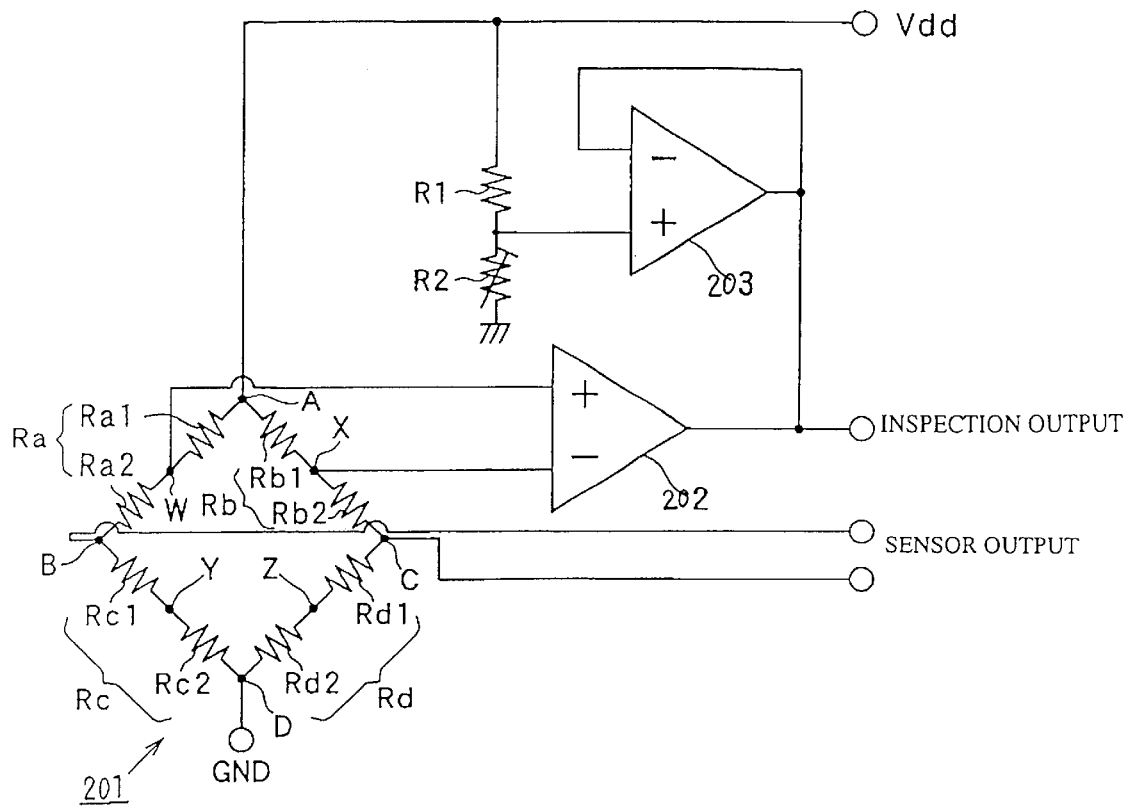
FIG. 37 is a circuit diagram showing the arrangement of a pressure sensor in accordance with a twenty-first embodiment of the present invention.

FIG. 37 shows a circuit arrangement of a semiconductor sensor in accordance with a twenty-first embodiment of the present invention.

The pressure sensor shown in FIG. 37 comprises a sensing portion 201 generating a sensor output responsive to a pressure applied on this pressure sensor. The sensing portion 201 is a Wheatstone's bridge circuit consisting of four strain gauge resistors Ra, Rb, Rc and Rd.

The Wheatstone's bridge circuit forms a quadrate circuit by serially connecting four resistors Ra~Rd in a closed shape to have four connecting points A, B, C, and D. The opposed connecting points A and D are connected to a power source Vdd and the earth (GND). A sensor output is produced based on a voltage difference between the opposed connecting points B and C of the Wheatstone's bridge circuit. The connecting point A connected to the power source Vdd is referred to as a power source terminal. The connecting point D connected to the earth is referred to as a ground terminal. The connecting points B and C cooperatively generating the sensor output are referred to as first and second output terminals.

In the Wheatstone's bridge circuit, each of the resistors Ra~Rd is equally divided into two resistors. More specifically, the resistor Ra consisting of separate resistors Ra1 and Ra2 is disposed between the power source terminal and the first output terminal B. The resistor Rb consisting of separate resistors Rb1 and Rb2 is disposed between the power source terminal and the second output terminal C. The resistor Rc consisting of separate resistors Rc1 and Rc2 is disposed between the first output terminal B and the ground terminal D. The resistor Rd consisting of separate resistors Rd1 and Rd2 is disposed between the second output terminal C and the ground terminal D.

A connecting point of the separate resistors Ra1 and Ra2 is referred to as intermediate terminal W, while a connecting point of the separate resistors Rb1 and Rb2 is referred to as intermediate terminal X. The connecting points W and V are a combination of intermediate terminals having the same voltage level when no pressure is applied. A voltage difference $V_{WX}$ between the intermediate terminals W and X is used as an inspection output. More specifically, an amplifier 202 amplifies the voltage difference $V_{WX}$ between the intermediate points W and X. An output voltage of the amplifier 202 is used as the inspection output.

When $V_{BC}$ represents a voltage difference between the first and second output terminals B and C, the relationship between the voltage difference $V_{WX}$ and the voltage difference $V_{BC}$ is defined by the following formula 3-1. Thus, the sensor abnormality detection is performed by checking whether the following relationship is established or not.

$$|V_{BC}|=2\times|V_{WX}| \quad (3\text{-}1)$$

An output of the amplifier 202 is connected to an output of the voltage-follower circuit serving as an adjusting means. The voltage-follower circuit is constituted by an operational amplifier 203. A reference voltage of the voltage-follower circuit is given from the power voltage Vdd based on a voltage division by resistors R1 and R2. A resistance value of the resistor R2 is adjustable by trimming. The output voltage level of the amplifier 202 is raised by an output voltage of the voltage-follower circuit. Thus, the offset adjustment of the output of the amplifier 202 is realized.

According to the above-described pressure sensor, it becomes possible to adjust an error component of the inspection output by adjusting the resistance of the resistor R2. Hence, even if the inspection output involves an error, such an error can be reduced by adjusting the sensitivity and an offset amount of the sensor output as well as a temperature offset amount. Furthermore, according to the adjustment of this embodiment, the error component adjustment of the inspection output is performed independent of the error component adjustment of the sensor output. Thus, the adjustment of the inspection output is performed without giving any bad influence to the sensor output. The adjustment of this embodiment gives no bad influence to the accuracy of each sensor. The sensor abnormality detection is accurately performed.

Figure 38:
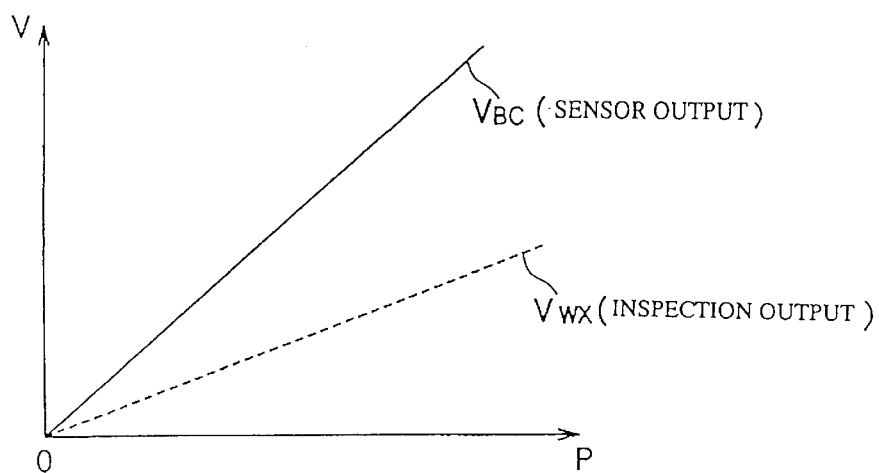
FIG. 38 is a graph showing the relationship between a sensor output and an inspection output in accordance with the twenty-first embodiment of the present invention.

Furthermore, according to the arrangement of this embodiment, when both of the sensor output and the inspection output are normal, the voltage difference $V_{WX}$ between the intermediate terminals W and X becomes equal to a half of the voltage difference $V_{BC}$ between the first output terminal B and second output terminal C. FIG. 38 shows a relationship of the voltage difference $V_{BC}$ and the voltage difference $V_{WX}$.

Therefore, by adjusting the gain of the amplifier 38 so as to equalize the sensor output with the inspection output, it becomes possible to inspect the abnormality of the sensor output based on a comparison between the sensor output and the inspection output.

The zero point position of the inspection output, i.e., the value of output voltage $V_{WX}$ at the time the pressure P is zero, is adequately adjustable by trimming adjustment of the resistor R2. Thus, the characteristics vary in accordance with this adjustment.

Various Modifications

According to the above-described twenty-first embodiment, the inspection output is produced based on a voltage difference $V_{WX}$ between the intermediate terminals W and X. However, in the circuit arrangement of FIG. 37, it is possible to produce the inspection output based on a voltage difference $V_{YZ}$ between an intermediate terminal Y of the separate resistors Rc1 and Rc2 and an intermediate terminal Z of the separate resistors Rd1 and Rd2. Although the above-described embodiment uses a combination of separate resistors for each of the gauge resistors Ra~Rd, it is not necessary to separate the gauge resistors not used for detecting the inspection output.

Instead of trimming the resistor R2, it is possible to trim the other resistor R1.

Furthermore, the above-described twenty-first embodiment produces the sensor output and the inspection output separately. The trimming adjustment needs to be done independently by using different terminals. However, when the two outputs are selectively output by a multiplexer or the like, the trimming adjustment can be done by using only one output terminal.

Furthermore, according to the above-described twenty-first embodiment, each of the four gauge resistors constituting a Wheatstone's bridge is uniformly divided into two separate resistors. However, the division number of each gauge resistor is not limited to two, and therefore can be increased to three or more. Furthermore, it is possible to differentiate the division number of the resistors Ra and Rb from the division number of the resistors Rc and Rd, as far as the inspection output is produced based on a voltage difference between the intermediate terminals having the same voltage level when no pressure is applied on the sensor.

According to the above-described twenty-first embodiment, the adjustment of the error component is performed by the trimming including the laser trimming and the electric trimming. However, the present invention can be applied to a case where the error component is electrically memorized in an EPROM etc.

The physical quantity detecting sensor of the present invention is not limited to the above-described pressure sensor. Thus, the present invention can be applied to an acceleration sensor or any other sensors.

Twenty-second Embodiment

Next, a twenty-second embodiment of the present invention will be explained with reference to FIGS. 39A to 41. The twenty-second embodiment relates to a practical sensor arrangement relating to the above-described sixth embodiment. A pressure sensor in accordance with this embodiment is applicable to a hydraulic control system requiring higher reliability, such as an automotive braking apparatus controlling a hydraulic braking pressure or a fuel injection apparatus controlling a fuel pressure.

Figure 39A:
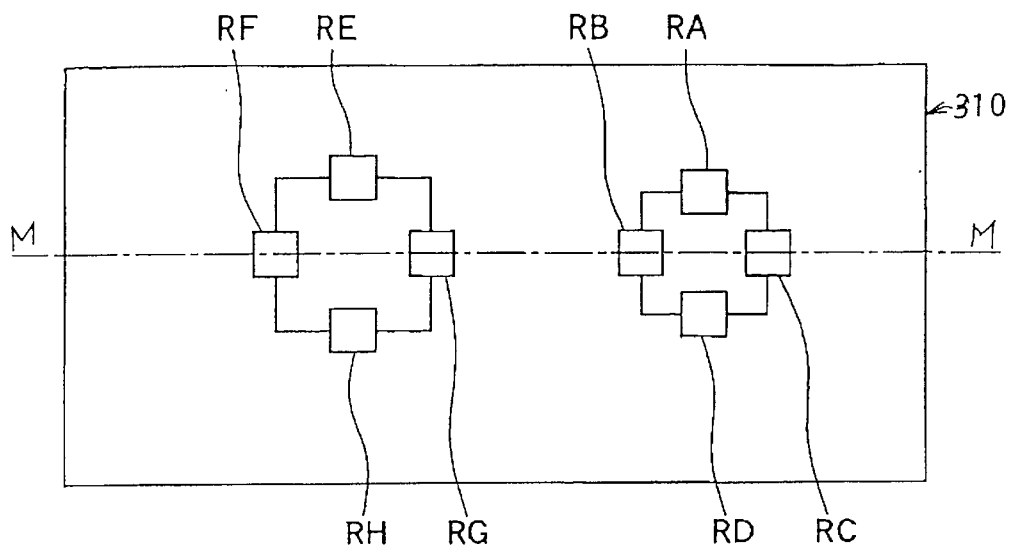
FIG. 39A is a plan view showing a diaphragm portion of a pressure sensor in accordance with a twenty-second embodiment of the present invention.
Figure 39B:
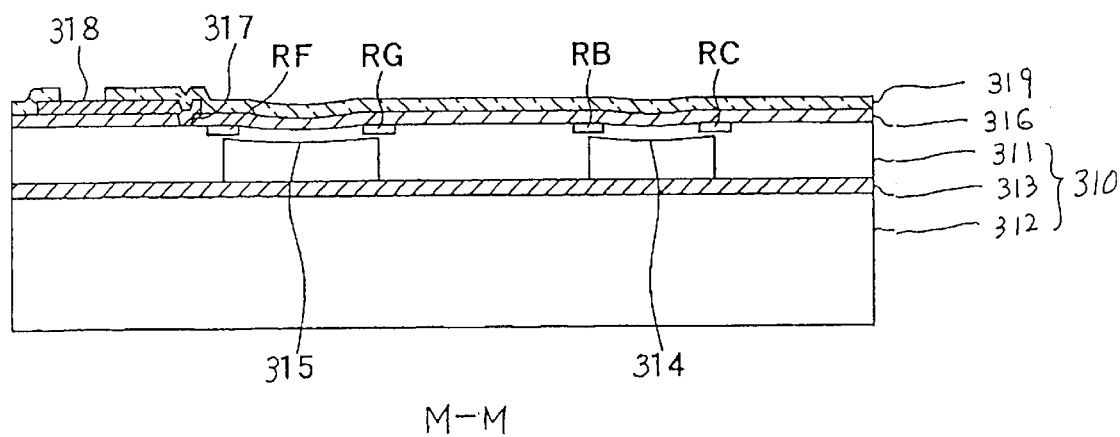
FIG. 39B is a cross-sectional view showing the pressure sensor taken along a line M—M of FIG. 39A.

FIG. 39A is a plan view showing diaphragm portions of a pressure sensor of this embodiment. FIG. 39B is a cross-sectional view of the pressure sensor taken along a line M—M of FIG. 39A. The pressure sensor of this embodiment comprises a SOI (silicon on insulator) substrate 310 as a semiconductor substrate. The SOI substrate 310 comprises a first silicon substrate 311 and a second silicon substrate 312 bonded via an oxide film 313. Two diaphragm portions (i.e., thin-plate portions) 314 and 315 are formed on the first silicon substrate 311 by etching. According to the pressure sensor of this embodiment, the first diaphragm portion 314 has a size (i.e., area) of 45 $\mu$m×45 $\mu$m. The second diaphragm portion 315 has a size (i.e., area) of 60 $\mu$m×60 $\mu$m. The first and second diaphragm portions 314 and 315 have the same thickness of 8.5 $\mu$m.

A plurality of gauge resistors (e.g., diffused resistors) RA~RD, each being a piezo-resistive element, are formed on each of the diaphragm portions 314 and 315 of the first substrate 311. According to this embodiment, the diffused resistors have a (100) surface. The diffused resistors RA~RD and RE~RH are arranged to form first and second bridge circuits, respectively. An insulating film 316, made of a silicon oxide film, is formed on the substrate surface. A contact hole 317 is formed so as to extend across this insulating film 316. A patterning of Al wiring 318 is formed in the region of the contact hole 317 on the insulating film 316. A protective film (e.g., passivation film) 319 covers the insulating film 316 and the Al wiring 318.

According to the above-described embodiment, the diffused resistors RA~RD cooperatively detect a distortion of the first diaphragm portion 314 when a pressure is applied on this diaphragm portion 314. The diffused resistors RA~RD cooperatively detect a distortion of the second diaphragm portion 315 when a pressure is applied on this diaphragm portion 315. Each sensor signal thus detected is sent to a signal processing circuit which is provided externally. The signal processing circuit outputs an electric signal representing a sensed pressure.

Figure 40:
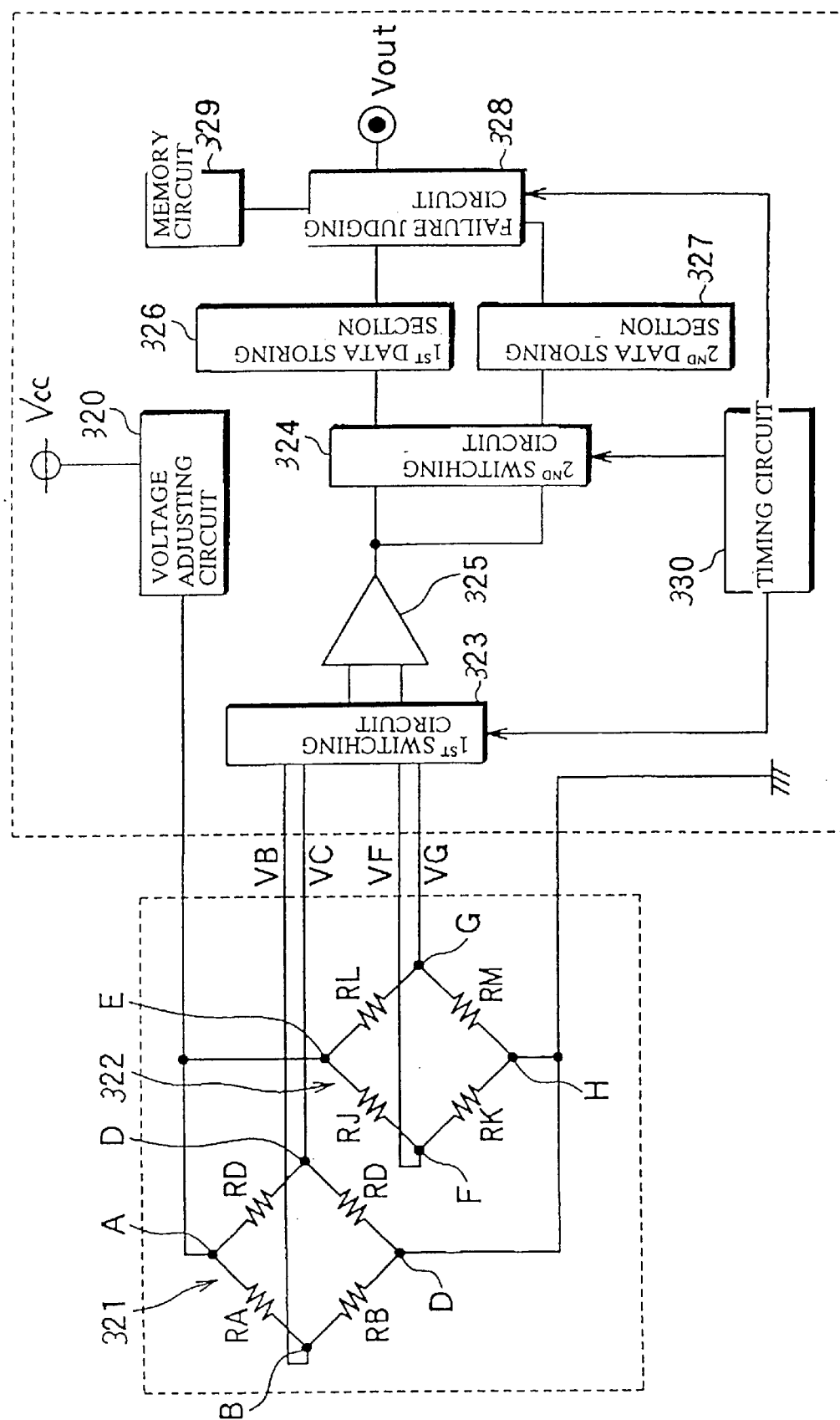
FIG. 40 is a circuit diagram showing a schematic arrangement of a pressure sensor in accordance with the twenty-second embodiment of the present invention.

FIG. 40 shows a schematic circuit arrangement of the pressure sensor in accordance with this embodiment. As shown in FIG. 40, a voltage adjusting circuit 320 receives a constant voltage Vcc supplied from a constant voltage source and converts it into a predetermined voltage (e.g., 5V). The converted voltage is supplied to the bridge circuits 321 and 322. A first bridge circuit 321 is constituted by the diffused resistors RA~RD formed on the first diaphragm portion 314, so as to serve as a pressure detecting circuit. Similarly, a second bridge circuit 322 is constituted by the diffused resistors RE~RH formed on the second diaphragm portion 315, so as to serve as a failure detecting circuit.

Two bridge circuits 321 and 322 are connected in parallel with each other and produce midpoint voltages VB and VC and midpoint voltages VF and VG, respectively. A first switching circuit 323 selectively switches the output signals of two bridge circuits 321 and 323. An amplification circuit 325 amplifies the selected output signals produced from the first switching circuit 323. A second switching circuit 324 performs a switching operation for storing the amplified output signals of the bridge circuit 321 into a first data storing section 326 and for storing the amplified output signals of the other bridge circuit 322 into a second data storing section 327. A failure judging circuit (i.e., a diagnosis circuit) 328 compares the output data stored in the first data storing section 326 and the second data storing section 327. The failure judging circuit 328 performs the failure judgement based on the output values of two bridge circuits 321 and 322. To avoid confusion of data, a timing circuit 330 controls the timing of the first and second switching circuits 323 and 324.

According to this embodiment, the signal processing circuit including the amplification circuit 325 and the failure judging circuit 328 is formed together with the bridge circuits 321 and 322 having the diaphragm portions 314 and 315 on the same semiconductor substrate.

Figure 41:
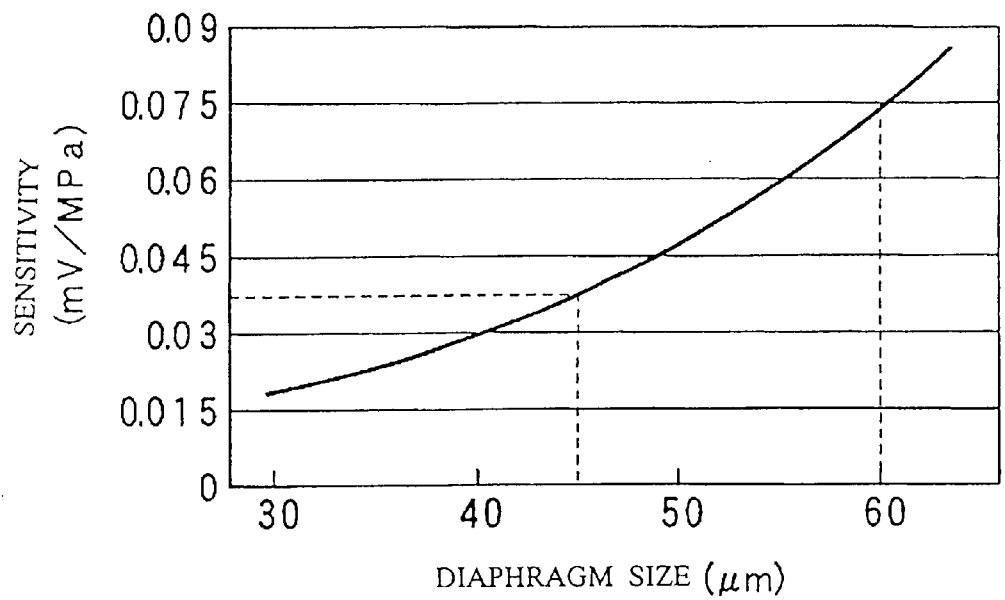
FIG. 41 is a graph showing a relationship between a size of the diaphragm portion and its sensitivity.

FIG. 41 shows a relationship between the size (i.e., area) of diaphragm portions 314 and 315 of the silicon substrate 310 and output (i.e., sensitivity) of the bridge circuits 321 and 322. As shown in FIG. 41, the sensitivity increases in proportion to the size of the diaphragm portion. For example, according to the pressure sensor oft his embodiment, the failure detecting bridge circuit 322 formed on the second diaphragm portion 315 of 60 μm×60 μm can produce an output equivalent to two times the output of the pressure detecting bridge circuit 321 formed on the first diaphragm portion 314 of 45 μm×45 μm. In other words, this embodiment provides the failure detecting bridge circuit 322 having a higher sensitivity compared with that of the pressure detecting bridge circuit 321.

The failure detection of the pressure sensor in accordance with this embodiment is performed in the following manner. First, the output voltage change characteristic of the pressure detecting bridge circuit 321 to a pressure applied on the first diaphragm portion 314 as well as the output voltage change characteristic of the failure detecting bridge circuit 322 to a pressure applied on the second diaphragm portion 315 are stored in advance in a memory circuit 329. To obtain these output voltage change characteristics, it is necessary to measure the output values of the bridge circuit 321 and 322 at least at two pressure points. Considering the nature of output voltage changes of the bridge circuits 321 and 322 which may not be linear, it is desirable to arbitrarily obtain output values at three or more pressure points to obtain accurate change characteristics.

Figure 42:
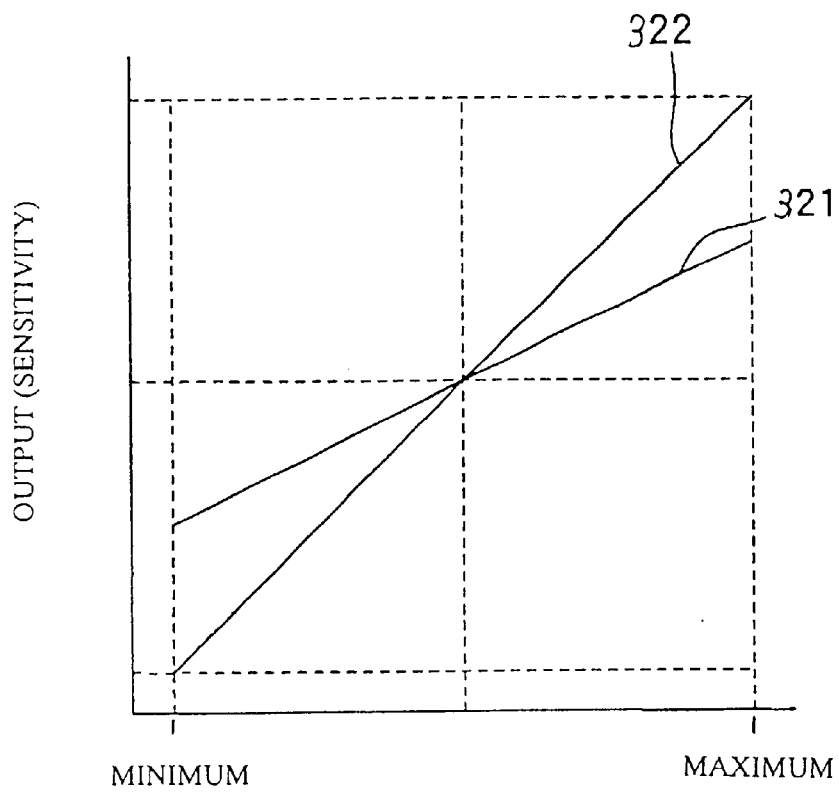
FIG. 42 is a graph showing output characteristics of a bridge circuit of the pressure sensor in accordance with the pressure sensor in accordance with the twenty-first embodiment of the present invention.

The relationship between the output values of two bridge circuits 321 and 322 is a fixed relationship as shown in FIG. 42. Namely, when the operation of the pressure sensor is normal, the output values of two bridge circuits 321 and 322 at a certain pressure point are always the same respectively. Accordingly, during the operation of the pressure sensor, the output of the pressure detecting bridge circuit 321 is compared with the output of the failure detecting bridge circuit 322. If the measured output relationship is not identical with the memorized relationship stored in the memory circuit 329, it can be judged that the bridge circuit 321 does not operate normally.

In this case, this embodiment sets the sensitivity of the failure detecting bridge circuit 322 to be higher than that of the pressure detecting bridge circuit 321 by differentiating the size of two diaphragm portions 314 and 315. Accordingly, the failure detecting bridge circuit 322 can promptly detect the failure or deterioration (breakage etc) of the diaphragm portion prior to the pressure detecting circuit 321. Thus, it becomes possible to perform the highly accurate sensor failure detection. The reliability of the sensor is improved, and safety against the failure can be ensured.

According to this embodiment, when any sensor failure is detected, the failure judging circuit 328 forcibly shifts its sensor output to a diagnosis region different from an ordinary output voltage range (e.g., 0.5~4.5V) and generates an abnormal signal indicating occurrence of abnormality.

Furthermore, this embodiment can correct the temperature characteristics of the bridge circuit by providing the bridge circuits having two different output change characteristics.

Various Modifications

Figure 43:
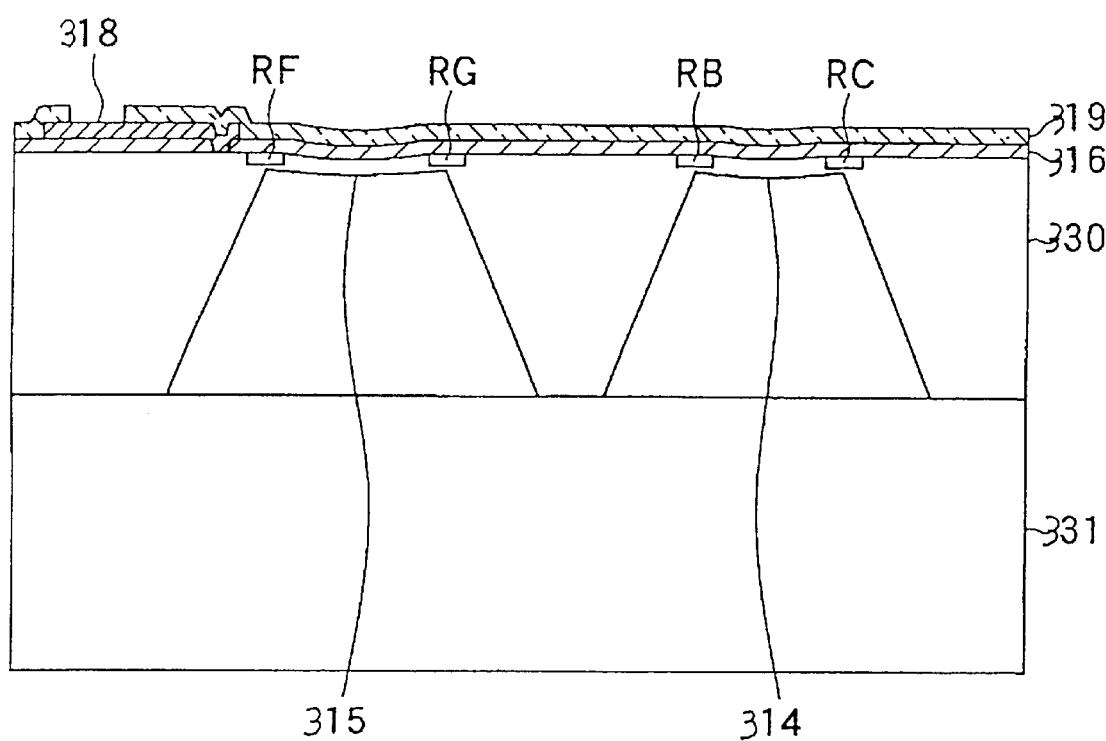
FIG. 43 is a cross-sectional view showing the diaphragm portion of a pressure sensor in accordance with a modified twenty-second embodiment of the present invention.

According to the above-described embodiment, the pressure sensor uses a SOI substrate as a semiconductor substrate. However, the present invention is applicable to a pressure sensor using a single-crystal silicon substrate shown in FIG. 43. The pressure sensor shown in FIG. 43 comprises two diaphragm portions 314 and 315 formed on a single-crystal silicon substrate 330. The diffused resistors RA~RD having a (100) surface are formed on the first diaphragm portion 314. Similarly, the diffused resistors RE~RH having a surface (100) are formed on the second diaphragm portion 315. The single-crystal silicon substrate 330 is bonded on a glass pedestal 331 by an anode bonding. The pressure sensor of this arrangement brings substantially the same effects as those of the pressure sensor of the above-described embodiment.

Furthermore, as the pressure sensor of the above-described embodiment comprises two diaphragm portions 314 and 315, it is possible to provisionally use the failure detecting bridge circuit 322 as a pressure detecting bridge circuit in case of failure of the pressure detecting bridge circuit 321.

According to the pressure sensor of the above-described embodiment, different outputs are obtained from two bridge circuits by differentiating the size of the diaphragms 314 and 315. However, it is possible to differentiate the thickness of the second diaphragm portion 315 to be smaller than the thickness of the first diaphragm portion 314 to obtain different outputs from respective bridge circuits.

Furthermore, according to the above-described embodiment, two diaphragm portions are formed on a silicon substrate. However, it is possible to form three or more diaphragm portions on this silicon substrate to provide bridge circuits having different output change characteristics.

Furthermore, according to the above-described embodiment, both the pressure detecting bridge circuit and the failure detecting bridge circuit are constituted by diffused resistors. However, it is possible to replace the diffused resistors by thin-film resistors.

Moreover, according to the above-described embodiment, both the pressure detecting circuit and the failure detecting circuit are constituted by bridge circuits. However, it is possible to use a capacitive sensor.

Twenty-third Embodiment

Figure 44:
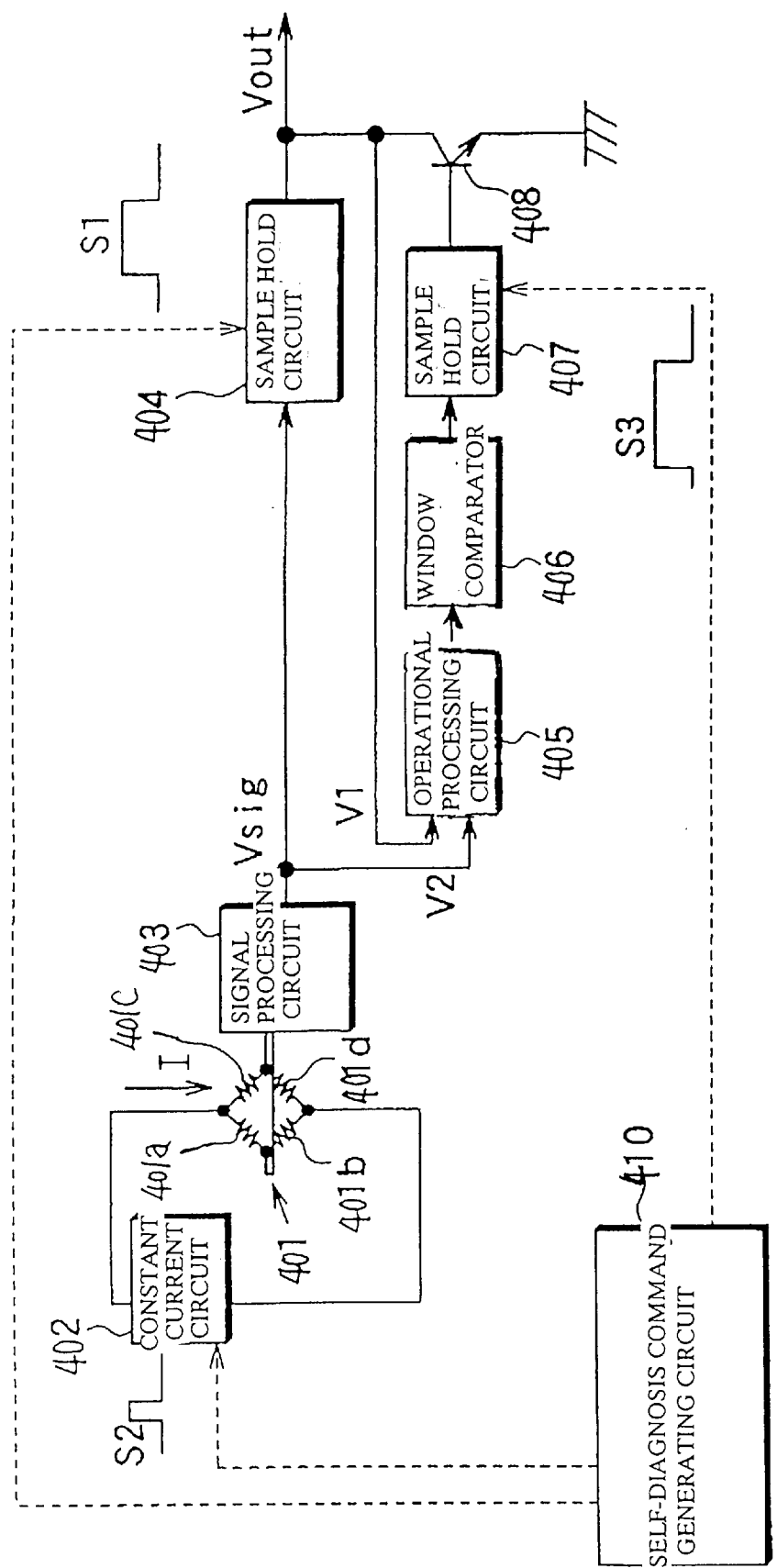
FIG. 44 is a circuit diagram showing the arrangement of a pressure sensor in accordance with a twenty-third embodiment of the present invention.

A twenty-third embodiment is characterized in that the same bridge circuit is commonly used for pressure detection and for sensor abnormality detection. FIG. 44 shows a circuit arrangement of a pressure sensor serving as a dynamic quantity detecting sensor in accordance with a twenty-third embodiment of the present invention. Hereinafter, the pressure sensor of the twenty-third embodiment will be explained with reference to FIG. 44.

The pressure sensor shown in FIG. 44 is used for detecting a hydraulic braking pressure or the like in an automotive vehicle. As shown in FIG. 44, the pressure sensor comprises a sensing portion 401 constituted by a bridge circuit consisting of four strain gauge (i.e., diffused resistors) 401a~401d. A constant current circuit 402 generates a constant current I. A signal processing circuit 403 processes an output signal of the sensing portion 401. A sample hold circuit (i.e., first sample hold circuit) 404 holds an output of the signal processing circuit 403 at a predetermined timing. A self-diagnosis command generating circuit 410, serving as a timing circuit, generates a self-diagnosis command at a predetermined timing.

The constant current I generated from the constant current circuit 402 is applied to the sensing portion 401. The sensitivity of the sensing portion 1 varies in response to this current I.

The current I supplied from the constant current circuit 402 is changeable in its magnitude based on a self-diagnosis command signal S2 sent from the self-diagnosis command generating circuit 410. More specifically, the current I is set to a constant current I1 for detecting a pressure (hereinafter, referred to as pressure detection), and is set to a diagnostic current I2 for detecting the abnormality of the pressure sensor (hereinafter, referred to as diagnosis).

Meanwhile, the voltage levels of respective midpoints of the bridge circuit vary in response to an applied pressure. An output of the sensing portion 401 is produced based on a voltage difference between the midpoints of the bridge circuit. The signal processing circuit 3 including an amplifier amplifies the output of the sensing portion 401. The amplified signal, serving as a sensor output, is supplied to an external device via a sample hold circuit 404.

Figure 45:
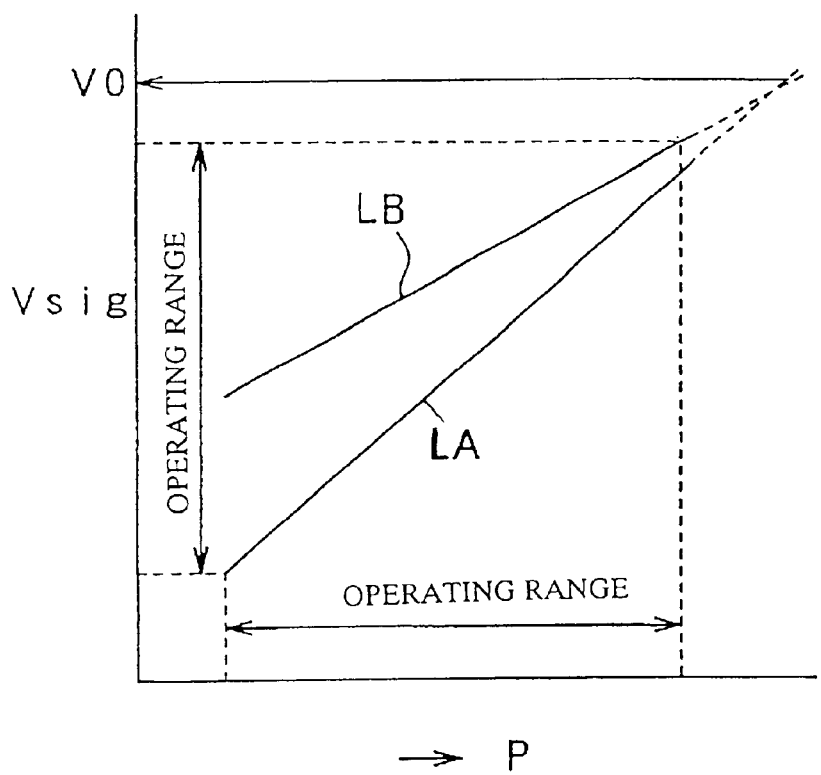
FIG. 45 is a graph showing the relationship between applied pressure P and output voltage Vsig corresponding to each of constant current I1 and diagnostic current I2 in accordance with the twenty-third embodiment of the present invention.

An output voltage Vsig of the signal processing circuit 403 is correspondent to an ordinary operating range of the pressure sensor. For example, when the power source voltage is 5V, the signal processing circuit 403 is set to produce an analog signal of 0.5~4.5V. FIG. 45 shows the relationship between applied pressure P and output voltage Vsig. A straight line LA represents the characteristics obtained when the constant current I1 flows across the sensing portion 401 during the pressure detection. Another straight line LB represents the characteristics obtained when the constant current I2 flows across the sensing portion 401 during the diagnosis.

When the sensor abnormality is detected as described later, the signal processing circuit 403 produces a specific output signal as an abnormality signal having a signal level different from the above-described ordinary operating range.

For example, the abnormality signal has a voltage level equal to or in the vicinity of the power source voltage or the ground potential. The abnormality signal is sent to an external system (not shown in the drawing) which receives the output signal of the pressure sensor. Thus, the external system can confirm the occurrence of abnormality in the pressure sensor.

The sample hold circuit 404 receives the output signal of the signal processing circuit 403 during the pressure detection, and directly outputs the output voltage of the signal processing circuit 403 as a sensor output Vout. Meanwhile, the sample hold circuit 404 holds the output voltage of the signal processing circuit 403 during the diagnosis performed in response to a self-diagnosis command signal S1 sent from the self-diagnosis command generating circuit 410. In this manner, the sample hold circuit 404 holds the output voltage level of the signal processing circuit 403 obtained immediately before performing the diagnosis. In other words, this makes it possible to prevent a diagnostic output signal generated from the signal processing circuit 403 from being sent to an external device during the diagnosis.

Furthermore, the pressure sensor comprises an operational processing circuit 405 performing calculation based on the output signal of the sample hold circuit 404 and the output signal of the signal processing circuit 403. An output signal (i.e., calculation result) of the operational processing circuit 405 is sent to a window comparator 406. The window comparator 6 serves as a judging circuit for judging the occurrence of abnormality in the pressure sensor. A sample hold circuit (i.e., second sample hold circuit) 407 holds the output signal of the window comparator 406.

The operational processing circuit 405 performs a predetermined calculation based on the output signal Vout of the sample hold circuit 4 and the output signal Vsig of the signal processing circuit 403. Details of the calculation performed by the operational processing circuit 405 will be explained in detail hereinafter.

As described above, during the diagnosis, the current supplied from the constant current circuit 402 is switched from the constant current I1 to the diagnostic current I2. Meanwhile, the output voltage Vout at this moment is held in the sample hold circuit 404. Thus, the sensitivity of the sensing portion 401 is increased. The relationship between the applied pressure P and the output voltage Vsig of the signal processing circuit 403 is changed to the straight line LB shown in FIG. 45.

It is now assumed that V1 represents the output voltage held in the sample hold circuit 404, P represents the pressure applied on the sensing portion 401 immediately before performing the diagnosis, S1 represents the sensitivity of the sensing portion 401, and VO represents an offset voltage corresponding to an intersection of the straight line LA and the straight line LB. The output voltage V1 is defined by the following formula 4-1.

$$V1 = S1 \times P + VO \quad (4\text{-}1)$$

Furthermore, when the sensitivity S1 is proportional to the constant current I1 with a proportionality constant K, the above formula 4-1 can be rewritten in the following manner.

$$V1 = K \times I1 \times P + VO \quad (4\text{-}2)$$

Furthermore, it is assumed that "a" represents the ratio of current I2 to current I1, i.e., I2=a×I1, where "a" is an arbitrary constant, and V2 represents the output signal Vsig of the signal processing circuit 403. The output voltage V2 is defined by the following formula 4-3.

$$V2 = K \times I2 \times P + VO \quad (4\text{-}3)$$

Accordingly, the following formula 4-4 is obtained based on the above formulas 4-2 and 4-3.

$$V2 - V1 = K \times (I2 - I1) \times P \quad (4\text{-}4)$$

Thus, the output voltage V2 is obtained by the following formula 4-5.

$$V2 = K \times (I2 - I1) \times P + V1 \quad (4\text{-}5)$$

Then, considering the relationship of I2=a×I1, the above formula 4-5 can be rewritten in the following manner.

$$V2 = K \times (a-1)I1 \times P + V1 = (a-1) \times S1 \times P + V1 = (a-1) \times (V1 - VO) + V1 = a \times V1 - (a-1) \times VO \quad (4\text{-}6)$$

For example, entering a=0.5 into the above formula 4-6 derives a result of V2=0.5×V1+0.5×VO. As apparent from the above, the formula 4-6 does not involve the pressure P as a functional factor. Thus, the relationship defined by this formula is established in an entire pressure range.

Accordingly, when the output voltage V1 responsive to the constant current I1 and the output voltage V2 responsive to the diagnostic current I2 do not satisfy the above formula 4-5, it can be concluded that the sensor characteristics is abnormal. For example, when the strain gauge 401 a is spoiled, the resistance value of strain gauge 401 a may vary undesirably. In such a case, the relationship defined by the above formula 406 may deviate. Accordingly, the operational processing circuit 405 obtains ΔV shown in the following formula 4-7.

$$\Delta V = V2 - (a \times V1 - (a-1) \times VO) \quad (4\text{-}7)$$

The window comparator 406 compares the deviation ΔV obtained by the operational processing circuit 405 with a predetermined threshold level, and checks as to whether or not the deviation ΔV is within a predetermined range. When the deviation ΔV is outside the predetermined range, the window comparator 406 generates an abnormality indicating signal representing an occurrence of abnormality in the pressure sensor. According to this embodiment, the window comparator 406 outputs a Hi level signal as the abnormality indicating signal.

The sample hold circuit 407 receives a self-diagnosis command signal S3 sent from the self-diagnosis command generating circuit 410, and holds the output signal of the window comparator 406 until the next self-diagnosis command signal is received. When the sample hold circuit 407 holds the abnormality indicating signal (i.e., Hi level signal) notifying an occurrence of abnormality in the pressure sensor, the sample hold circuit 407 turns on a transistor 408 for a predetermined duration. In response to the turning on of the transistor 408, the output voltage Vout reduces to a smaller value in the vicinity of the ground potential. In other words, the output voltage Vout goes outside the ordinary operating range producible during the pressure detection. This signal is sent to an external system receiving the output signal of the pressure sensor. Thus, the external system can confirm the occurrence of abnormality in the pressure sensor.

Figure 46:
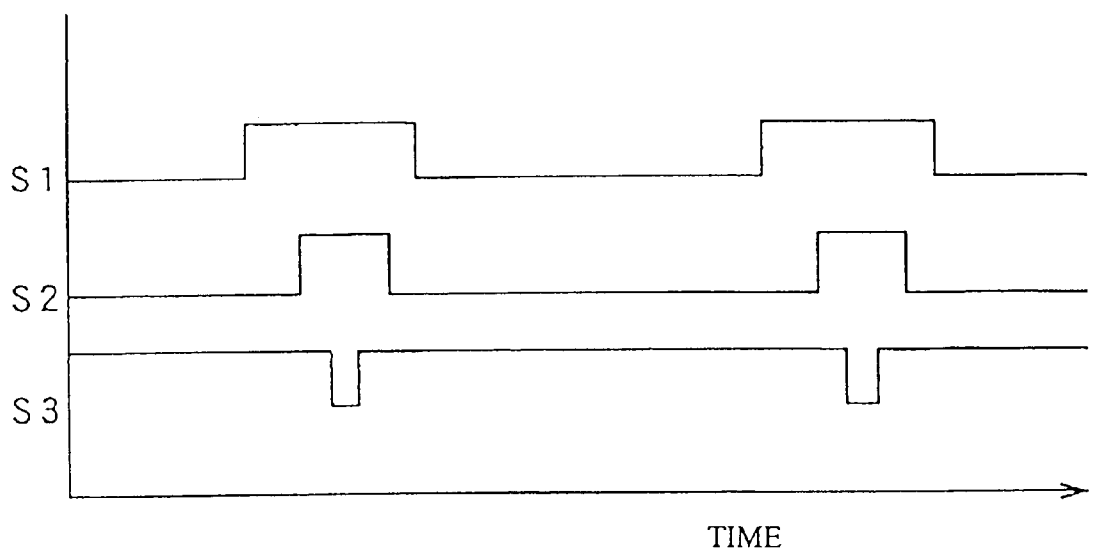
FIG. 46 is a timing chart showing generation timing of respective self-diagnosis command signals S1~S3 in accordance with the twenty-third embodiment of the present invention.

FIG. 46 is a timing chart showing the relationship of self-diagnosis command signals S1, S2 and S3 sent from the self-diagnosis command generating circuit 410 to the sample hold circuit 404, the constant current circuit 402, and the sample hold circuit 407, respectively. The operation of the pressure sensor during the diagnosis will be explained hereinafter.

As shown in FIG. 46, when generated during the diagnosis, the self-diagnosis command signals S1, S2 and S3 are transmitted to the corresponding sections in this order. First, the self-diagnosis command signal S1 is sent to the sample hold circuit 404. In response to the self-diagnosis command signal S1, the sample hold circuit 404 holds the output voltage Vout generated at this moment which corresponds to the above-described voltage V1.

Thereafter, the self-diagnosis command signal S2 is sent to the constant current circuit 402. In response to the self-diagnosis command signal S2, the constant current circuit 402 changes the current level from the constant current I1 to the diagnostic current I2. Thus, the output voltage Vsig of the signal processing circuit 403 varies to the diagnostic voltage V2. The operational processing circuit 405 performs calculation based on the voltages V1 and V2.

The window comparator 406 performs the abnormal detection based on the calculation result of the operational processing circuit 405. In this case, the self-diagnosis command signal S3 is sent to the sample hold circuit 407. In response to the self-diagnosis command signal S3, the sample hold circuit 407 holds the output of the window comparator 406.

In this manner, when the abnormality of the pressure sensor is detected, the output voltage Vout becomes a small value in the vicinity of the ground potential. When the sensor is normal, the output voltage Vout shows a voltage level responsive to the applied pressure obtained before performing the diagnosis.

The self-diagnosis command signal S1~S3 generated from the self-diagnosis command generating circuit 410 should be determined independently. Regarding the pulse width of the self-diagnosis command signal S2, it is preferable to shorten this pulse width so as not to cause a variation in the output of the sensing portion 401. It is ideal that the signal processing circuit 403 outputs the voltage V1 and the voltage V2 in response to the same pressure to perform the abnormal detection based on the voltage V1 and the voltage V2. Thus, the pulse width of the self-diagnosis command signal S2 should be so short that the pressure applied on the sensing portion 401 does not change substantially.

As explained above, the current value supplied from the constant current circuit 402 is differentiated for each of the pressure detection and the diagnosis. The abnormality detection of the pressure sensor is performed by checking whether or not the output voltage of the signal processing circuit 403 during the pressure detection and the output voltage of the signal processing circuit 403 during the diagnosis satisfies a predetermined relationship. Using such a singular circuit arrangement for the abnormality detection of the pressure sensor is advantageous in that no redundant circuit is required.

Furthermore, during the diagnosis, the sample hold circuit 404 holds the pressure signal obtained immediately before performing the diagnosis. Thus, it becomes possible to perform the abnormality detection during the pressure detection. The pressure signal responsive to the applied pressure can be produced during the diagnosis. It becomes possible to prevent the diagnostic output signal from being sent to an external device during the diagnosis.

As shown in FIG. 45, the above-described embodiment differentiates the pressure-voltage characteristics for the pressure detection from the pressure-voltage characteristics for the diagnosis. To this end, the offset voltage is set to have a voltage level outside the voltage range used as an output voltage in the ordinary operation of the pressure sensor. If the offset voltage is set within this voltage range, the straight lines LA and LB intersect each other in the ordinary operating range. In such a case, the output voltage V1 becomes equal to the output voltage V2 at the intersection (V1=V2= VO). The abnormal detection cannot be performed.

It is preferable that the pressure sensor itself has a clock function so that the self-diagnosis command signal is generated from the self-diagnosis command generating circuit 410 at predetermined intervals. Alternatively, it is preferable that the self-diagnosis command generating circuit 410 generates the self-diagnosis command signal in response to a request signal sent from an external device.

Various Modifications

According to the above-described embodiment, the sample hold circuit 407 holds its output at the same level until the next self-diagnosis command signal is sent to the sample hold circuit 407. However, it is possible to flexibly change the holding term of the sample hold circuit 407 depending on a use of the pressure sensor. For example, when the pressure sensor is abnormal, it is preferable to continuously hold the abnormal value. It is also possible to transmit a reset signal to the sample hold circuit 407 so that the holding condition is reset in response to the resent signal.

Although the above-described embodiment applies the constant current I to the sensing portion 401, the present invention is also applicable to a modified pressure sensor which applies a constant voltage to the sensing portion 401.

According to the above-described embodiment, the output voltage Vout is converted into an abnormal signal to notify the occurrence of abnormality of the pressure sensor. Namely, the same output terminal is used for outputting the sensor signal representing a sensed dynamic quantity and for outputting the abnormal signal indicating the sensor abnormality. However, it is possible to provide an independent output terminal for outputting the abnormal signal.

Furthermore, the present invention is not limited to the pressure sensor, and therefore can be applied to an accelerator sensor or other dynamic quantity detecting sensors. In this case, the pressure P is replaced by an acceleration G or the like.

Moreover, the present invention is not limited to a dynamic quantity detecting sensor having a bridge circuit serving as the sensing portion 401. The present invention can be applied to other dynamic quantity detecting sensors having other type sensing portions when their sensitivity are variable in accordance with the applied current or the applied voltage.

Twenty-fourth Embodiment

Hereinafter, a twenty-fourth embodiment of the present invention will be explained with reference to the drawings. The twenty-fourth embodiment of the present invention is characterized in that an output of an inspection bridge circuit is not influenced by the pressure detection. A pressure detecting apparatus in accordance with the twenty-fourth embodiment is applicable, for example, to a hydraulic control system requiring safety and higher reliability, such as an automotive braking apparatus controlling a hydraulic braking pressure or a fuel injection apparatus controlling a fuel pressure.

Figure 47:
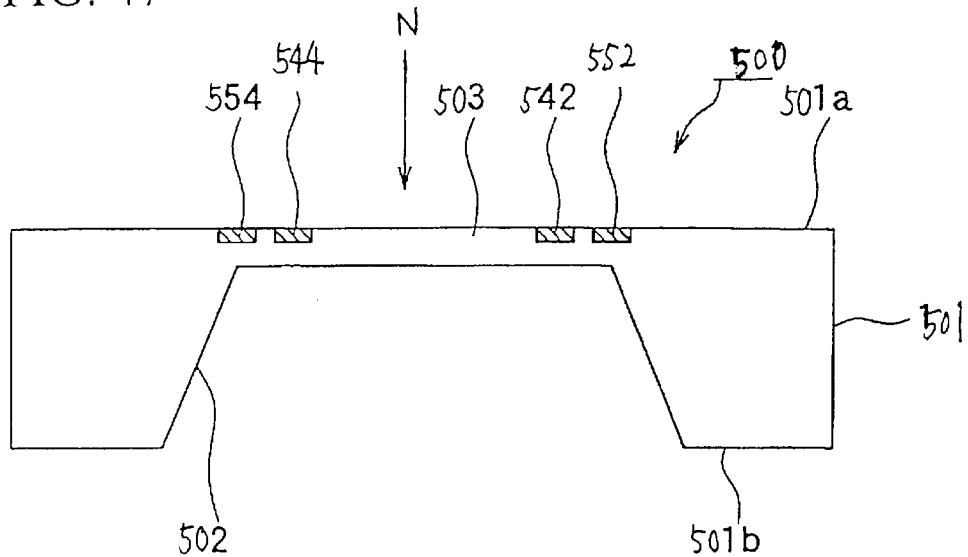
FIG. 47 is a cross-sectional view showing a schematic arrangement of a pressure detecting apparatus in accordance with a twenty-fourth embodiment of the present invention.

FIG. 47 is a schematic cross-sectional view showing a pressure detecting apparatus 500 in accordance with this embodiment of the present invention.

Figure 48:
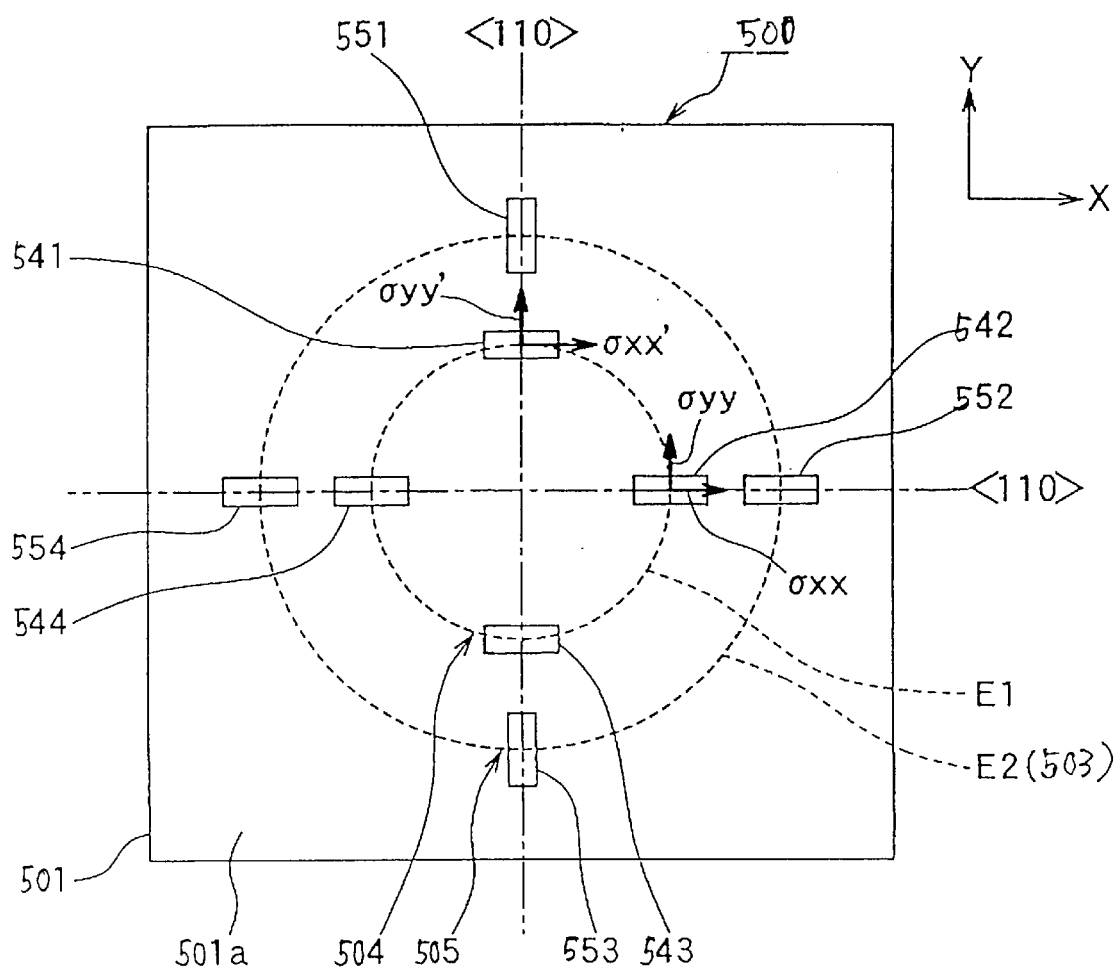
FIG. 48 is a plan view of the pressure detecting apparatus seen from the direction of an arrow N shown in FIG. 47.

FIG. 48 is a plan view of the pressure detecting apparatus 500 seen from the direction of an arrow N shown in FIG. 47. The pressure detecting apparatus 500 is formed on a silicon semiconductor substrate 501 having one surface 501a and an opposed surface 501b each having a (110) surface. The silicon semiconductor substrate 501 has a recessed portion 502 formed concaved from the surface 501b so as to form a circular diaphragm 503 at the bottom of the recessed portion 502. The diaphragm 503 is deformable when a pressure is applied thereon. For example, the recessed portion 502 is formed by providing a mask of a predetermined pattern on the opposed surface 501b and then applying anisotropic etching using KOH etc, so as to leave the diaphragm 503 at the bottom part of the recessed portion 502.

A plurality of piezoelectric resistors 541~544 and 551~554 (e.g., eight resistors in this embodiment) are formed on a (100) surface of the diaphragm 503 (i.e., on the surface 501a of the silicon semiconductor substrate 501) by a semiconductor process such as diffusion. Each of the piezoelectric resistors 541~544 and 551~554 serves as a strain gauge having a resistance value varying in accordance with a distortion of the diaphragm 503. The piezoelectric resistors 541~544 and 551~554 have the same resistance values. For example, the PCT application WO97/05464 discloses this kind of piezoelectric resistors.

The piezoelectric resistors 541~544 and 551~554 cooperatively constitute a sensing circuit of a pressure detecting apparatus 500. More specifically, the sensing circuit comprises a first bridge circuit 504 and a second bridge circuit 505. The first bridge circuit 504 generates a bridge output representing the distortion of the diaphragm 503 caused when a pressure is applied thereon. The second bridge circuit 505 detects a sensor failure.

The piezoelectric resistors 541~544 constituting the first bridge circuit 504 and the piezoelectric resistors 551~554 constituting the second bridge circuit 505 are disposed concentrically about the center of the diaphragm 503. Accordingly, the piezoelectric resistors constituting each of the bridge circuits 504 and 505 are equally spaced from the center of the diaphragm 503. FIG. 48 shows two concentric circles E1 and E2 indicated by dotted lines which correspond to the piezoelectric resistors 541~544 constituting the first bridge circuit 504 and the piezoelectric resistors 551~554 constituting the second bridge circuit 505, respectively. The outer concentric circle E2 coincides with the peripheral line of the diaphragm 503.

FIG. 48 shows two <110> crystal axes existing on the (100) surface which are normal to each other (as indicated by alternate long and short dash lines). In each of the bridge circuits 504 and 505, two of the four piezoelectric resistors are disposed in one <110> crystal axis direction while the other two are disposed in the other <110> crystal axis direction. According to this embodiment, the second bridge circuit 505 is disposed radially outside the first bridge circuit 504. However, it is possible to arrange the first and second bridge circuits 504 and 505 oppositely.

According to this embodiment, a pair of opposed piezoelectric resistors 541 and 543 constituting part of the first bridge circuit 504 cause a voltage change along a circumferential direction of the concentric circle E1 having a center identical with the center of the diaphragm 503. The other pair of opposed piezoelectric resistors 542 and 544 constitute the rest of first bridge circuit 504 cause a voltage change along a radial direction of the concentric circle E1.

Furthermore, all of the piezoelectric resistors 551~554 constitute the second bridge circuit 505 cause a voltage change along a radial direction of the concentric circle E2. As shown in FIG. 48, each of the piezoelectric resistors 541~544 and 551~554 is configured into a rectangular shape extending in its longitudinal direction. In this case, the voltage change direction of each piezoelectric resistor corresponds to the longitudinal direction thereof.

Figure 49:
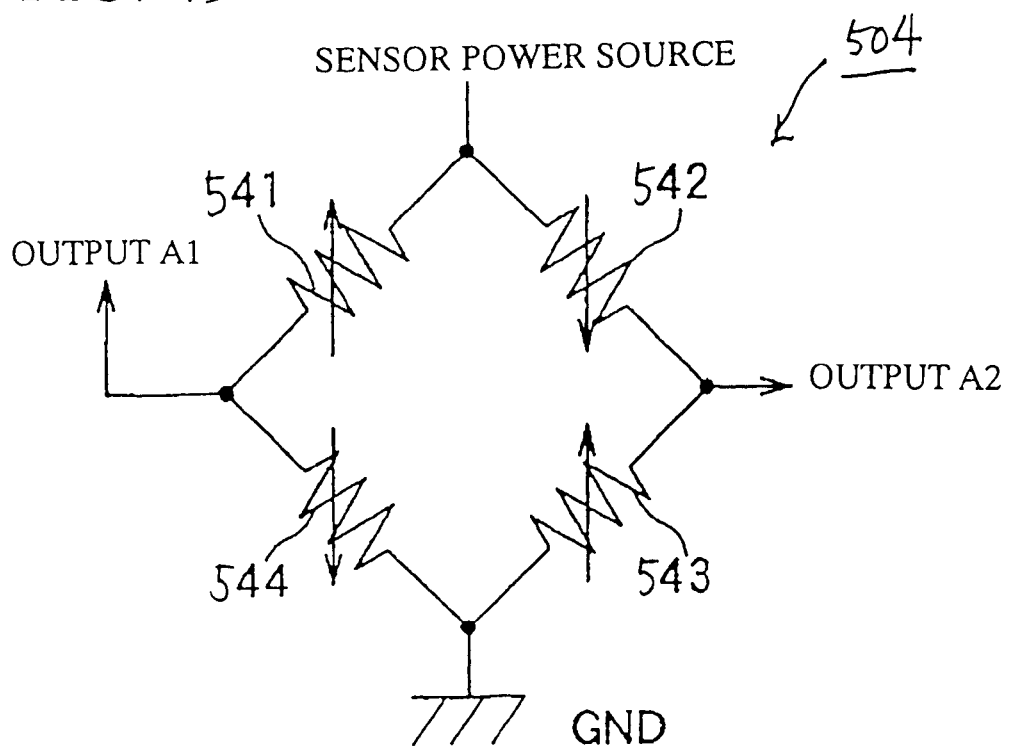
FIG. 49 is a circuit diagram showing a detailed wiring connection of a first bridge circuit in the pressure detecting apparatus in accordance with the twenty-fourth embodiment of the present invention.
Figure 50:
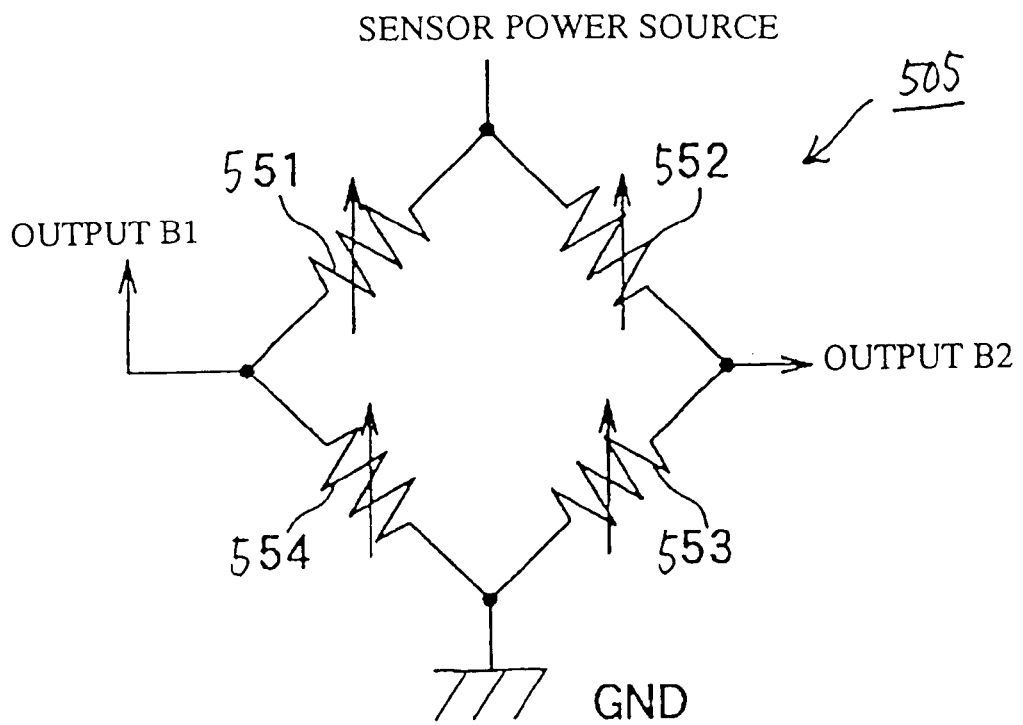
FIG. 50 is a circuit diagram showing a detailed wiring connection of a second bridge circuit in the pressure detecting apparatus in accordance with the twenty-fourth embodiment of the present invention.

FIG. 49 shows a detailed wiring connection of the first bridge circuit 504. FIG. 50 shows a detailed wiring connection of the second bridge circuit 505. Although not shown in FIGS. 47 and 48, the piezoelectric resistors of each bridge circuit are connected via a predetermined wiring pattern formed on the silicon semiconductor substrate 501. For example, such a wiring pattern can be formed by diffusion.

The principle of operation of the above-described pressure detecting apparatus 500 will be explained hereinafter with reference to FIGS. 49 and 50.

When a pressure is applied on the diaphragm 503, the diaphragm 503 deforms in response to the applied pressure. Each of the piezoelectric resistors 541544 and 551~554 receives a stress.

As shown in FIG. 49, the first bridge circuit 504 has an ordinary arrangement of the piezoelectric resistors disposed on a (100) surface of this kind of pressure detecting apparatus. When the applied pressure is increased, the resistance values of the piezoelectric resistors 541 and 543 increase while the resistance values of the piezoelectric resistors 542 and 544 decrease. The first bridge circuit 504 produces the bridge output based on a difference of two outputs A1 and A2. The bridge output varies in accordance with a distortion of the diaphragm 503. Thus, the first bridge circuit 504 can detect the pressure applied on the diaphragm 503.

On the other hand, in the second bridge circuit 505, the resistance value of each of piezoelectric resistors 551~554 varies in accordance with the distortion of the diaphragm 503. However, a bridge output of the second bridge circuit 505 does not change in response to the distortion of the diaphragm 503. More specifically, as shown in FIG. 50, the resistance values of all of the piezoelectric resistors 551~554 increase or decrease in the same direction in response to the distortion of the diaphragm 503. According to this embodiment, the piezoelectric resistors 551~554 are arranged to have resistance values increasing in response to the increase of the distortion of the diaphragm 503.

Like the first bridge circuit 504, the second bridge circuit 505 produces the bridge output based on a difference of two outputs B1 and B2. However, the difference of two outputs B1 and B2 always becomes 0 because the piezoelectric resistors 551~554 cause the same resistance change in the same direction in response to the applied pressure. Thus, the second bridge circuit 505 is not relevant to the pressure detection. The bridge output of the second bridge circuit 505 is not influenced by dislocation caused in the arrangement of piezoelectric resistors 551~554.

According to the arrangement of the second bridge circuit 505, as the resistance values of piezoelectric resistors 551 554 change in accordance with the distortion of the diaphragm 503, the bridge output of the second bridge circuit 505 changes in response to a variation caused in a stress distribution of the diaphragm 503. For example, the diaphragm 503 is broken or cracked, or when the piezoelectric resistance value changes, the bridge output of the second bridge circuit 505 causes such a change. Accordingly, the failure diagnosis is feasible by checking the change of the bridge output of the second bridge circuit 505.

Next, according to this sensing principle, the relationship between the stress caused in each of the piezoelectric resistors 541~544 and 551~554 and each bridge output will be explained with reference to the arrangement of the piezoelectric resistors shown in FIG. 48 and the wiring arrangement shown in FIGS. 49 and 50. When a pressure is applied on the diaphragm 503, the diaphragm 503 causes a distortion. In response to the distortion, each of the piezoelectric resistors 541~544 and 551~554 causes a stress having an X component in a direction of arrow X and a Y component in a direction of arrow Y along the <110> crystal axes.

Among the piezoelectric resistors 542, 544, 552, and 554 positioned on the <110> crystal axis extending in the X direction, it is now assumed that σxx represents the X component of the generated stress and σyy represents the Y component of the generated stress. Meanwhile, among the piezoelectric resistors 541, 543, 551, and 553 positioned on the <110> crystal axis extending in the Y direction, it is assumed that σxx' represents the X component of a generated stress and σyy' represents the Y component of the generated stress (refer to FIG. 48).

In each piezoelectric resistor, an output is proportional to a difference between a circumferential stress and a radial stress. When e1 represents the bridge output of the first bridge circuit 504 and e2 represents the bridge output of the second bridge circuit 505, these bridge outputs e1 and e2 are defined in the following formula 6-1.

$$\begin{aligned} e1 &\propto (\sigma xx - \sigma yy) - (\sigma xx' - \sigma yy') \\ e2 &\propto (\sigma xx - \sigma yy) - \{-(\sigma xx' - \sigma yy')\} \\ &= (\sigma xx - \sigma yy) + (\sigma xx' - \sigma yy') \end{aligned} \quad (6\text{-}1)$$

According to this embodiment, in each of the bridge circuits 504 and 505, the radial stress σxx is equal to the radial stress σyy' while the circumferential stress σxx' is equal to the circumferential stress σyy. Therefore, the bridge output e1 of the first bridge circuit 504 is proportional to 2 (σxx−σyy). Thus, it is possible to detect the pressure applied on the diaphragm 503.

On the other hand, the bridge output e2 of the second bridge circuit 505 becomes 0. Thus, the second bridge circuit 505 does not contribute to the pressure detection under the condition where the stress distribution of the diaphragm 503 is stable. However, once the stress distribution of the diaphragm 503 is changed, the stresses σxx, σyy, σxx', and σyy' have different values. The bridge output of the second bridge circuit 505 varies. It is thus possible to detect such a variation of the stress distribution as a sensor failure.

Figure 51:
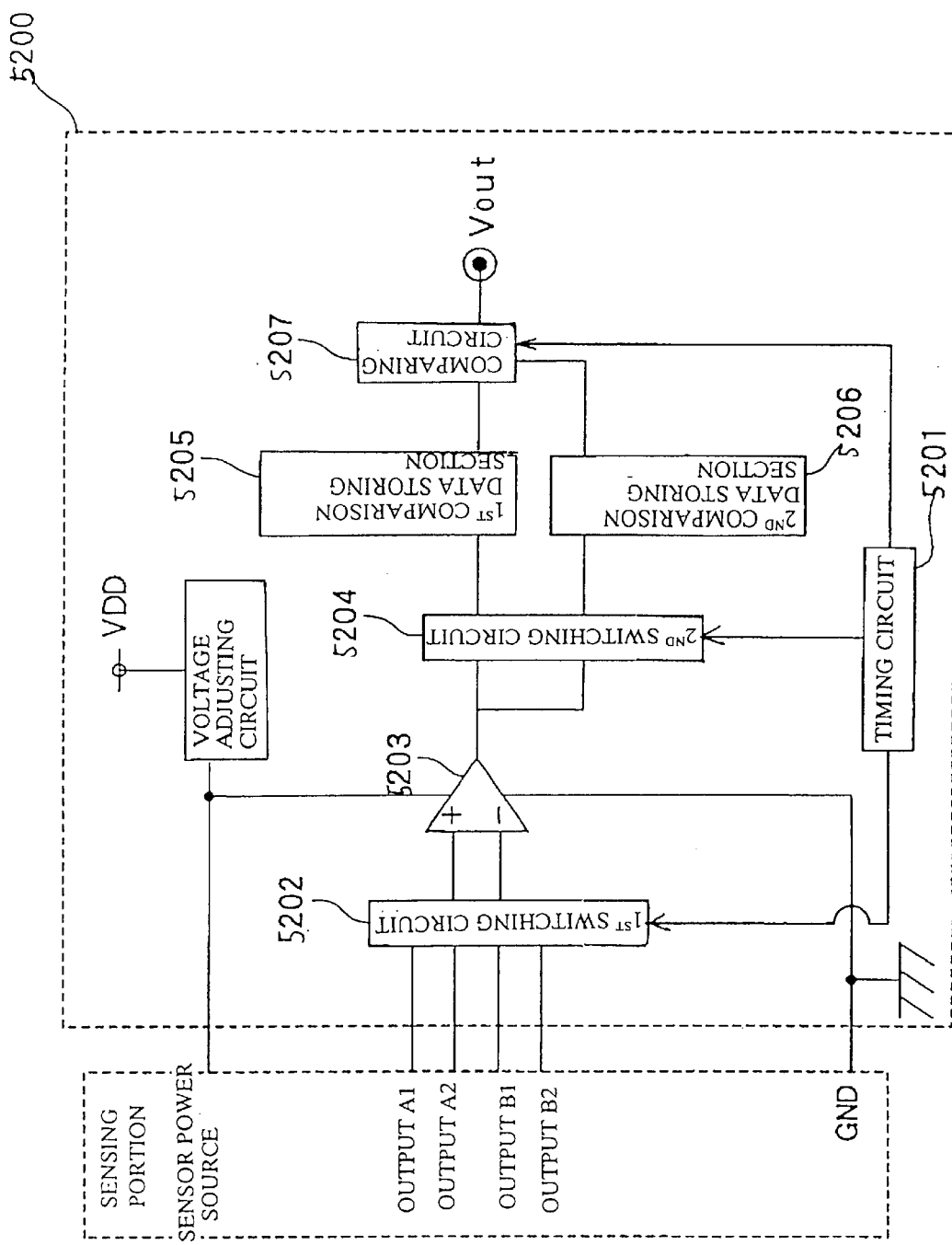
FIG. 51 is a circuit diagram showing a sensing circuit of the pressure detecting apparatus in accordance with the twenty-fourth embodiment of the present invention.

FIG. 51 is a block diagram showing the detailed arrangement of the sensing circuit in the pressure detecting apparatus 500. A circuit 5200, which is basically arranged by a differential amplification circuit, obtains a finalized output Vout based on the outputs of the first and second bridge circuits 504 and 505. The circuit 5200 has a switching function for selectively inputting the outputs of the first and second bridge circuits 504 and 505.

More specifically, a first switching circuit 5202 selectively input the outputs A1 and A2 (refer to FIG. 49) of the first bridge circuit 504 or the outputs B1 and B2 (refer to FIG. 50) of the second bridge circuit 505 in response to a timing signal sent from a timing circuit 5201. The selected outputs are sent to an operational amplifier 5203. To avoid confusion of data, the timing circuit 5201 controls the timing of respective circuits by transmitting the timing signal.

Thus, the operational amplifier 5201 produces an amplified output proportional to a difference (A1−A2) between two outputs A1 and A2 of the first bridge circuit 504 or an amplified output proportional to a difference (B1–B2) between two outputs B1 and B2 of the second bridge circuit 505. Each of the amplified outputs is sent to a second switching circuit 5204. The switching circuit 5204 performs a switching operation for storing the difference (A1–A2) of the first bridge circuit 504 to a first comparison data storing section 5205 and storing the difference (B1–B2) of the second bridge circuit 505 to a second comparison data storing section 5206.

The first and second comparison data storing sections 5205 and 5206 temporarily stores the data sent from the second switching circuit 5204 so that the stored data can be compared in a comparison circuit 5207. The first and second comparison data storing sections 5205 and 5206 can convert analog data into digital data in addition to writing and deletion of the data.

The comparison circuit 5207 compares the data stored in the first and second comparison data storing sections 5205 and 5206 with initial (i.e., specs) data to judge the abnormality of the sensor. When any abnormality is detected, the comparison circuit 5207 transmits an abnormal signal. More specifically, when the received difference (B1–B2), i.e., the bridge output of the second bridge circuit 505, is stable, it is presumed that the sensor operation is normal. The comparison circuit 5207 outputs the difference (A1–A2), i.e., the bridge output of the first bridge circuit 504, as Vout.

On the other hand, when the bridge output of the second bridge circuit 505 is changed, it is presumed that the sensor operation is abnormal. In this case, the comparison circuit 5207 changes its output Vout to an abnormal signal. By generating the abnormal signal in this manner, it becomes possible to notify the occurrence of abnormality to an electronic control unit (ECU) of an automotive vehicle.

As understood from the above-described pressure detecting apparatus 500, the present invention can realize a pressure detecting apparatus capable of performing a sensor failure diagnosis by providing the second bridge circuit. The freedom of layout of piezoelectric resistors 551~554 in the second bridge circuit 505 can be improved. Consequently, it becomes possible to provide an effective arrangement for the piezoelectric resistors compared with a conventional diagnostic system having a plurality of bridge circuits.

Furthermore, as understood from the above-described pressure detecting apparatus 500, the (100) surface of a silicon semiconductor substrate is used as a surface of the diaphragm 503 on which the piezoelectric resistors are formed. This makes it possible to employ the concentric arrangement of the piezoelectric resistors disposed along two <110> crystal axes as shown in FIG. 48. Such a concentric arrangement is advantageous in that the layout of respective piezoelectric resistors of the first and second bridge circuits 504 and 505 is easy, compared with a case where the piezoelectric resistors are formed on a (110) surface.

According to the concentric arrangement shown in FIG. 48, all of the piezoelectric resistors of the first and second bridge circuits 504 and 505 are disposed on the <110> crystal axes. However, this concentric arrangement can be modified in such a manner that the piezoelectric resistors 551~554 constituting the second bridge circuit 505 are angularly offset in the clockwise direction from the corresponding <110> crystal axis shown in FIG. 48.

Furthermore, according to the concentric arrangement shown in FIG. 48, the wiring connection of the piezoelectric resistors of respective bridge circuits can be easily realized by simply connecting adjacent piezoelectric resistors on a flat surface.

Furthermore, according to this concentric arrangement, a pair of opposed piezoelectric resistors 541 and 543 constituting part of the first bridge circuit 504 cause a voltage change along a circumferential direction of the concentric circle E1 having a center identical with the center of the diaphragm 503. The other pair of opposed piezoelectric resistors 542 and 544 constitute the rest of first bridge circuit 504 cause a voltage change along a radial direction of the concentric circle E1. Furthermore, all of the piezoelectric resistors 551~554 constitute the second bridge circuit 505 cause a voltage change along a radial direction of the concentric circle E2.

Thus, the bridge circuits of the concentric arrangement shown in FIGS. 49 and 50 can be formed by successively connecting the piezoelectric resistors in the circumferential direction. The wiring connection of first and second bridge circuits 504 and 505 is easily realized.

The circuit arrangement of the bridge circuits 504 and 505 is not limited to the one disclosed in the above-described embodiment. For example, in the second bridge circuit 505, the increase/decrease direction of the resistance value of each piezoelectric resistor needs not be identical. The wiring method or layout of the piezoelectric resistors can be variously modified.

Furthermore, the present invention can be applied to a pressure detecting apparatus comprising a metallic diaphragm for receiving a pressure, a silicon semiconductor substrate provided on a surface oft his diaphragm, and a plurality of piezoelectric resistors formed on this silicon semiconductor substrate.

Twenty-fifth Embodiment

Figure 52:
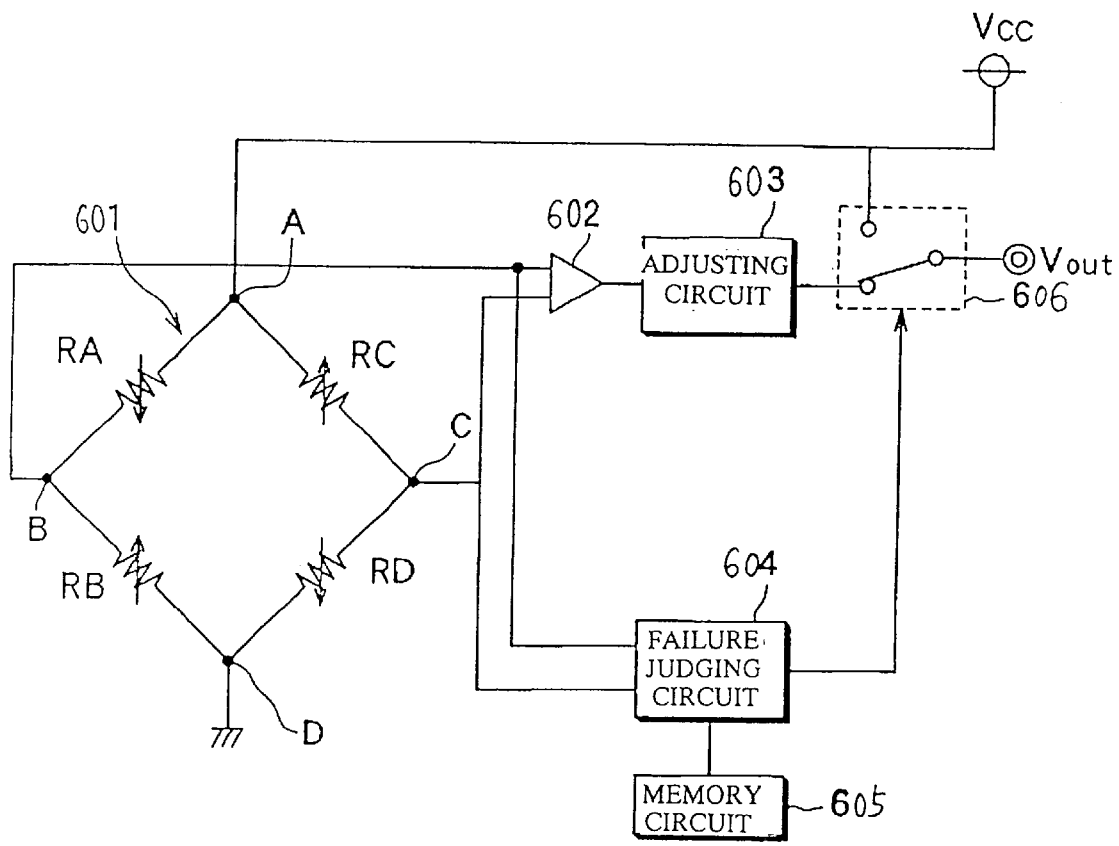
FIG. 52 is a circuit diagram showing a schematic arrangement of a pressure sensor in accordance with a twenty-fifth embodiment of the present invention.
Figure 53:
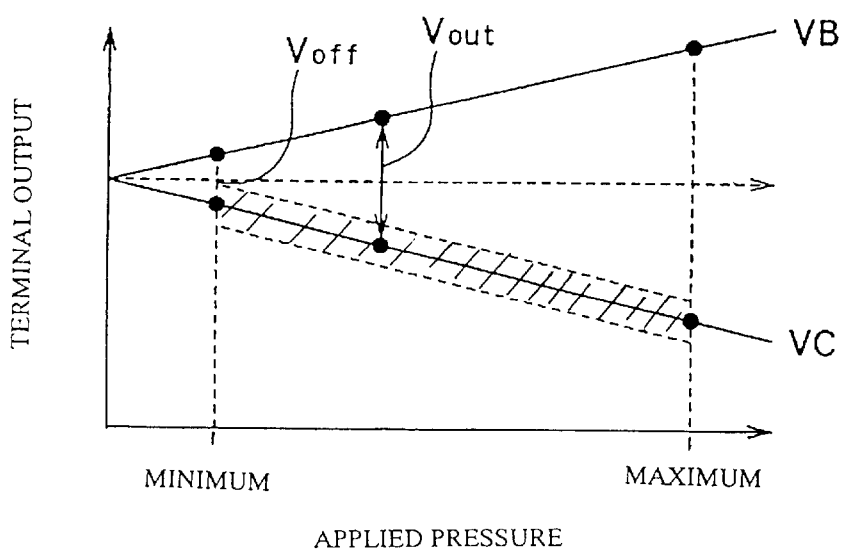
FIG. 53 is a graph showing change characteristics of the outputs of two output terminals B and C in a bridge circuit of the pressure sensor in accordance with the twenty-fifth embodiment of the present invention.

Hereinafter, a twenty-fifth embodiment of the present invention will be explained with reference to FIGS. 52 and 53. The twenty-fifth embodiment is characterized in that the failure diagnosis is feasible by using only outputs of a pressure detecting bridge. A pressure sensor in accordance with the twenty-fifth embodiment is preferably used to measure a pressure, such as a hydraulic braking pressure of an automotive braking apparatus and a fuel pressure of a fuel injection apparatus. FIG. 52 is a circuit diagram showing a schematic arrangement of the pressure sensor in accordance with the twenty-fifth embodiment of the present invention. FIG. 53 is a graph showing change characteristics of output VB and VC of output terminals B and C of the pressure sensor in response to an applied pressure.

As shown in FIG. 52, the pressure sensor comprises a bridge circuit (i.e., pressure sensing circuit) 601 consisting of four gauge resistors (e.g., diffused resistors) RA, RB, RC, and RD arranged in a bridge connection. The bridge circuit 601 is formed on a diaphragm portion (i.e., thin-plate portion) formed on a silicon substrate (not shown). The diaphragm portion deforms in response to a pressure applied thereon. Due to the piezo-resistance effect, the resistance value of respective resistors RA~RD varies in the direction of an arrow shown in FIG. 52. To avoid patterning and temperature influences, it is desirable to fabricate respective resistors RA~RD through substantially the same processes to have the same shape and the same resistance value.

A constant voltage Vcc is applied between two terminals A and D of the bridge circuit 601. One terminal A is a power source terminal, while the other terminal D is a ground terminal. A midpoint B of two resistors RA and RB and a midpoint C of two resistors RC and RD serve as output terminals of the bridge circuit 601. When no pressure is applied on the diaphragm portion, two output terminals B and C produce the same output voltages (i.e., midpoint voltages) VB and VC (i.e., VB=VC=Vcc/2). When any pressure is applied on the diaphragm portion, the resistance value of each of the resistors RA~RD varies in accordance with the applied pressure. As a result, the output terminal B produces an output voltage VB=Vcc/2+ΔV, while the output terminal C produces an output voltage VC=Vcc/2−ΔV. An amplification circuit 602 amplifies a voltage difference between two output terminals B and C. An adjusting circuit 603 adjusts an output of the amplification circuit 602, and produces an adjusted output as a sensor output Vout. Thus, the value of Vout represents a measure value of the pressure applied on the diaphragm portion of the silicon substrate.

Furthermore, the pressure sensor of this embodiment comprises a failure judging circuit (i.e., a diagnosis circuit serving as failure judging means) 604 for performing a failure judgement of the pressure sensing circuit based on the output voltages VB and VC of two output terminals B and C of the bridge circuit, a memory circuit 605 for storing referential output values of the output terminals B and C corresponding to minimum and maximum pressures applied on the pressure sensor, and a switching circuit 606 for selectively outputting the power source voltage Vcc as the sensor output Vout in response to an occurrence of sensor failure.

Hereinafter, the failure detection of the pressure sensor in accordance with the above-described embodiment will be explained. First, the referential output values VB and VC corresponding to the minimum and maximum pressures applied on the pressure sensor are stored in the memory circuit 605. It is practically preferable that the referential output values are determined based on rated values of a product specification of the pressure sensor. In this storing procedure, the relationship between two terminal outputs VB and VC is accurately obtained. Namely, as shown in FIG. 53, the relationship between two terminal outputs VB and VC at a certain pressure point is fixed one. Thus, two terminal outputs VB and VC are expressed by a predetermined relationship VB+VC=Vcc=2Voff, where Voff is an offset value which is variable.

Accordingly, when the pressure sensor is operating, two terminal outputs VB and VC are directly compared. It is checked wether or not the above relationship VB+VC=2Voff is established. When this relationship is not established, it is presumed that a sensor failure occurs. More specifically, it is checked whether or not the output VC is within a predetermined range 2Voff−VB−δ≦VC≦2Voff−VB+δ with respect to the other output VB. FIG. 53 shows the allowance range 2δ which can be arbitrarily set by considering a possible manufacturing error of the pressure sensor or the detecting accuracy.

According to the pressure sensor of the above-described embodiment, the failure judging circuit 604 generates a signal to the switching circuit 606 when any sensor failure is detected. In response to the signal sent from the failure judging circuit 604, the switching circuit 606 directly outputs the power source voltage Vcc to an external device (e.g., ECU), thereby notifying an occurrence of the sensor failure.

Furthermore, when two output terminals B and C generate the same error components in opposed plus and minus directions (e.g., +ΔVe and −Ve), the terminal outputs VB and VC exceed the output range stored in the memory circuit when the applied pressure is maximized or minimized. Thus, the failure detection is feasible.

As described above, the above-described embodiment provides a pressure sensor capable of monitoring the variation of an output of each output terminal in the bridge circuit and accurately obtaining the relationship of respective terminal outputs. Thus, it becomes possible to provide a pressure sensor which performs a highly reliable sensor failure judgement.

Furthermore, the arrangement of the above-described pressure sensor is easily realized by changing part of the circuit pattern, without requiring substantial change in the general manufacturing processes applied to the conventional pressure sensors. Furthermore, the pressure sensor can be easily downsized.

Moreover, although the above-described embodiment uses a bridge circuit having two output terminals as a pressure sensing circuit, it is possible to use a circuit having three or more output terminals. In such a case, the failure judgement of the pressure sensing circuit can be performed based on the outputs of two or more arbitrarily selected output terminals.

Twenty-sixth Embodiment

Hereinafter, a twenty-sixth embodiment of the present invention will be explained with reference to FIGS. 54 to 58. FIG. 54 is a cross-sectional view showing a schematic arrangement of a pressure sensor 700 in accordance with the twenty-sixth embodiment of the present invention. A sensor chip 710, made of a silicon substrate etc., is bonded to an upper surface of a pedestal 720, such as a glass plate, by an anode bonding method. The pedestal 720 is adhered and supported on a package member 740, made of a metal, a resin or a ceramics, by an adhesive 730.

The sensor chip 710 comprises a diaphragm 711 deformable in response to a pressure applied thereon, and a plurality of gauge resistors R1~R6 generating an electric signal representing the applied pressure based on the distortion of the diaphragm 711. The diaphragm 711 is a thin-plate portion formed by an anisotropic etching etc. The gauge resistors R1~R6 are diffused layers (i.e., gauge diffused layers) formed at a surface region of the diaphragm 711 by the diffusion of impurities etc. FIG. 54 shows the gauge resistors R1, R2 and R3.

Figure 55A:
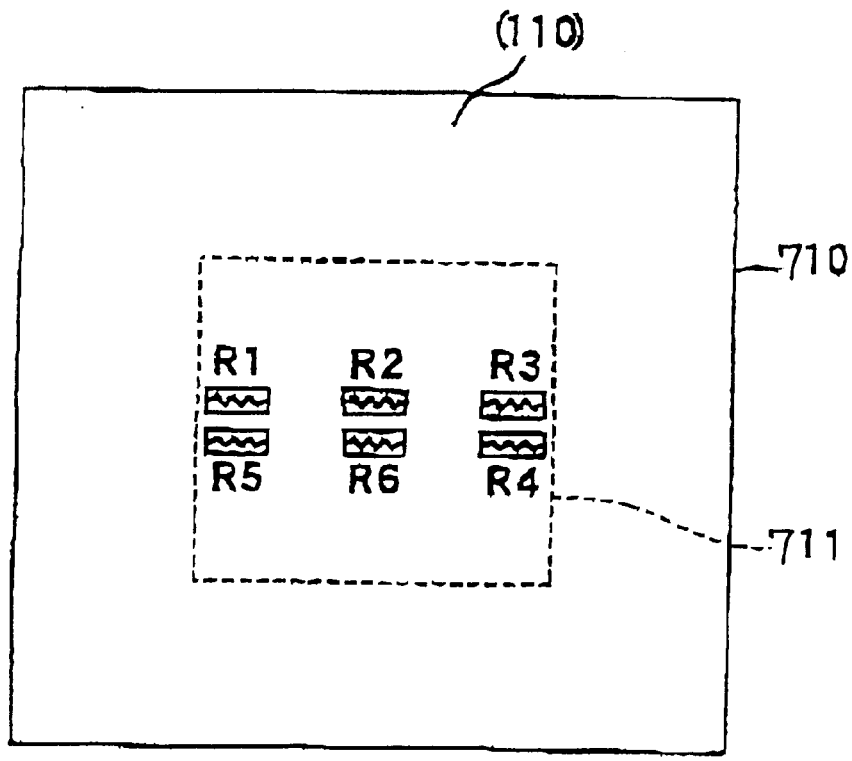
FIG. 55A is a view showing a layout of gauge resistors of the pressure sensor in accordance with the twenty-sixth embodiment of the present invention.
Figure 55B:
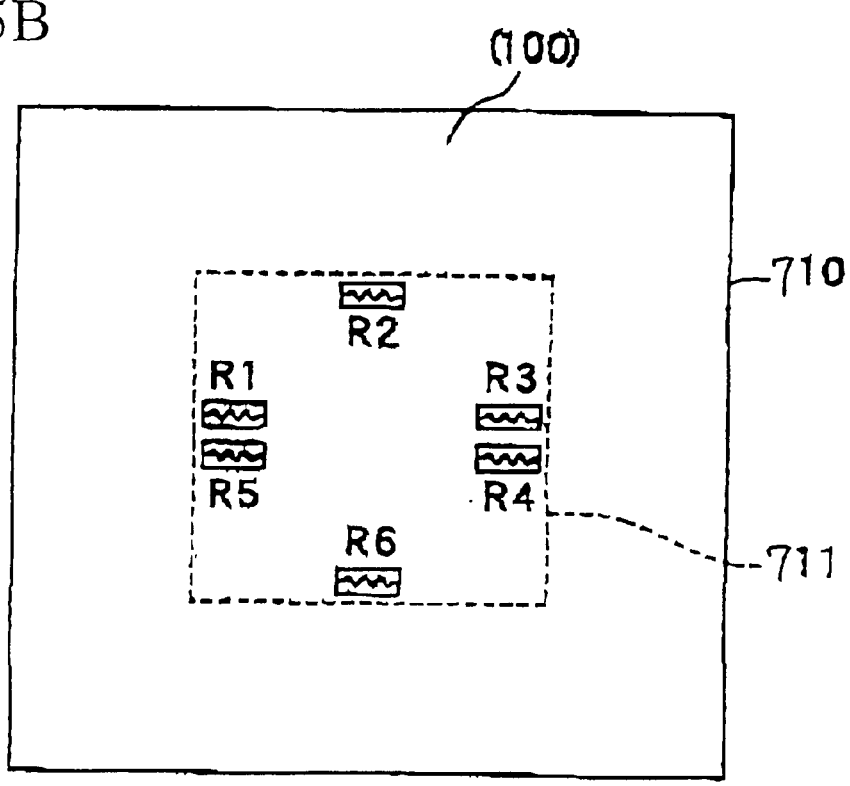
FIG. 55B is a view showing another layout of gauge resistors of the pressure sensor in accordance with the twenty-sixth embodiment of the present invention.

FIGS. 55A and 55B are plan views showing the layout of gauge resistors R1~R6 formed on the sensor chip 710. FIG. 55A shows the gauge resistors R1~R6 disposed on a (110) surface of a silicon substrate. FIG. 55B shows the gauge resistors R1~R6 disposed on a (100) surface of the silicon substrate.

The arrangement of gauge resistors R1~R6 should be determined considering the distortion stress caused in the diaphragm 711. In general, the gauge resistors R1~R6 are disposed along two <110> crystal axes normal to each other and existing on the (110) surface or the (100) surface. The gauge resistors R1~R6 are electrically connected to each other via a diffusion layer (not shown) formed on the surface of the diaphragm 711, and are extended to the outside of the diaphragm 711. The outer end of respective gauge resistors R1~R6 is electrically connected to an aluminum wiring 712 (refer to FIG. 54).

In FIG. 54, an interlayer insulating film 713 is interposed between the center chip 710 and the wiring 712 to electrically insulate them. The bottom side of the diaphragm 711 is air tightly sealed by the pedestal 720 so as to form a vacuum space which serves as a reference pressure chamber 714.

The pressure sensor 700 is formed by using a well-known IC manufacturing technique in the following manner. First, the gauge resistors R1~R6 are formed on the (110) surface or the (100) surface of the silicon substrate together with the diffusion layer connecting these gauge resistors. Then, the interlayer insulating film 713, the contact hole and the wiring 712 are successively formed on the silicon substrate. Next, an anisotropic etching using KOH (potassium hydroxide) is applied to the bottom side of the silicon substrate to form the diaphragm 711.

Subsequently, the silicon substrate is mounted on the glass pedestal 720 and bonded by the anode bonding. Then, the bonded body is subjected to a dicing cut to obtain separate chips. A unit body of censer chip 710 and pedestal 720 is bonded on the package member 740 by the adhesive 730, thereby obtaining the pressure sensor 700 shown in FIG. 54.

Figure 56:
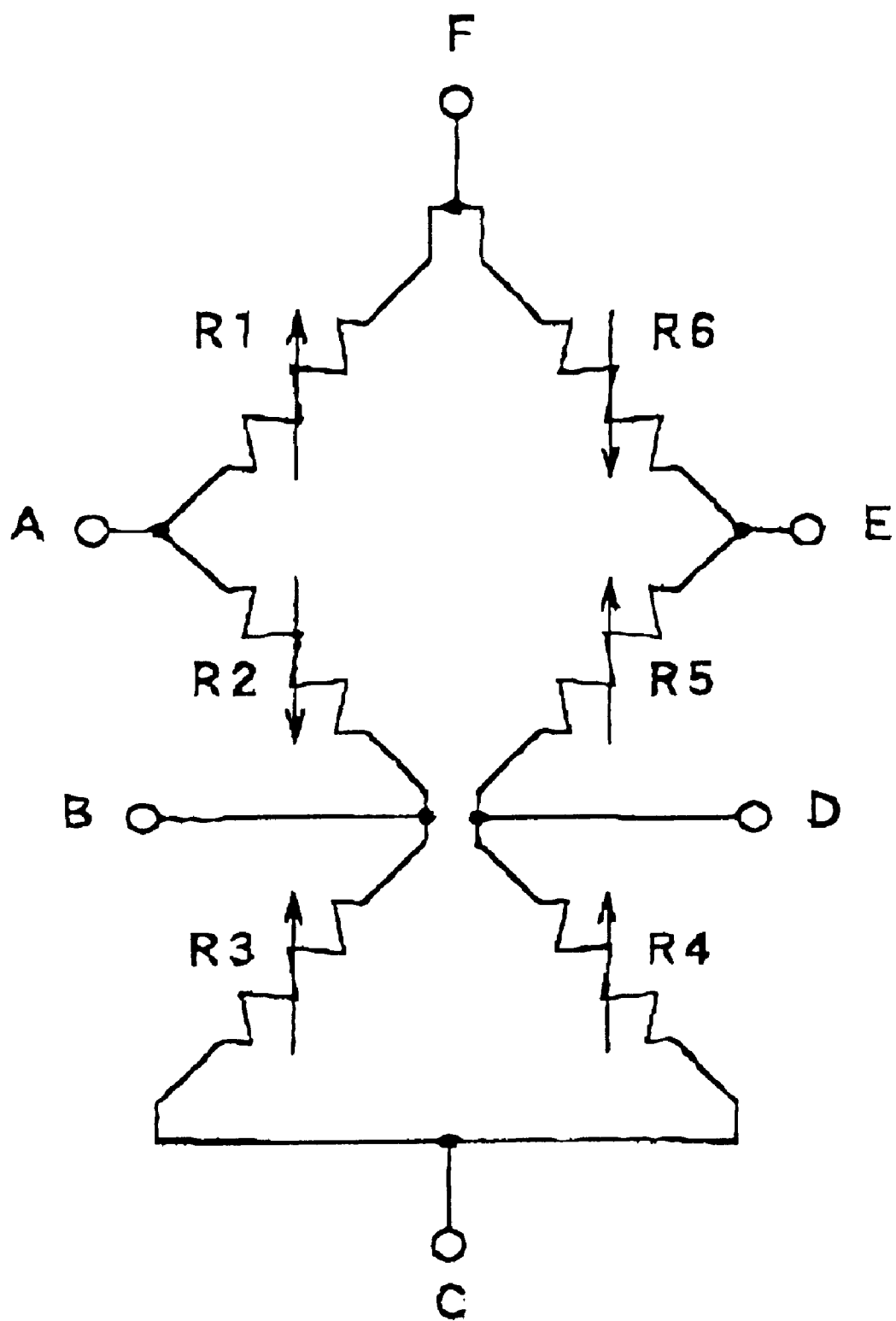
FIG. 56 is a circuit diagram showing a wiring arrangement of the gauge resistors in accordance with the twenty-sixth embodiment of the present invention.

Next, the wiring arrangement of the gauge resistors R1~R6 will be explained with reference to the circuit diagram of FIG. 56. This embodiment uses a total of six gauge resistors R1~R6 each having a resistance value varying in response to an applied pressure. FIG. 56 shows the electrical connection of these six gauge resistors R1~R6 which forms a bridge circuit.

More specifically, the first to sixth gauge resistors R1~R6 are connected in the following manner. A first gauge resistor R1 is connected to a second gauge resistor R2 at a first connecting point A. The second gauge resistor R2 is connected to a third gauge resistor R3 at a second connecting point B. The third gauge resistor R3 is connected to a fourth gauge resistor R4 at a third connecting point C. The fourth gauge resistor R4 is connected to a fifth gauge resistor R5 at a fourth connecting point D. The fifth gauge resistor R5 is connected to a sixth gauge resistor R6 at a fifth connecting point E. And, the sixth gauge resistor R6 is connected to the first gauge resistor R1 at a sixth connecting point F. A constant current (or a constant voltage) is applied to the sixth connecting point F. The third connecting point C is connected to the ground GND.

These six gauge resistors R1~R6 are classified into incremental gauge resistors each having a resistance value increasing in accordance with the applied pressure and decremental gauge resistors each having a resistance value decreasing in accordance with the applied pressure. In other words, each of the incremental gauge resistors causes a positive resistance change in response to the pressure applied on the diaphragm 711. Meanwhile, each of the decremental gauge resistors causes a negative resistance change in response to the pressure applied on the diaphragm 711. Accordingly, the resistance change direction of the first and fifth gauge resistors R1 and R5 responsive to the applied pressure is opposed to the resistance change direction of the second and sixth gauge resistors R2 and R6. The third gauge resistor R3 and the fourth gauge resistor R4 cause resistance changes in the same direction when the pressure is applied on the diaphragm.

According to this embodiment, the first, third, fourth, and fifth gauge resistors R1, R3, R4, and R5 cause positive (or incremental) resistance changes in response to the applied pressure. The second and sixth gauge resistors R2 and R6 cause negative (or decremental) resistance changes in response to the applied pressure. In the drawings of this embodiment, an up arrow indicates a positive resistance change and a down arrow indicates a negative resistance change.

According to the above-described circuit arrangement, the first, second, fifth, and sixth gauge resistors R1, R2, R5 and R6 cooperatively constitute a pressure detecting bridge circuit. A predetermined voltage or current is applied between the third connecting point C and the sixth connecting point F. An electric signal (i.e., a pressure detecting signal) representing the applied pressure is produced based on a voltage difference between the first connecting point A and the fifth connecting point E (i.e., A–E voltage).

The third gauge resistor R3 and the fourth gauge resistors R4 cause the resistance change in the same direction in response to the applied pressure. When all of the gauge resistors R1~R6 are normal, no adverse influence is given to the voltage difference between the first connecting point A and the fifth connecting point E. The voltage difference between the second connecting point B and the forth connecting point D, i.e., a B–D voltage serving as a failure indicating signal, does not change. Thus, as far as the sensor output sensitivity is normal, the B–D voltage can be maintained at 0V.

When a pressure is applied on the surface of the diaphragm 711, respective gauge resistors R1~R6 deform together with the diaphragm 711. The resistance value of each gauge resistor changes in accordance with a distortion of the diaphragm 711. The A–E voltage represents a distortion of the diaphragm 711. Thus, this embodiment can detect the applied pressure.

Wen at least one of first to sixth gauge resistors R1~R6 causes an abnormal resistance change due to failure, or when the resistance value change rate responsive to the applied pressure is changed, the B–D voltage (i.e., failure indicating signal) deviates from a normal value (i.e., becomes different from 0V). Hence, the abnormality of the resistance values of the gauge resistors R1~R6 can be detected by checking the B–D voltage.

Moreover, the capability of detecting the abnormality of the resistance values of gauge resistors R1~R6 makes it possible to detect an offset abnormality of the sensor output as well as an abnormality of the resistance value change responsive to the applied pressure. Thus, the abnormality in the output sensitivity of the sensor can be detected. Accordingly, this embodiment provides the pressure sensor 700 capable of detecting an abnormality in its output sensitivity even if the sensor is operating to detect a pressure applied in various conditions.

Figure 57:
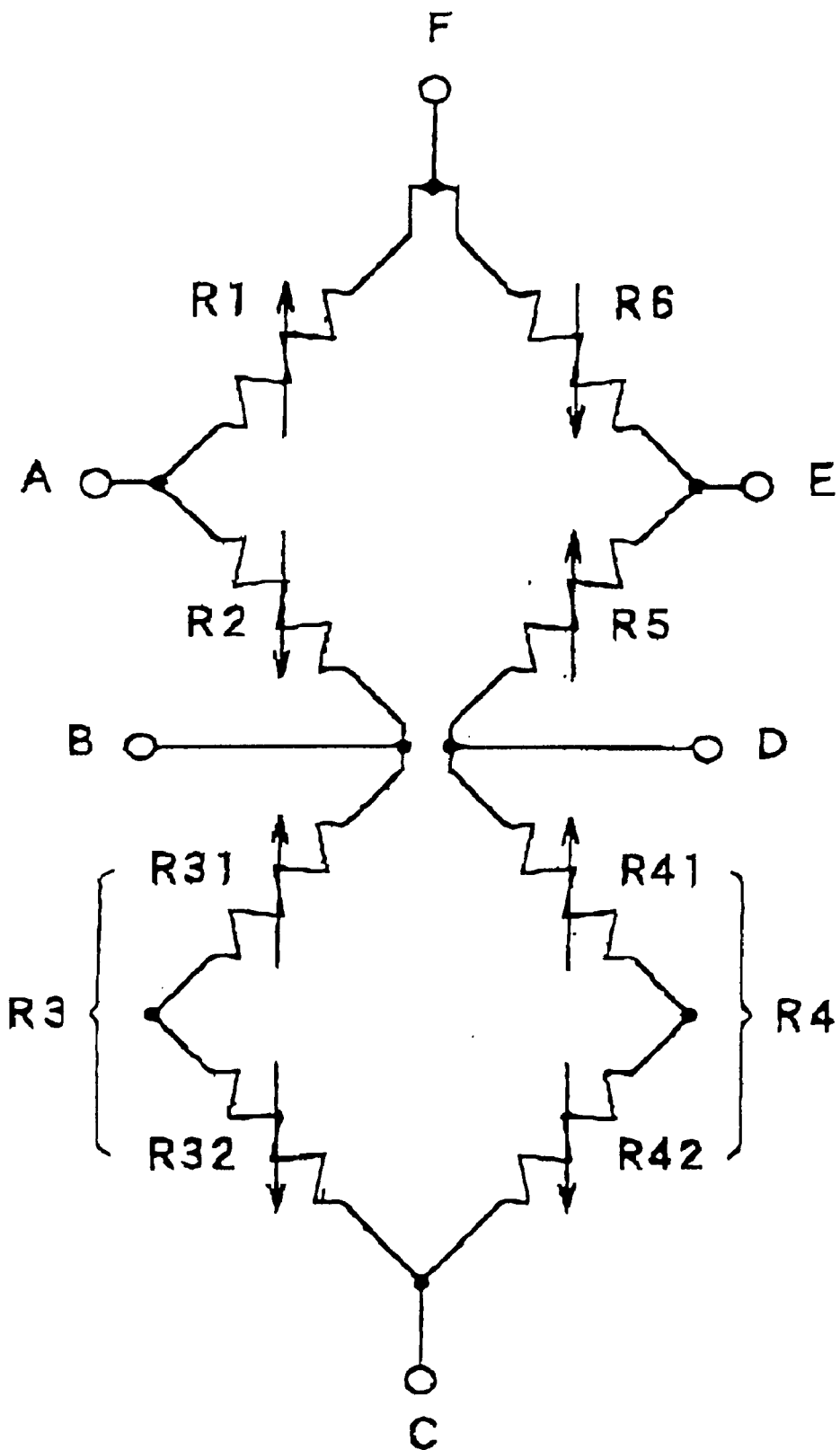
FIG. 57 is a circuit diagram showing a wiring arrangement of gauge resistors in accordance with a first modification of the twenty-sixth embodiment of the present invention.
Figure 58:
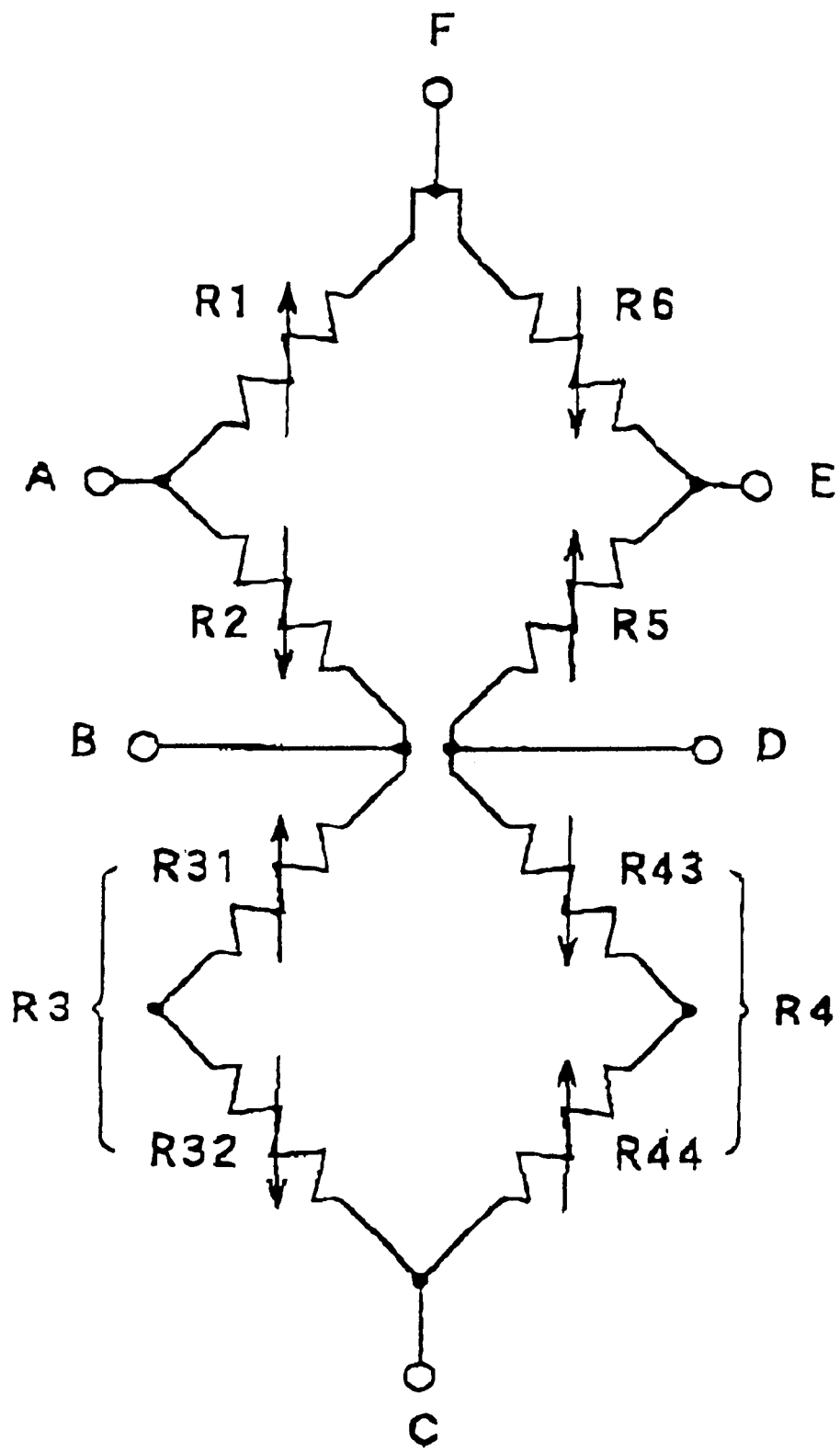
FIG. 58 is a circuit diagram showing a wiring arrangement of gauge resistors in accordance with a second modification of the twenty-sixth embodiment of the present invention.

Although FIG. 56 shows the wiring arrangement using six gauge resistors R1~R6, it is possible to increase the number of gauge resistors. FIG. 57 shows a modified embodiment (i.e., first modification) having a wiring arrangement using a total of eight gauge resistors. FIG. 58 shows another modified embodiment (i.e., second modification) having a wiring arrangement using a total of eight gauge resistors. According to the first and second modifications of the twenty-sixth embodiment, the third gauge resistor R3 is constituted by two gauge resistors R31 and R32, and the fourth gauge resistor R4 is constituted by two gauge resistors R43 and R44.

According to the first and second modifications, the resistors R31 and R32 between the second connecting point B and the third connecting point C (i.e., B–C voltage) cause a resistance value change responsive to the applied pressure in the same direction as that of the resistors R43 and R44 between the third connecting point C and the fourth connecting point D (i.e., C–D voltage). Thus, like the arrangement shown in FIG. 56, the circuit arrangements of the first and second modifications makes it possible to produce a pressure detecting signal based on the A–E voltage by applying a voltage or current between the F and C connecting points. Furthermore, the abnormality in the output sensitivity of the sensor can be detected based on the B–D voltage (i.e., failure indicating signal).

In summary, the above-described embodiment comprises at least six gauge resistors (R1~R6) comprising the incremental gauge resistors R1, R3 and R5 each having a resistance value increasing in response to an applied pressure and the decremental gauge resistors R2, R4 and R6 each having a resistance value decreasing in response to the applied pressure. The electric signal (i.e., pressure detecting signal) representing the applied pressure is produced based on the voltage difference between two predetermined connecting points A and E (i.e., A–E voltage). The sensor failure is detected based on the voltage difference between two other connecting points B and D (i.e., B–D voltage).

According to this embodiment, the bridge circuit is constituted by at least four gauge resistors R1, R2, R5 and R6. Thus, the pressure detection is feasible based on the pressure detecting signal produced as a voltage difference between the two points A and E. Whenever all of the gauge registers are normal, it is possible to select two points B and D whose voltage levels do not vary in response to the applied pressure. The selected points B and D are other than the above two points A and E used for detecting the applied pressure.

If any abnormality occurs in the diaphragm 711 or in respective gauge resistors R1~R6 during the operation of the sensor, the voltage difference between two selected points B and C causes a variation and can be detected as a failure of the sensor. Accordingly, the present invention can provide the pressure sensor 700 capable of detecting an abnormality in its output sensitivity even if the sensor is operating to detect a pressure applied in various conditions.

The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A pressure sensor comprising:
   a semiconductor substrate having a diaphragm portion;
   a pressure detecting bridge circuit comprising gauge resistors having resistance values varying in response to a pressure applied on said diaphragm portion of said semiconductor substrate; and
   a reference voltage generating circuit connected between one end and the other end of said pressure detecting bridge circuit for generating a reference voltage, said reference voltage generating circuit comprising non-sensitive resistors having resistance values not varying in response to the pressure applied on the diaphragm portion,
      wherein a failure judgement of said pressure detecting bridge circuit is performed based on a voltage difference between two midpoints of said pressure detecting bridge circuit as well as a voltage difference between a voltage level of either of said two midpoints of said pressure detecting bridge circuit and said reference voltage level of said reference voltage generating circuit.

2. A pressure sensor comprising:
   a semiconductor substrate having a diaphragm portion; and
   a pressure detecting bridge circuit comprising gauge resistors having resistance values varying in response to a pressure applied on said diaphragm portion of said semiconductor substrate,
      wherein said gauge resistors are constituted by separate gauge resistors, and
      a failure judgement of said pressure detecting bridge circuit is performed based on a voltage difference between two midpoints of said pressure detecting bridge circuit as well as a voltage difference between a pair of intermediate terminals selected from intermediate terminals of said separate gauge resistors, said selected pair of intermediate terminals having the same voltage level in a condition where no pressure is applied on said diaphragm portion.

3. A pressure sensor comprising:
   a semiconductor substrate having a diaphragm portion; and
   a pressure detecting bridge circuit comprising gauge resistors having resistance values varying in response to a pressure applied on said diaphragm portion of said semiconductor substrate,
      wherein a failure judgement of said pressure detecting bridge circuit is performed based on voltage differences between one and the other terminals of said bridge circuit and first and second intermediate terminals of said bridge circuit.

4. The pressure sensor in accordance with any one of claims 1 to 3, wherein an amplification circuit is provided to amplify each voltage difference, and the failure judgement of said pressure detecting bridge circuit is performed based on an output signal of said amplification circuit.

5. A pressure sensor comprising:
   a semiconductor substrate having a diaphragm portion;
   a pressure detecting bridge circuit for outputting an electric signal representing a pressure applied on said diaphragm portion of said semiconductor substrate, said pressure detecting bridge circuit comprising two gauge resistors provided in a first direction and two other gauge resistors provided in a second direction normal to said first direction;
   a failure detecting circuit, provided at a predetermined region of said diaphragm portion where said pressure detecting bridge circuit is not formed, for outputting an electric signal in response to the pressure applied on said diaphragm portion, said failure detecting circuit having a sensitivity different from that of said pressure detecting bridge circuit;
   failure judging means for performing a failure judgement of said pressure detecting bridge circuit based on the output signals of said pressure detecting bridge circuit and said failure detecting circuit.

6. The pressure sensor in accordance with claim 5, further comprising
   memory means for storing a relationship between output characteristics of said pressure detecting bridge circuit and output characteristics of said failure detecting circuit,
      wherein said failure judging means performs the failure judgement of said pressure detecting bridge circuit by checking at an arbitrary pressure point whether or not the output characteristics of said pressure detecting bridge circuit and the output characteristics of said failure detecting circuit satisfy said relationship stored in said memory means.

7. The pressure sensor in accordance with claim 5, wherein said failure detecting circuit comprises at least one gauge resistor.

8. The pressure sensor in accordance with claim 7, wherein said gauge resistor constitutes a failure detecting bridge circuit.

9. The pressure sensor in accordance with claim 7, wherein said pressure detecting bridge circuit and said failure detecting circuit are constituted by diffused resistors.

10. The pressure sensor in accordance with claim 7, wherein said pressure detecting bridge circuit is constituted by diffused resistors and said failure detecting circuit are constituted by thin-film resistors.

11. The pressure sensor in accordance with claim 5, wherein said failure detecting circuit is constituted by a capacitive sensor.

12. The pressure sensor in accordance with claim 5, wherein said failure judging means is provided on said semiconductor substrate on which said pressure detecting bridge circuit and said failure detecting circuit are provided.

13. A pressure sensor comprising:
a sensor chip constituted by a semiconductor substrate with a diaphragm portion;
a pedestal on which said sensor chip is adhered; and
a reference pressure chamber formed between said sensor chip and said pedestal,
wherein a pressure detecting bridge circuit consisting of gauge resistors is formed on said diaphragm portion to output an electric signal representing a pressure applied on said diaphragm portion,
a failure detecting bridge circuit consisting of gauge resistors is formed on a specific region of said diaphragm portion different from said pressure detecting bridge circuit, said failure detecting bridge circuit outputting an electric signal responsive to said pressure applied on said diaphragm portion, and
a sensitivity of said failure detecting bridge circuit is higher than a sensitivity of said pressure detecting bridge circuit.

14. The pressure sensor in accordance with claim 13, wherein the gauge resistors constituting said failure detecting bridge circuit are disposed in the vicinity of the center of said diaphragm portion and in the vicinity of a peripheral end of said diaphragm portion.

15. The pressure sensor in accordance with claim 13, wherein the gauge resistors constituting said failure detecting bridge circuit are disposed at a specific position of said diaphragm portion where a tensile stress is maximized and a specific position of said diaphragm portion where a compressive stress is maximized.

16. The pressure sensor in accordance with claim 13, wherein the gauge resistors constituting said pressure detecting bridge circuit are disposed in the vicinity of a midpoint between the center and a peripheral end of said diaphragm portion.

17. The pressure sensor in accordance with claim 13, wherein the gauge resistors constituting said pressure detecting bridge circuit are disposed at a specific position of said diaphragm portion where a tensile stress is minimized and a specific position of said diaphragm portion where a compressive stress is minimized.

18. The pressure sensor in accordance with claim 13, wherein said semiconductor substrate has a (100) surface, and the gauge resistors constituting said failure detecting bridge circuit comprise a first gauge resistor extending in a first direction and a second gauge resistor extending in a second direction normal to said first direction.

19. The pressure sensor in accordance with claim 13, wherein said failure detecting bridge circuit is constituted by a full-bridge circuit consisting of four gauge resistors.

20. A pressure sensor comprising:
a diaphragm portion;
a reference pressure chamber isolated by said diaphragm portion;
an output circuit for outputting an electric signal representing a pressure applied on said diaphragm portion by using pressure detecting elements formed on said diaphragm portion or in a peripheral region of said diaphragm portion; and
judging means for detecting an abnormal situation that a reference pressure in said reference pressure chamber becomes equal to an outside pressure of said diaphragm portion.

21. A pressure sensor comprising:
a diaphragm portion;
a reference pressure chamber isolated by said diaphragm portion;
a pressure detecting circuit for outputting an electric signal representing a pressure applied on said diaphragm portion by using pressure detecting elements formed on said diaphragm portion or in a peripheral region of said diaphragm portion; and
a failure detecting circuit for outputting an electric signal representing said pressure applied on said diaphragm portion, said failure detecting circuit having a higher sensitivity than that of said pressure detecting circuit.

22. The pressure sensor in accordance with claim 21, wherein
said pressure detecting elements are gauge resistors, and
said gauge resistors are disposed in such a manner that a resistance change of gauge resistors constituting said failure detecting circuit responsive to a change of the pressure applied on said diaphragm portion becomes larger than a resistance change of said pressure detecting circuit.

23. A failure detecting method for a pressure sensor comprising a diaphragm portion and a reference pressure chamber isolated by said diaphragm portion, said failure detecting method comprising the steps of:
obtaining an electric output signal representing a pressure applied on said diaphragm portion by using pressure detecting elements formed on said diaphragm portion or in a peripheral region of said diaphragm portion; and
presuming an abnormal situation when said electric output signal indicates that a reference pressure in said reference pressure chamber becomes equal to an outside pressure of said diaphragm portion.

24. A sensor abnormality detecting circuit for a sensor having a first output terminal generating a first output voltage and a second output terminal generating a second output voltage, said first output voltage and said second output voltage varying in mutually opposed positive and negative directions in response to a sensed physical quantity by the same voltage amount with respect to a predetermined equilibrium voltage, said sensor abnormality detecting circuit comprising:
a reference voltage generating circuit for generating a reference voltage substantially identical with said equilibrium voltage;
an operational amplifier having one input terminal receiving said reference voltage generated from said reference voltage generating circuit;
a first resistor having one end receiving said first output voltage of said sensor and the other end connected to the other input terminal of said operational amplifier;
a second resistor having one end receiving said second output voltage of said sensor and the other end connected to the other input terminal of said operational amplifier, said second resistor having the same resistance as that of said first resistor;
a third resistor connected between an output terminal of said operational amplifier and the other input terminal of said operational amplifier; and a judging circuit for generating an abnormal signal notifying an occurrence of sensor abnormality when an output voltage of said operational amplifier is outside a predetermined normal voltage range.

25. The sensor abnormality detecting circuit in accordance with claim 24, further comprising:
a first buffer for receiving said first output voltage of said sensor and applying the received first output voltage to said one end of said first resistor; and
a second buffer for receiving said second output voltage of said sensor and applying the received second output voltage to said one end of said second resistor.

26. The sensor abnormality detecting circuit in accordance with claim 25, further comprising:
a third buffer for receiving the reference voltage generated from said reference voltage generating circuit and supplying the received reference voltage to said one input terminal of said operational amplifier.

27. The sensor abnormality detecting circuit in accordance with claim 26, wherein said first buffer, said second buffer, and said third buffer are level shift circuits each shifting an input voltage by a specific voltage to generate an output voltage.

28. A sensor abnormality detecting circuit for a sensor having a first output terminal generating a first output voltage and a second output terminal generating a second output voltage, said first output voltage and said second output voltage varying in mutually opposed positive and negative directions in response to a sensed physical quantity by the same voltage amount with respect to a predetermined equilibrium voltage, said sensor abnormality detecting circuit comprising:
a reference voltage generating circuit for generating a reference voltage substantially identical with said equilibrium voltage;
an operational amplifier having one input terminal receiving said reference voltage generated from said reference voltage generating circuit;
a first differential amplifier having a non-inverting input terminal receiving said first output voltage of said sensor and an inverting input terminal receiving the reference voltage generated from said reference voltage generating circuit;
a second differential amplifier having a non-inverting input terminal receiving said second output voltage of said sensor and an inverting input terminal receiving the reference voltage generated from said reference voltage generating circuit;
a first resistor having one end receiving an output voltage of said first differential amplifier and the other end connected to the other input terminal of said operational amplifier;
a second resistor having one end receiving an output voltage of said second differential amplifier and the other end connected to the other input terminal of said operational amplifier, said second resistor having the same resistance as that of said first resistor;
a third resistor connected between an output terminal of said operational amplifier and the other input terminal of said operational amplifier; and
a judging circuit for generating an abnormal signal notifying an occurrence of sensor abnormality when an output voltage of said operational amplifier is outside a predetermined normal voltage range.

29. The sensor abnormality detecting circuit in accordance with any one of claims 24 to 28, wherein said judging circuit generates said abnormal signal when the output voltage of said operational amplifier is higher than a first criterial voltage, said first criterial voltage being higher than said reference voltage generated from said reference voltage generating circuit by a predetermined voltage, and
said judging circuit generates said abnormal signal when the output voltage of said operational amplifier is lower than a second criterial voltage, said second criterial voltage being lower than said reference voltage generated from said reference voltage generating circuit by a predetermined voltage.

30. The sensor abnormality detecting circuit in accordance with claim 27, a further comprising:
a criterial voltage generating circuit for generating a first criterial voltage which is higher than said reference voltage generated from said reference voltage generating circuit by a predetermined voltage as well as a second criterial voltage which is lower than said reference voltage generated from said reference voltage generating circuit by a predetermined voltage;
a fourth buffer for shifting said first criterial voltage generated from said criterial voltage generating circuit by said specific voltage and supplying a shifted first criterial voltage to said judging circuit; and
a fifth buffer for shifting said second criterial voltage generated from said criterial voltage generating circuit by said specific voltage and supplying a shifted second criterial voltage to said judging circuit,
wherein said judging circuit generates said abnormal signal when the output voltage of said operational amplifier is higher than a voltage supplied from said fourth buffer, and
said judging circuit generates said abnormal signal when the output voltage of said operational amplifier is lower than a voltage supplied from said fifth buffer.

31. The sensor abnormality detecting circuit in accordance with any one of claims 24 to 30, wherein
said sensor comprises four gauge resistors connected in a loop pattern so as to provide four connecting terminals of said gauge resistors, each of said gage resistors having a resistance varying in response to a deformation,
a power voltage is applied to two opposed connecting terminals of said gauge resistors, and
the rest of the connecting terminals of said gauge resistors serve as said first and second output terminals.

32. The sensor abnormality detecting circuit in accordance with claim 31, wherein
said reference voltage generating circuit comprises at least two resistors for dividing the power voltage to generate the reference voltage.

33. A physical quantity detecting apparatus associated with a sensor having a first output terminal generating a first output voltage and a second output terminal generating a second output voltage, said first output voltage and said second output voltage varying in mutually opposed positive and negative directions in response to a sensed physical quantity by the same voltage amount with respect to a predetermined equilibrium voltage,
said physical quantity detecting apparatus having a physical quantity output terminal for producing a sensing signal representing said sensed physical quantity based on said first output voltage of said sensor and said second output voltage of said sensor, said physical quantity detecting apparatus comprising:

an abnormality detecting circuit for detecting a sensor abnormality;

output means for outputting an abnormal signal notifying an occurrence of sensor abnormality from said physical quantity output terminal instead of outputting said sensing signal when the sensor abnormality detecting circuit produces a signal indicating sensor abnormality.

34. A physical quantity detecting sensor comprising four gauge resistors each having a resistance varying in response to a sensed physical quantity, said four gauge resistors forming a bridge circuit, wherein said gauge resistors constituting said bridge circuit are separate gauge resistors, a sensor output is produced based on a voltage difference between two midpoints of said bridge circuit, an inspection output is produced based on a voltage difference between a pair of intermediate terminals selected from intermediate terminals of said separate gauge resisters, said selected pair of intermediate terminals having the same voltage level in a condition where no physical quantity is applied on said sensor, and adjusting means is connected to said selected pair of intermediate terminals for adjusting an error component of said inspection output.

35. The physical quantity detecting sensor in accordance with claim 34, wherein an amplification circuit is connected to said selected pair of intermediate terminals, and said adjusting means adjusts an output of said amplification circuit.

36. The physical quantity detecting sensor in accordance with claim 35, wherein said adjusting means is a voltage-follower circuit, and an output voltage level of said amplification circuit is raised by an output of said voltage follower circuit so as to adjust said error component of said inspection output.

37. The physical quantity detecting sensor in accordance with claim 36, wherein said voltage-follower circuit has a non-inverting input terminal receiving a reference voltage, said reference voltage is supplied from a power voltage based on a voltage division by first and second resistors, and a resistance value of at least one of said first and second resistors is adjustable by trimming.

38. A pressure sensor comprising:

a semiconductor substrate having first and second diaphragm portions;

a pressure detecting circuit provided on said first diaphragm portion for outputting an electric signal responsive to a pressure applied on said first diaphragm portion;

a failure detecting circuit provided on said second diaphragm portion for outputting an electric signal responsive to a pressure applied on said second diaphragm portion, said failure detecting circuit having a sensitivity higher than that of said pressure detecting circuit; and failure judging means for performing a failure judgement of said pressure detecting circuit based on output signals of said pressure detecting circuit and said failure detecting circuit.

39. The pressure sensor in accordance with claim 38, wherein an area of said second diaphragm portion is larger than an area of said first diaphragm portion.

40. The pressure sensor in accordance with claim 38, wherein a thickness of said second diaphragm portion is smaller than a thickness of said first diaphragm portion.

41. The pressure sensor in accordance with claim 38, wherein said pressure detecting circuit and said failure detecting circuit are bridge circuits each consisting of a plurality of gauge resistors.

42. The pressure sensor in accordance with claim 41, wherein said gauge resistors are diffused resistors.

43. The pressure sensor in accordance with claim 41, wherein said gauge resistors are thin-film resistors.

44. The pressure sensor in accordance with claim 38, wherein said failure detecting circuit is provided on said semiconductor substrate having said diaphragm portion.

45. A dynamic quantity detecting sensor comprising:

a sensing portion having sensitivity varying in response to an applied voltage or an applied current;

a signal processing circuit for processing an output of said sensing portion to generate an output signal representing the output of said sensing portion;

a first sample hold circuit for holding an output signal of said signal processing circuit;

an operational processing circuit for processing an output signal of said sample hold circuit responsive to a first impressed voltage or a first impressed current applied to said sensing portion as well as an output of said signal processing circuit responsive to a second impressed voltage or a second impressed current applied to said sensing portion; and a judging circuit for performing an abnormality detection based on the processing result of said operational processing circuit.

46. The dynamic quantity detecting sensor in accordance with claim 45, wherein said operational processing circuit performs calculation based on the following formula $$V2=(a \times V1-(a-1) \times VO)$$

where V1 represents the output signal of said sample hold circuit responsive to said first impressed voltage or said first impressed current applied to said sensing portion, V2 represents the output signal of said signal processing circuit responsive to said second impressed voltage or said second impressed current applied to said sensing portion, "a" represents the ratio of said second impressed voltage or said second impressed current to said first impressed voltage or said first impressed current, and VO represents an offset voltage of the output of said sensing portion.

47. The dynamic quantity detecting sensor in accordance with claim 46, wherein said signal processing circuit generates the output signal of a predetermined range during a dynamic quantity detection, and said judging circuit converts the output signal of said signal processing circuit into a specific output signal when an abnormality is detected based on the output signals of said operational processing circuit, said specific output signal having a signal level different from said predetermined range of said output signal of said signal processing circuit generated during the dynamic quantity detection.

48. The dynamic quantity detecting sensor in accordance with claim 47, wherein said offset voltage is set to be outside said predetermined range of said output signal generated from said signal processing circuit during the dynamic quantity detection.

49. The dynamic quantity detecting sensor in accordance with claim 45, further comprising a second sample hold circuit for holding an output of said judging circuit.

50. The dynamic quantity detecting sensor in accordance with claim 49, further comprising a timing circuit for generating a timing signal so as to perform a switching operation between said first impressed voltage or said first impressed current and said second impressed voltage or said second impressed current based on said timing signal, and said first sample hold circuit and said second sample hold circuit can operate based on said timing signal.

51. The dynamic quantity detecting sensor in accordance with claim 50, wherein said timing signal generated from said timing circuit causes said first sample hold circuit to hold the output signal of said signal processing circuit, and then causes the switching operation between said first impressed voltage or said first impressed current and said second impressed voltage or said second impressed current, and finally causes said second sample hold circuit to hold the output signal of said judging circuit.

52. A pressure detecting apparatus comprising:
a diaphragm for receiving a pressure;
a plurality of piezoelectric resistors formed on a surface of said diaphragm, each of said plurality of piezoelectric resistors having a resistance value varying in accordance with a distortion of said diaphragm; and
a sensing circuit comprising a first bridge circuit and a second bridge circuit each constituted by said plurality of piezoelectric resistors,
wherein said first bridge circuit generates a first bridge output representing the distortion of said diaphragm caused when the pressure is applied on said diaphragm; and
the plurality of piezoelectric resistors of said second bridge circuit are connected in a predetermined relationship so as to generate a second bridge output which does not change in response to the distortion of said diaphragm.

53. The pressure detecting apparatus in accordance with claim 52, wherein
said surface of said diaphragm is a (100) surface of a silicon semiconductor substrate, and
said piezoelectric resistors are formed on said (100) surface in said first and second bridge circuits.

54. The pressure detecting apparatus in accordance with claim 52, wherein the piezoelectric resistors constituting said first bridge circuit and the piezoelectric resistors constituting said second bridge circuit are disposed concentrically about the center of said diaphragm.

55. The pressure detecting apparatus in accordance with claim 54, wherein
a pair of opposed piezoelectric resistors constituting part of said first bridge circuit c a use a voltage change along a circumferential direction of a concentric circle having a center identical with the center of said diaphragm, while the other pair of opposed piezoelectric resistors constituting the rest of said first bridge circuit cause a voltage change along a radial direction of said concentric circle, and
all of said piezoelectric resistors constituting said second bridge circuit cause a voltage change along a radial direction of a corresponding concentric circle.

56. A pressure sensor with a pressure sensing circuit with a plurality of gauge resistors and a plurality of output terminals, said pressure sensor comprising:
memory means for storing a relationship of respective outputs of at least two output terminals arbitrarily selected from said plurality of output terminals; and
failure judging means for performing a failure judgement of said pressure sensing circuit by checking whether or not respective outputs of said selected output terminals measured at an arbitrary pressure point satisfy said relationship stored in said memory means.

57. The pressure sensor in accordance with claim 56, wherein
said pressure sensing circuit is a bridge circuit comprising four gauge resistors, and
said failure judging means performs the failure judgement of said pressure sensing circuit based on outputs of first and second output terminals of said bridge circuit.

58. The pressure sensor in accordance with claim 57, wherein
said failure judging means performs the failure judgement of said pressure sensing circuit by checking whether or not the output of said second output terminal is within a predetermined range with respect to the output of said first output terminal, said predetermined range being determined based on said relationship stored in said memory means.

59. A pressure sensor comprising:
a diaphragm deformable in response to a pressure applied thereon; and
a plurality of gauge resistors generating an electric signal representing said applied pressure based on a distortion of said diaphragm, wherein
said gauge resistors includes at least six gauge resistors each having a resistance value varying in accordance with said applied pressure,
said six gauge resistors consist of incremental gauge resistors and decremental gauge resistors electrically connected, each of said incremental gauge resistors having a resistance value increasing in accordance with said applied pressure and each of said decremental gauge resistors having a resistance value decreasing in accordance with said applied pressure,
said electric signal representing said applied pressure is produced based on a voltage difference between two predetermined points of a plurality of connecting points of said six gauge resistors, and a sensor failure is detected based on a voltage difference between two another points of said connecting points.

60. A pressure sensor comprising:
a diaphragm deformable in response to a pressure applied thereon; and
a plurality of gauge resistors generating an electric signal representing said applied pressure based on a distortion of said diaphragm, wherein
said gauge resistors includes at least first to six resistors each having a resistance value varying in accordance with said applied pressure,
said first gauge resistor is connected to a second gauge resistor at a first connecting point, said second gauge resistor is connected to a third gauge resistor at a second connecting point, said third gauge resistor is connected to a fourth gauge resistor at a third connecting point, said fourth gauge resistor is connected to a fifth gauge resistor at a fourth connecting point, said fifth gauge resistor is connected to a sixth gauge resistor at a fifth connecting point, and said sixth gauge resistor is connected to said first gauge resistor at a sixth connecting point,
said first and fifth gauge resistors cause resistance changes in the same direction when said pressure is applied on said diaphragm while said second and sixth gauge resistors cause resistance changes in the opposed direction when said pressure is applied on said diaphragm, said third and fourth gauge resistors cause resistance changes in the same direction when said pressure is applied on said diaphragm, said electric signal representing said applied pressure is produced based on a voltage difference between said first and fifth connecting points caused when a voltage or current is supplied between said third and sixth connecting points, while a sensor failure is detected based on a voltage difference between said second and fourth connecting points.

61. The pressure sensor in accordance with claim 60, wherein said third and fourth gauge resistors and said first and fifth gauge resistors cause the resistance changes in the same direction.

62. The pressure sensor in accordance with claim 13, wherein the gauge resistors constituting said failure detecting bridge circuit are disposed in the vicinity of a peripheral end of said diaphragm portion.

63. The pressure sensor in accordance with claim 13, wherein the gauge resistors constituting said failure detecting bridge circuit are disposed in the vicinity of a peripheral end of said diaphragm portion and on or in the vicinity of a portion where a difference between two stress components in <110> crystal axes normal to each other is maximized.

64. The pressure sensor in accordance with claim 13, wherein the gauge resistors constituting said failure detecting bridge circuit are disposed in the vicinity of a peripheral end of said diaphragm portion and on or in the vicinity of a portion where a difference between two stress components in <110> crystal axes normal to each other is minimized.

* * * * *